(12) United States Patent
Sel et al.

(10) Patent No.: US 10,224,373 B2
(45) Date of Patent: Mar. 5, 2019

(54) THREE-DIMENSIONAL RERAM MEMORY DEVICE EMPLOYING REPLACEMENT WORD LINES AND METHODS OF MAKING THE SAME

(71) Applicant: SANDISK TECHNOLOGIES LLC, Plano, TX (US)

(72) Inventors: Jongsun Sel, Los Gatos, CA (US); Mitsuteru Mushiga, Yokkaichi (JP); Vincent Shih, San Jose, CA (US); Akio Nishida, Yokkaichi (JP); Tuan Pham, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 20 days.

(21) Appl. No.: 15/635,321

(22) Filed: Jun. 28, 2017

(65) Prior Publication Data

US 2019/0006418 A1    Jan. 3, 2019

(51) Int. Cl.
*H01L 23/52*    (2006.01)
*H01L 27/24*    (2006.01)
(Continued)

(52) U.S. Cl.
CPC .......... *H01L 27/249* (2013.01); *H01L 23/528* (2013.01); *H01L 23/5226* (2013.01);
(Continued)

(58) Field of Classification Search
CPC . H01L 27/249; H01L 23/5226; H01L 23/528; H01L 27/2436; H01L 45/1226; H01L 45/1253
See application file for complete search history.

(56) References Cited

U.S. PATENT DOCUMENTS 5,915,167 A    6/1999  Leedy
8,349,681 B2   1/2013  Alsmeier et al.
(Continued)

FOREIGN PATENT DOCUMENTS

WO    WO2007/004843 A1    1/2007

OTHER PUBLICATIONS

Endoh et al., "Novel Ultra High Density Memory with a Stacked-Surrounding Gate Transistor (S-SGT) Structured Cell," IEDM Proc., (2001), 33-36.
(Continued)

*Primary Examiner* — Nicholas J Tobergte
(74) *Attorney, Agent, or Firm* — The Marbury Law Group PLLC

(57) ABSTRACT

A three-dimensional memory device includes an alternating stack of insulating layers and electrically conductive layers located over a substrate, resistive memory elements located in the alternating stack in first and second array regions and contact via structures located in a contact region between the first and the second array regions. The contact via structures have different depths and contact different electrically conductive layers. Support pillars are located in the contact region and extending through the alternating stack. At least one conduction channel area is located between the contact via structures in the contact region. The conduction channel area contains no support pillars, and all electrically conductive layers in the conduction channel area are continuous from the first array region to the second array region.

10 Claims, 68 Drawing Sheets

(51) Int. Cl.
  *H01L 45/00* (2006.01)
  *H01L 23/522* (2006.01)
  *H01L 23/528* (2006.01)

(52) U.S. Cl.
  CPC ...... *H01L 27/2436* (2013.01); *H01L 45/1226* (2013.01); *H01L 45/1253* (2013.01); *H01L 45/1608* (2013.01)

(56) References Cited

U.S. PATENT DOCUMENTS

| | | | |
|---|---|---|---|
| 8,633,099 B1 | 1/2014 | Shih et al. | |
| 8,828,884 B2 | 9/2014 | Lee et al. | |
| 9,397,115 B1 | 7/2016 | Nozawa | |
| 9,412,753 B2 | 8/2016 | Izumi et al. | |
| 9,437,658 B2 | 9/2016 | Sakotsubo | |
| 9,449,924 B2 | 9/2016 | Takaki | |
| 9,502,429 B2 | 11/2016 | Hironaga | |
| 9,502,471 B1 * | 11/2016 | Lu | H01L 27/2481 |
| 9,515,023 B2 | 12/2016 | Tobitsuka et al. | |
| 9,524,901 B2 | 12/2016 | Izumi et al. | |
| 9,530,787 B2 | 12/2016 | Tsutsumi et al. | |
| 9,583,539 B2 | 2/2017 | Takaki | |
| 9,583,615 B2 | 2/2017 | Chen et al. | |
| 9,613,689 B1 * | 4/2017 | Takaki | G11C 13/0026 |
| 9,704,920 B2 * | 7/2017 | Bandyopadhyay | H01L 27/2409 |
| 9,716,101 B2 * | 7/2017 | Lu | H01L 27/1157 |
| 9,805,805 B1 * | 10/2017 | Zhang | H01L 23/485 |
| 9,818,801 B1 * | 11/2017 | Rabkin | H01L 27/11582 |
| 9,859,337 B2 * | 1/2018 | Ratnam | H01L 23/528 |
| 9,935,050 B2 * | 4/2018 | Dunga | H01L 27/2481 |
| 10,084,015 B2 * | 9/2018 | Wicklein | H01L 27/249 |
| 2013/0043455 A1 | 2/2013 | Bateman | |
| 2015/0036407 A1 | 2/2015 | Nakajima | |
| 2016/0148835 A1 | 5/2016 | Shimabukuro et al. | |
| 2016/0204122 A1 | 7/2016 | Shoji et al. | |
| 2017/0117324 A1 * | 4/2017 | Bandyopadhyay | H01L 27/2409 |
| 2017/0317140 A1 * | 11/2017 | Wicklein | H01L 27/249 |
| 2018/0277596 A1 * | 9/2018 | Mori | H01L 27/249 |

OTHER PUBLICATIONS

U.S. Appl. No. 15/228,216, filed Aug. 4, 2016, Chen et al.
U.S. Appl. No. 15/251,374, filed Aug. 30, 2016, Mada et al.
U.S. Appl. No. 15/299,919, filed Oct. 21, 2016, Wu et al.
U.S. Appl. No. 15/367,791, filed Dec. 2, 2016, Sano et al.
U.S. Appl. No. 15/400,244, filed Jan. 6, 2017, Ratnam et al.
U.S. Appl. No. 15/411,126, filed Jan. 20, 2017, Cui et al.
U.S. Appl. No. 15/468,519, filed Mar. 24, 2017, SanDisk Technologies LLC.

* cited by examiner

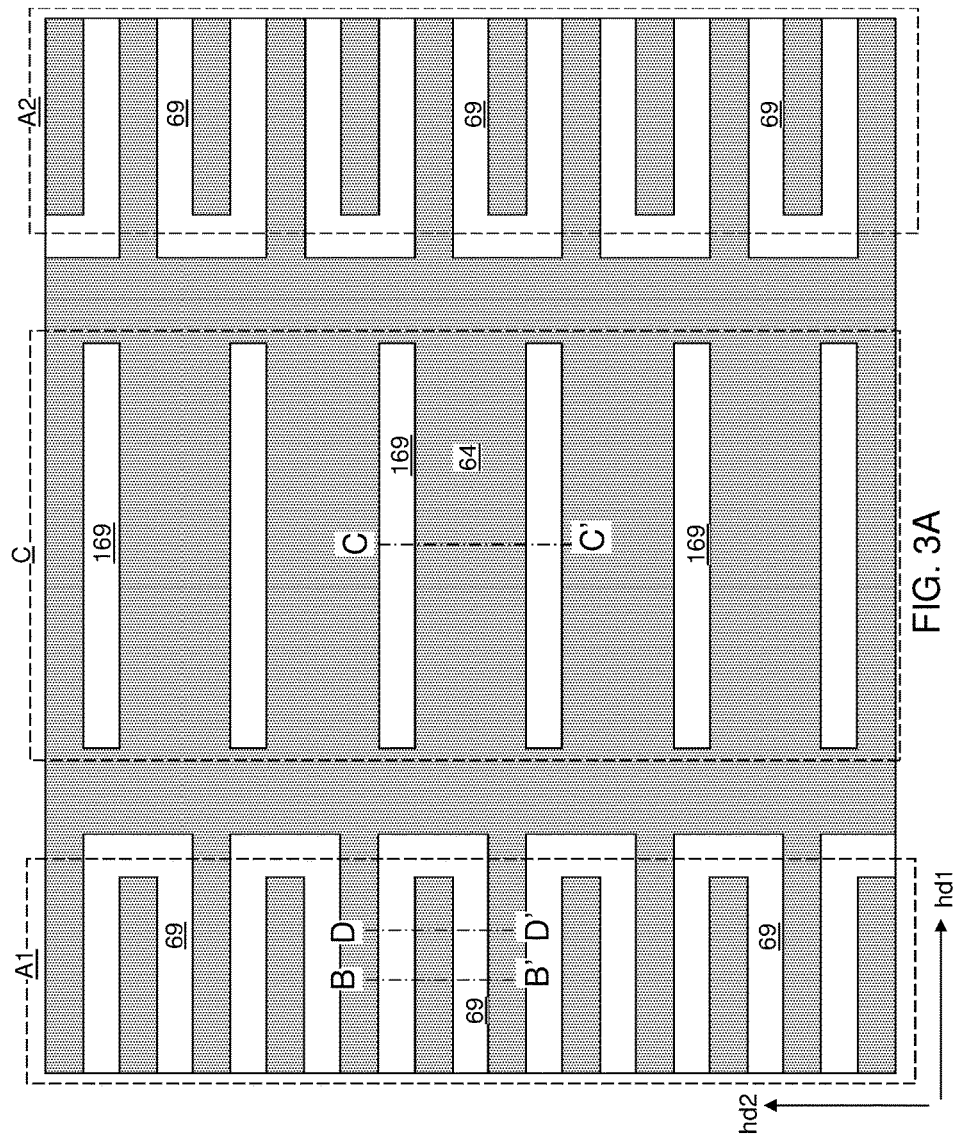

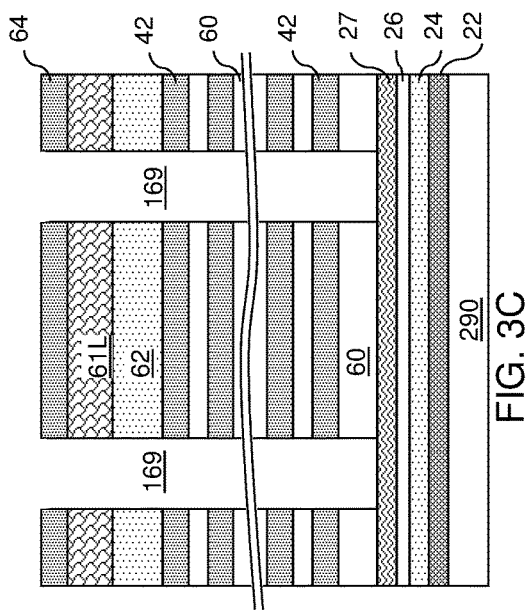
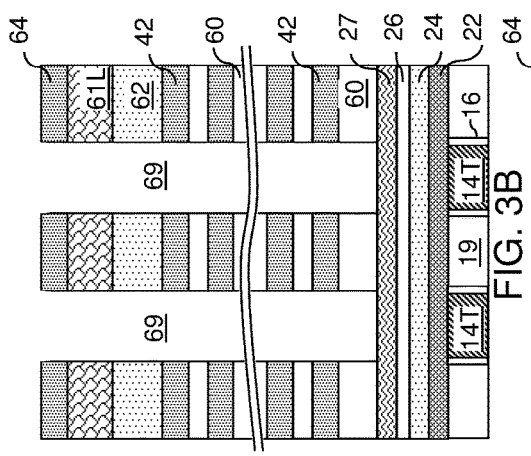
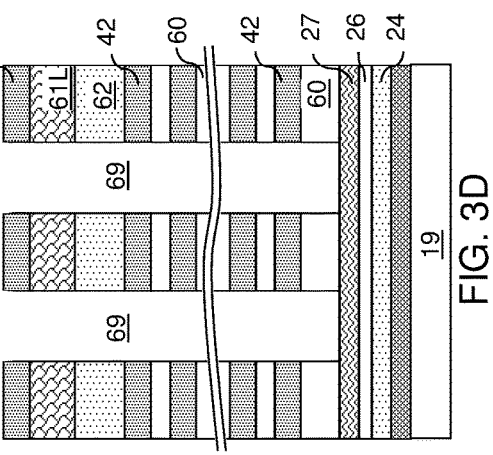

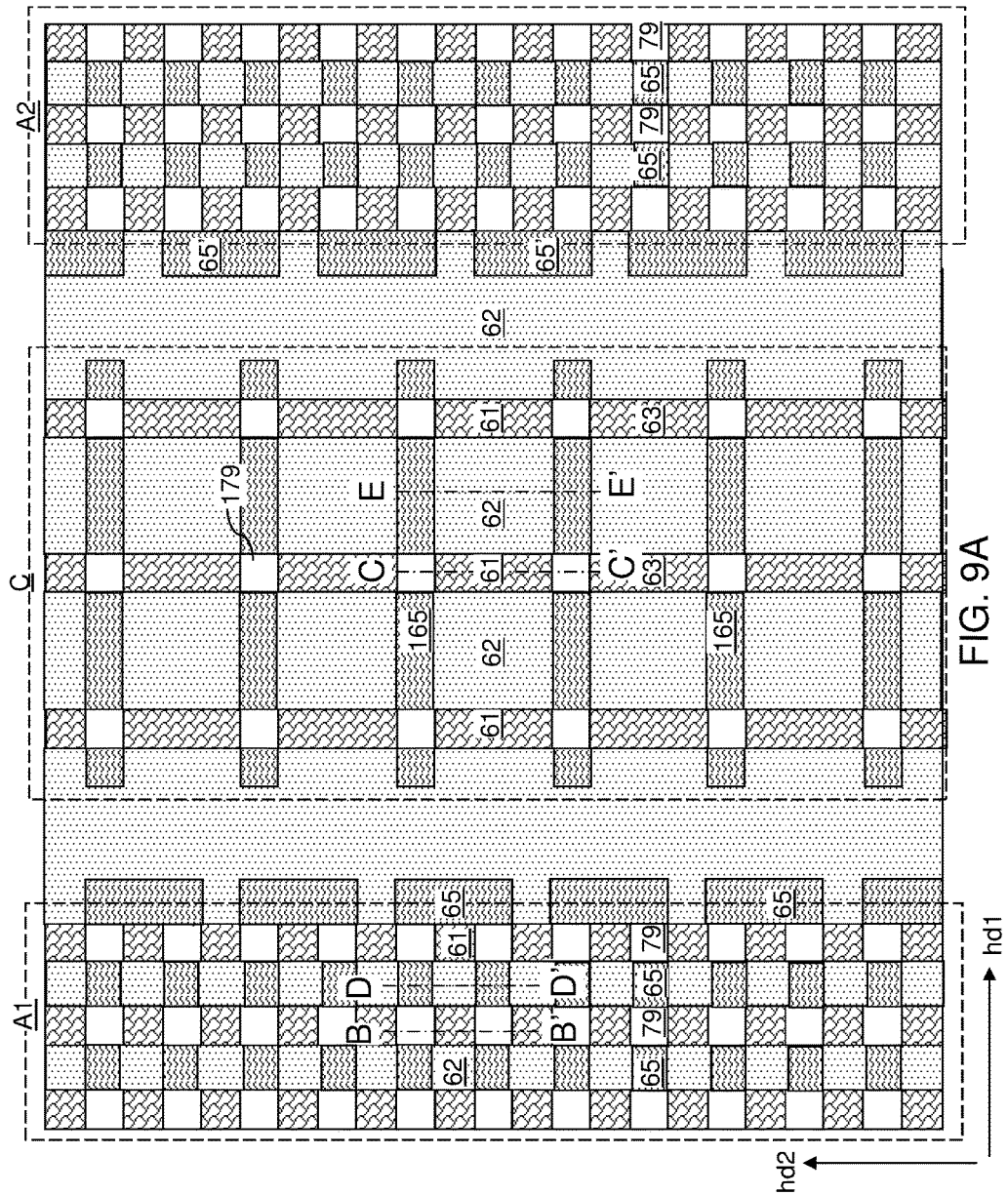

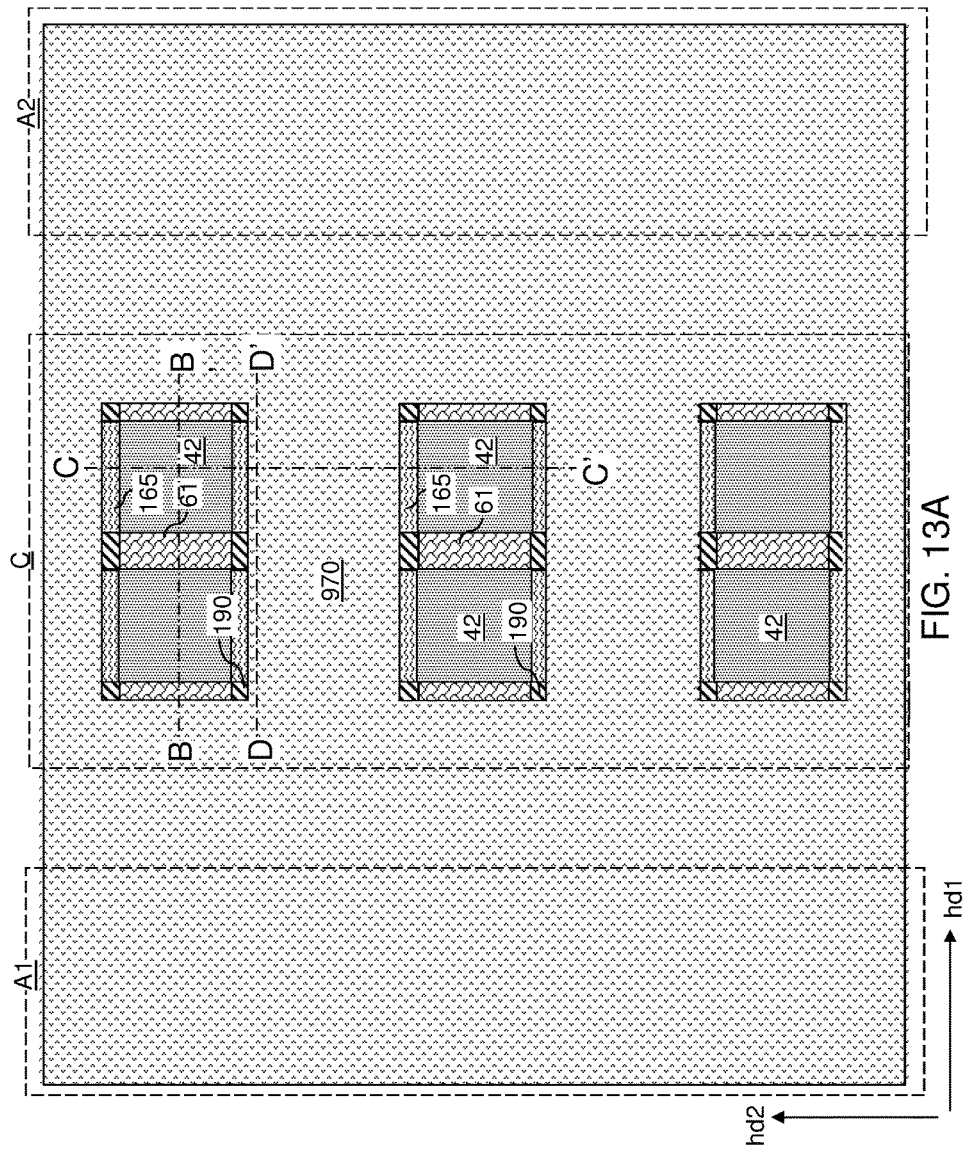

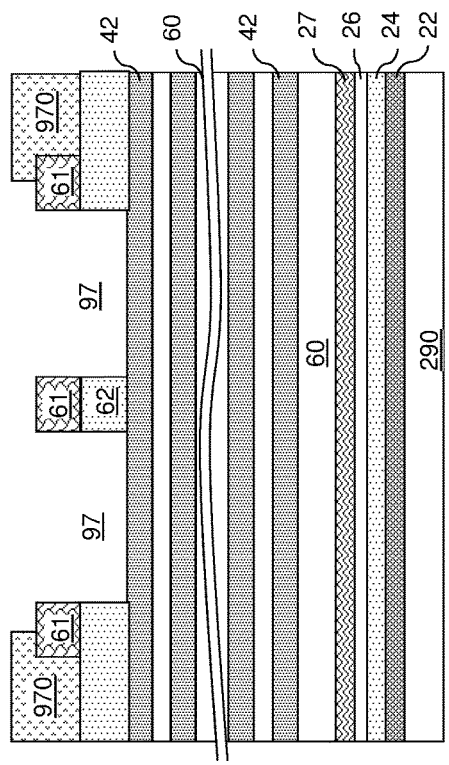
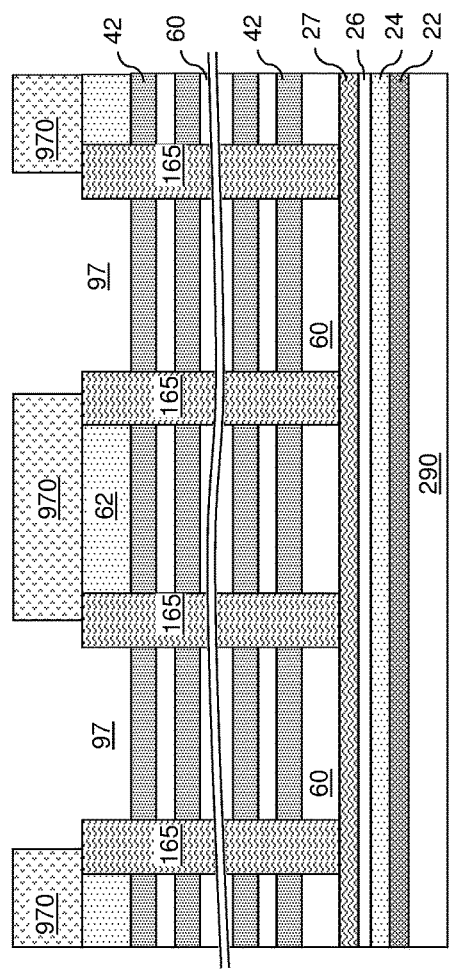

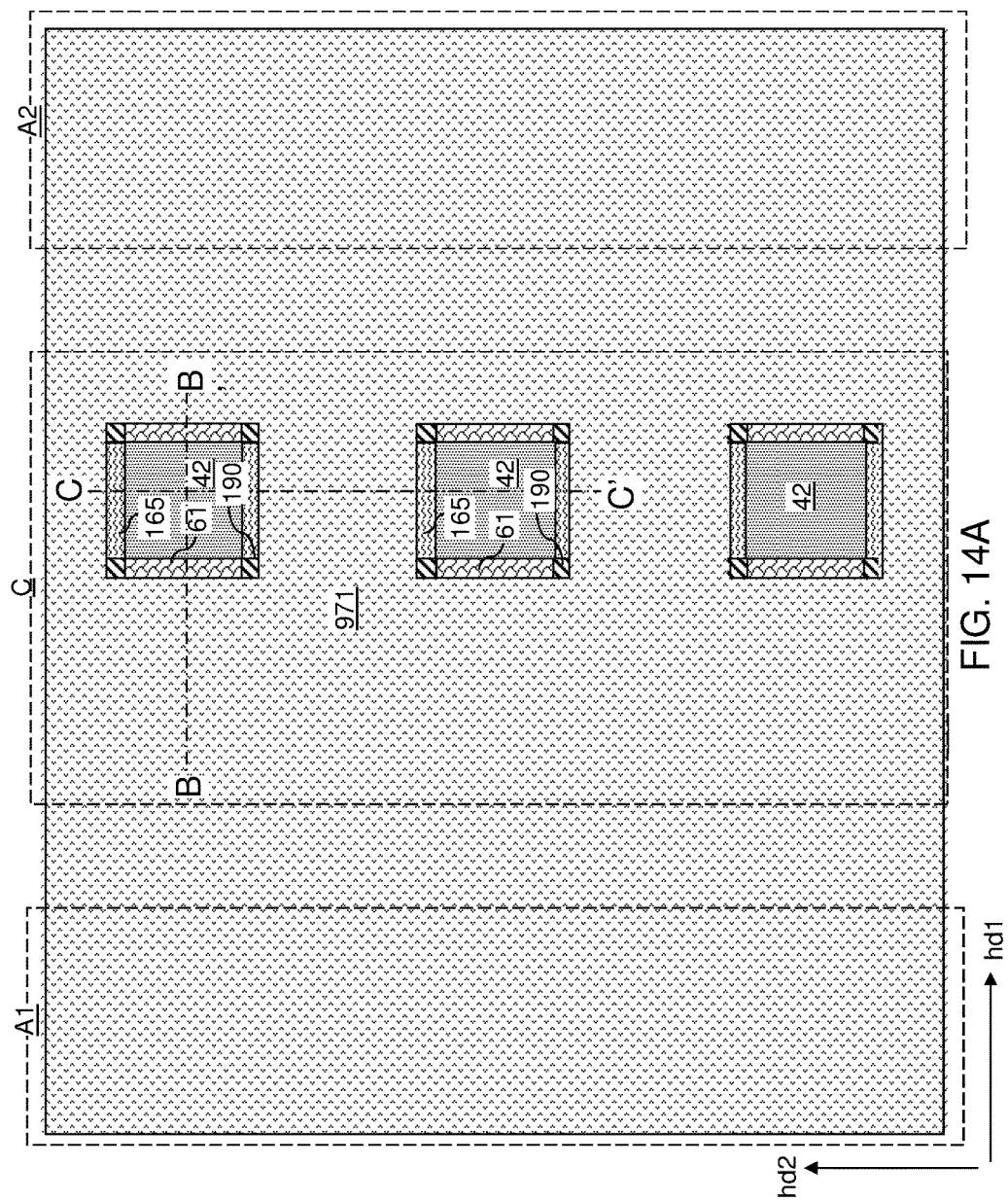

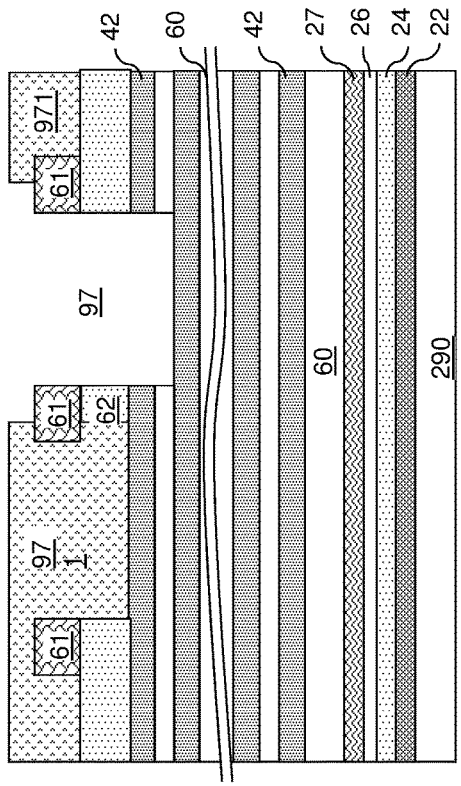
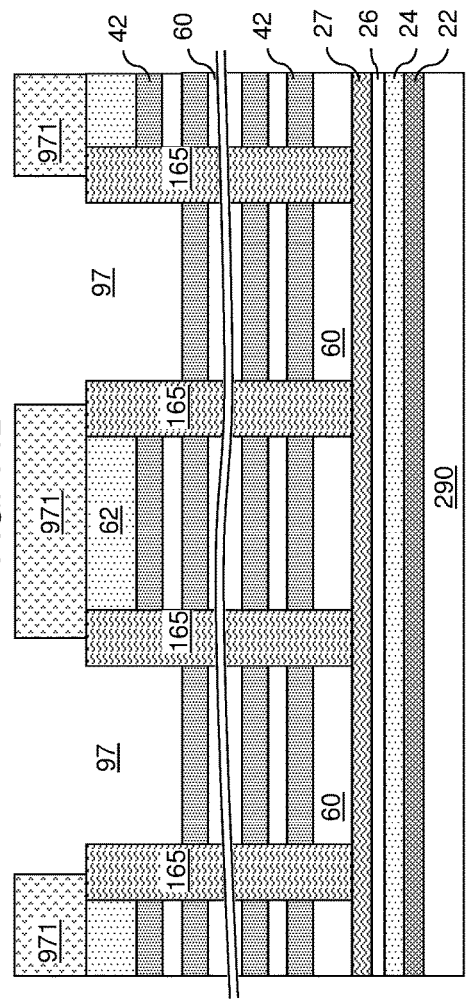
FIG. 14B
FIG. 14C

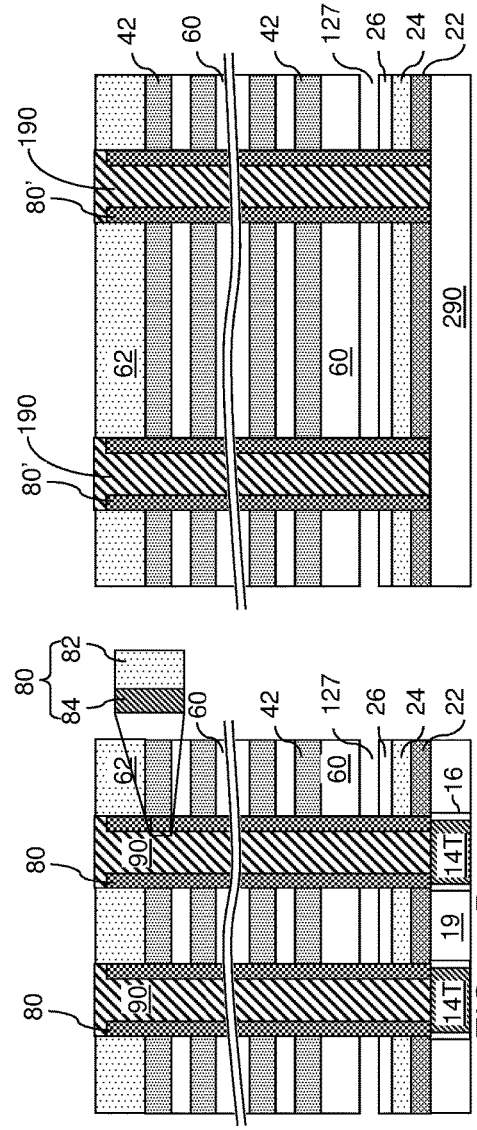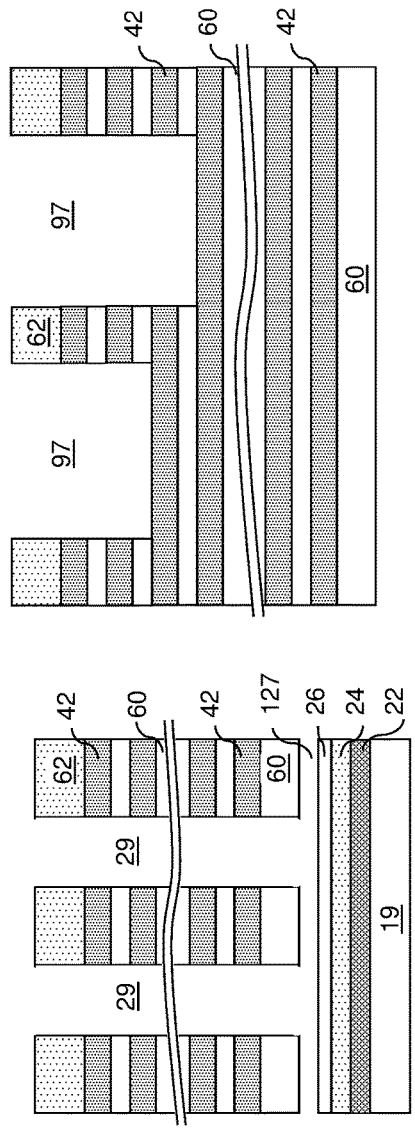

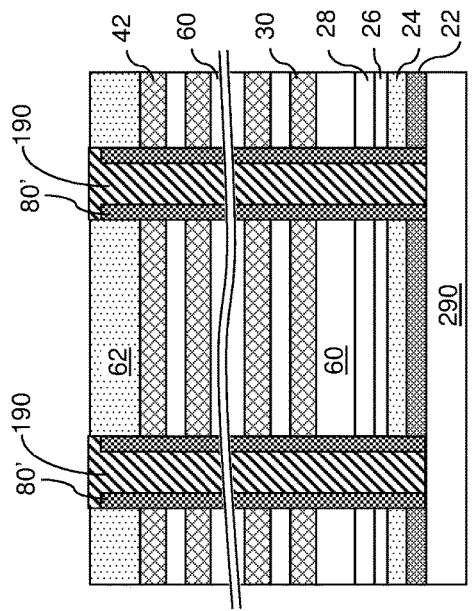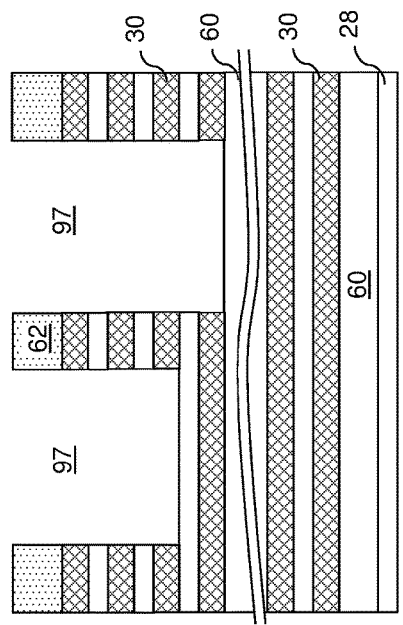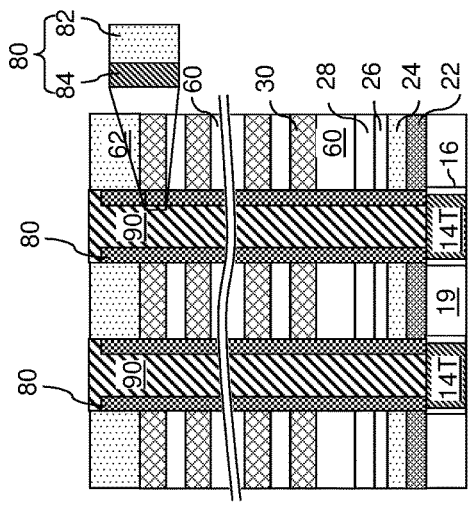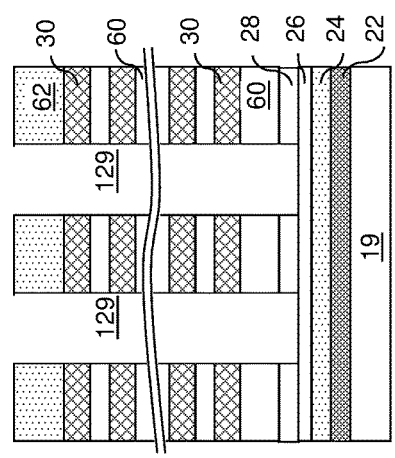

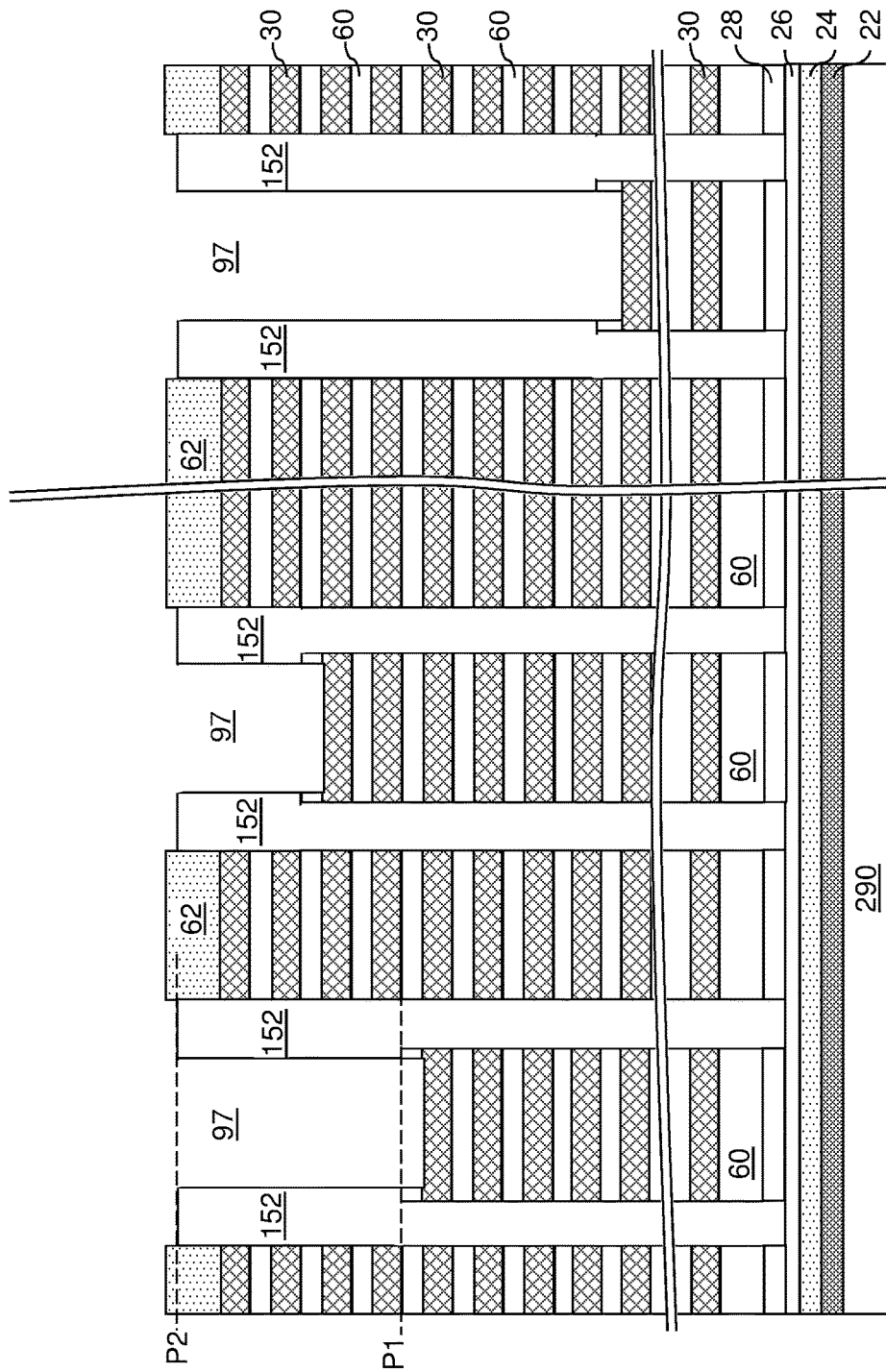

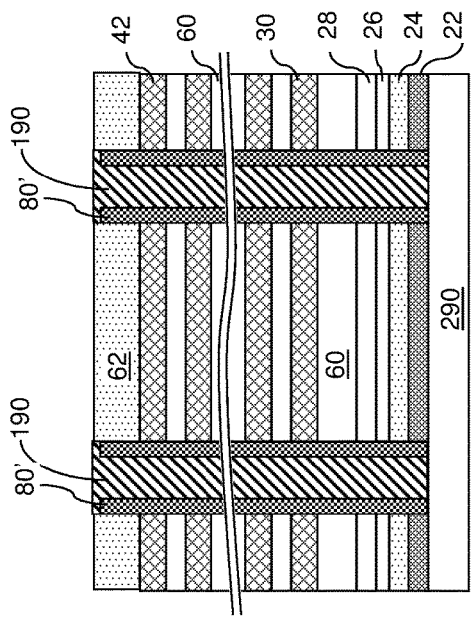
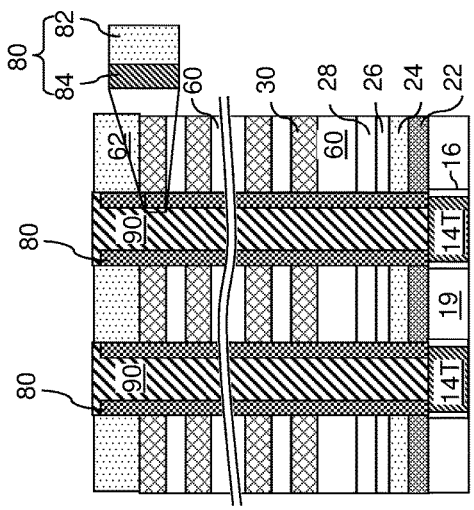
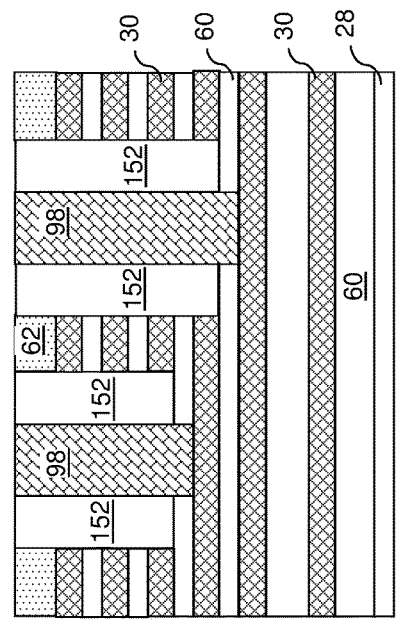
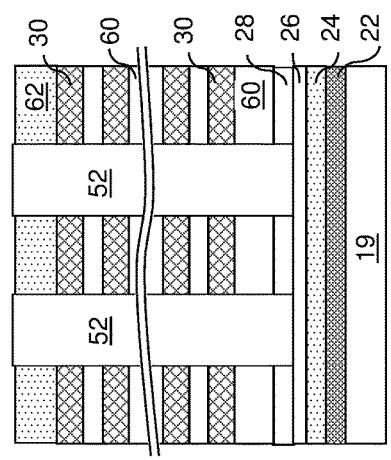

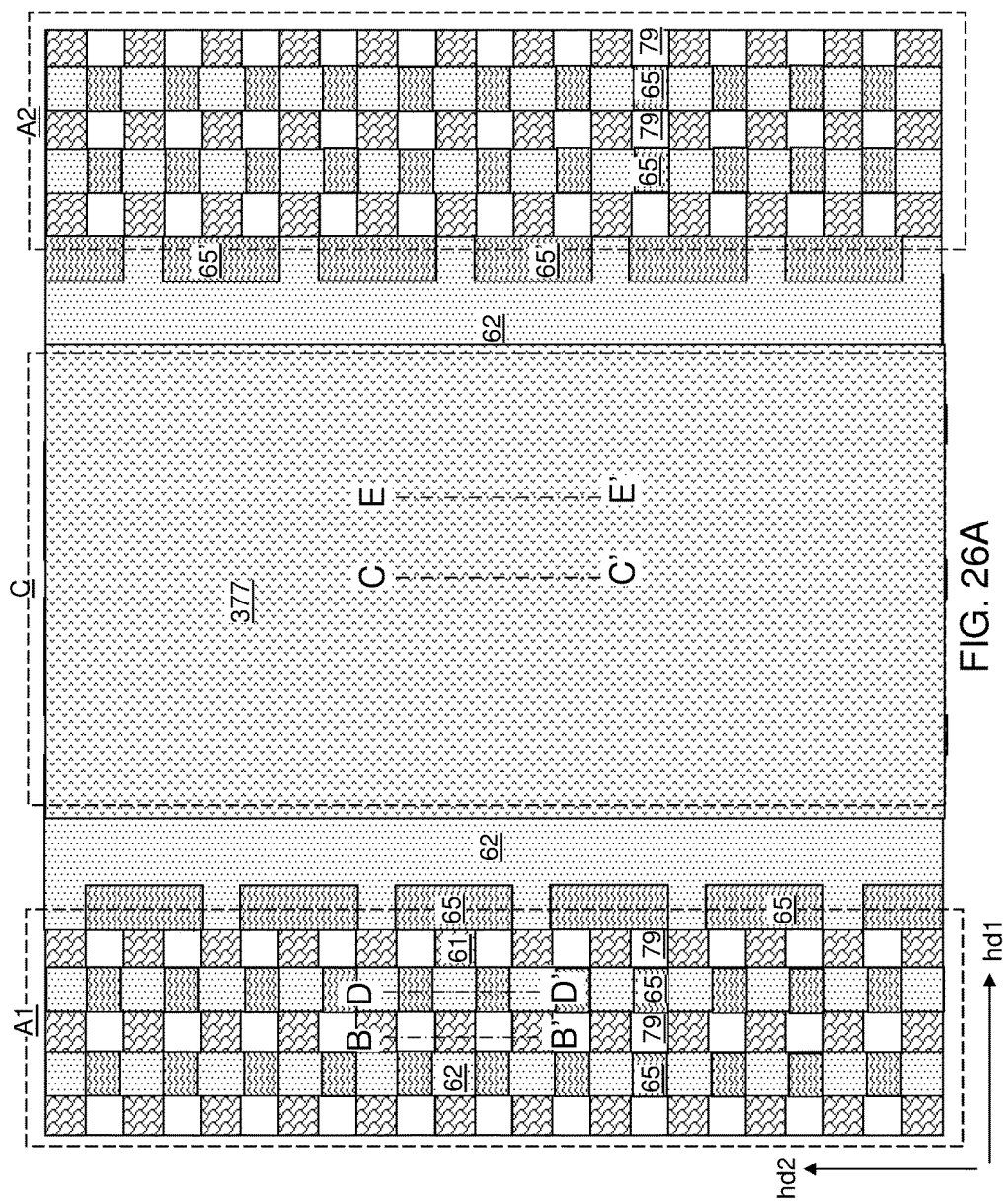

THREE-DIMENSIONAL RERAM MEMORY DEVICE EMPLOYING REPLACEMENT WORD LINES AND METHODS OF MAKING THE SAME

FIELD

The present disclosure relates generally to the field of semiconductor devices and specifically to a three-dimensional ReRAM memory devices employing replacement word lines and methods of making the same.

BACKGROUND

Three-dimensional memory devices provide high density memory for modern electronic devices. Examples of three-dimensional memory devices include three-dimensional NAND memory devices and Resistance Random Access Memory (ReRAM) devices.

A ReRAM is a non-volatile memory device employing reversible change in resistance in a thin film with application of electrical voltage bias across the film. Application of the electrical voltage bias in one manner can cause decrease in the resistance of the thin film, for example, by formation of filaments that function as leakage current paths or by increasing a crystallinity of the thin film. Application of a different type of electrical voltage bias can cause reversal of the resistance of the thin film to an original high-resistance state, such as by removal of the filaments from the thin film or by decreasing the crystallinity of the thin film. Thus, data can be stored in a ReRAM cell by changing the resistance of the thin film, which can be a solid-state material. The thin film is referred to as a resistive memory film or a read/write film. Examples of ReRAM devices are described in World Intellectual Property Organization (WIPO) Publication No. WO2007004843 A1 to Hong et al. and U.S. Patent Application Publication No. 2013/0043455 A1 to Bateman.

A barrier modulated cell (BMC) resistive random access memory (ReRAM) device is a ReRAM in which the resistance of a memory element is modulated by separation or recombination of oxygen vacancies and interstitial oxygen ions. When the interstitial oxygen ions combine with the oxygen vacancies, a zone with a low density of charge carriers is formed due to elimination of oxygen vacancies, thereby increasing the resistance of the memory element. This operation is herein referred to as a "resetting" operation. When the oxygen ions are separated from the oxygen vacancies, a zone with a high density of charge carriers is formed due to the presence of vacancies, thereby decreasing the resistance of the memory element. This operation is herein referred to as a "setting" operation.

SUMMARY

According to an aspect of the present disclosure, a three-dimensional memory device includes an alternating stack of insulating layers and electrically conductive layers located over a substrate, resistive memory elements located in the alternating stack in first and second array regions and contact via structures located in a contact region between the first and the second array regions. The contact via structures have different depths and contact different electrically conductive layers. Support pillars are located in the contact region and extending through the alternating stack. At least one conduction channel area is located between the contact via structures in the contact region. The conduction channel area contains no support pillars, and all electrically conductive layers in the conduction channel area are continuous from the first array region to the second array region.

According to another aspect of the present disclosure, a method of forming a three-dimensional memory device comprises forming an alternating stack of insulating layers and sacrificial material layers over a substrate, forming a resistive memory elements in the alternating stack in first and second array regions, forming support pillars located in a contact region between the first and the second array regions, wherein the support pillars extend through the alternating stack, etching connecting via cavities having different depths in the contact region, forming lateral recesses in the alternating stack by removing the sacrificial material layers through the connecting via cavities selective to the insulating layers, such that the support pillars support the insulating layers over the lateral recesses, forming electrically conductive layers in the lateral recesses through the connecting via cavities, and forming contact via structures in the connecting via cavities. The contact via structures have different depths and contact different electrically conductive layers.

BRIEF DESCRIPTION OF THE DRAWINGS

FIG. 3A is a top-down view of an area of the exemplary structure that includes an edge of a first array region, a contact region, and an edge of a second array region after patterning of an insulating cap layer, a first hard mask layer, and a planarization stop layer, and formation of separation trenches and line trenches therethrough according to an embodiment of the present disclosure.

FIG. 3B is a vertical cross-sectional view along the plane B-B' of the exemplary structure of FIG. 3A according to an embodiment of the present disclosure.

FIG. 3C is a vertical cross-sectional view along the plane C-C' of the exemplary structure of FIG. 3A according to an embodiment of the present disclosure.

FIG. 3D is a vertical cross-sectional view along the plane D-D' of the exemplary structure of FIG. 3A according to an embodiment of the present disclosure.

FIG. 9A is a top-down view of an area of the exemplary structure after formation of array pillar cavities and contact pillar cavities according to an embodiment of the present disclosure.

FIG. 13A is a top-down view of an area of the exemplary structure after performing a first contact etch process that etches the insulating cap layer to define contact openings according to an embodiment of the present disclosure.

FIG. 13B is a vertical cross-sectional view along the plane B-B' of the exemplary structure of FIG. 13A according to an embodiment of the present disclosure.

FIG. 13C is a vertical cross-sectional view along the plane C-C' of the exemplary structure of FIG. 13A according to an embodiment of the present disclosure.

FIG. 14A is a top-down view of an area of the exemplary structure after performing a second contact etch process that etches one pair of an insulating layer and a sacrificial material layer employing a second photoresist layer for contact formation according to an embodiment of the present disclosure.

FIG. 14B is a vertical cross-sectional view along the plane B-B' of the exemplary structure of FIG. 14A according to an embodiment of the present disclosure.

FIG. 14C is a vertical cross-sectional view along the plane C-C' of the exemplary structure of FIG. 14A according to an embodiment of the present disclosure.

FIG. 18B is a vertical cross-sectional view along the plane B-B' of the exemplary structure of FIG. 18A according to an embodiment of the present disclosure.

FIG. 18C is a vertical cross-sectional view along the plane C-C' of the exemplary structure of FIG. 18A according to an embodiment of the present disclosure.

FIG. 18D is a vertical cross-sectional view along the plane D-D' of the exemplary structure of FIG. 18A according to an embodiment of the present disclosure.

FIG. 18F is a vertical cross-sectional view along the plane F-F' of the exemplary structure of FIG. 18A according to an embodiment of the present disclosure.

FIG. 22B is a vertical cross-sectional view along the plane B-B' of the exemplary structure of FIG. 22A according to an embodiment of the present disclosure.

FIG. 22C is a vertical cross-sectional view along the plane C-C' of the exemplary structure of FIG. 22A according to an embodiment of the present disclosure.

FIG. 22D is a vertical cross-sectional view along the plane D-D' of the exemplary structure of FIG. 22A according to an embodiment of the present disclosure.

FIG. 22F is a vertical cross-sectional view along the plane F-F' of the exemplary structure of FIG. 22A according to an embodiment of the present disclosure.

FIG. 23E is a vertical cross-sectional view along the plane E-E' of the exemplary structure of FIG. 23A according to an embodiment of the present disclosure.

FIG. 24B is a vertical cross-sectional view along the plane B-B' of the exemplary structure of FIG. 24A according to an embodiment of the present disclosure.

FIG. 24C is a vertical cross-sectional view along the plane C-C' of the exemplary structure of FIG. 24A according to an embodiment of the present disclosure.

FIG. 24D is a vertical cross-sectional view along the plane D-D' of the exemplary structure of FIG. 24A according to an embodiment of the present disclosure.

FIG. 24F is a vertical cross-sectional view along the plane F-F' of the exemplary structure of FIG. 24A according to an embodiment of the present disclosure.

FIG. 26A is a top-down view of an area of an alternative embodiment of the exemplary structure after formation of array pillar cavities while the contact region is masked by a photoresist layer according to an embodiment of the present disclosure.

FIG. 27C is a vertical cross-sectional view along the plane C-C' of the exemplary structure of FIG. 27A according to an embodiment of the present disclosure.

FIG. 27D is a vertical cross-sectional view along the plane D-D' of the exemplary structure of FIG. 27A according to an embodiment of the present disclosure.

FIG. 27E is a vertical cross-sectional view along the plane E-E' of the exemplary structure of FIG. 27A according to an embodiment of the present disclosure.

FIG. 28A is a top-down view of an area of an alternative embodiment of the exemplary structure after replacement of the contact sacrificial spacer structures with dielectric support pillars according to an embodiment of the present disclosure.

FIG. 28B is a vertical cross-sectional view along the plane B-B' of the exemplary structure of FIG. 28A according to an embodiment of the present disclosure.

FIG. 28C is a vertical cross-sectional view along the plane C-C' of the exemplary structure of FIG. 28A according to an embodiment of the present disclosure.

FIG. 28D is a vertical cross-sectional view along the plane D-D' of the exemplary structure of FIG. 28A according to an embodiment of the present disclosure.

FIG. 28E is a vertical cross-sectional view along the plane E-E' of the exemplary structure of FIG. 28A according to an embodiment of the present disclosure.

FIG. 29 is a top-down view of the alternative embodiment of the exemplary structure after formation of contact via structures according to an embodiment of the present disclosure.

DETAILED DESCRIPTION

Figure 1:
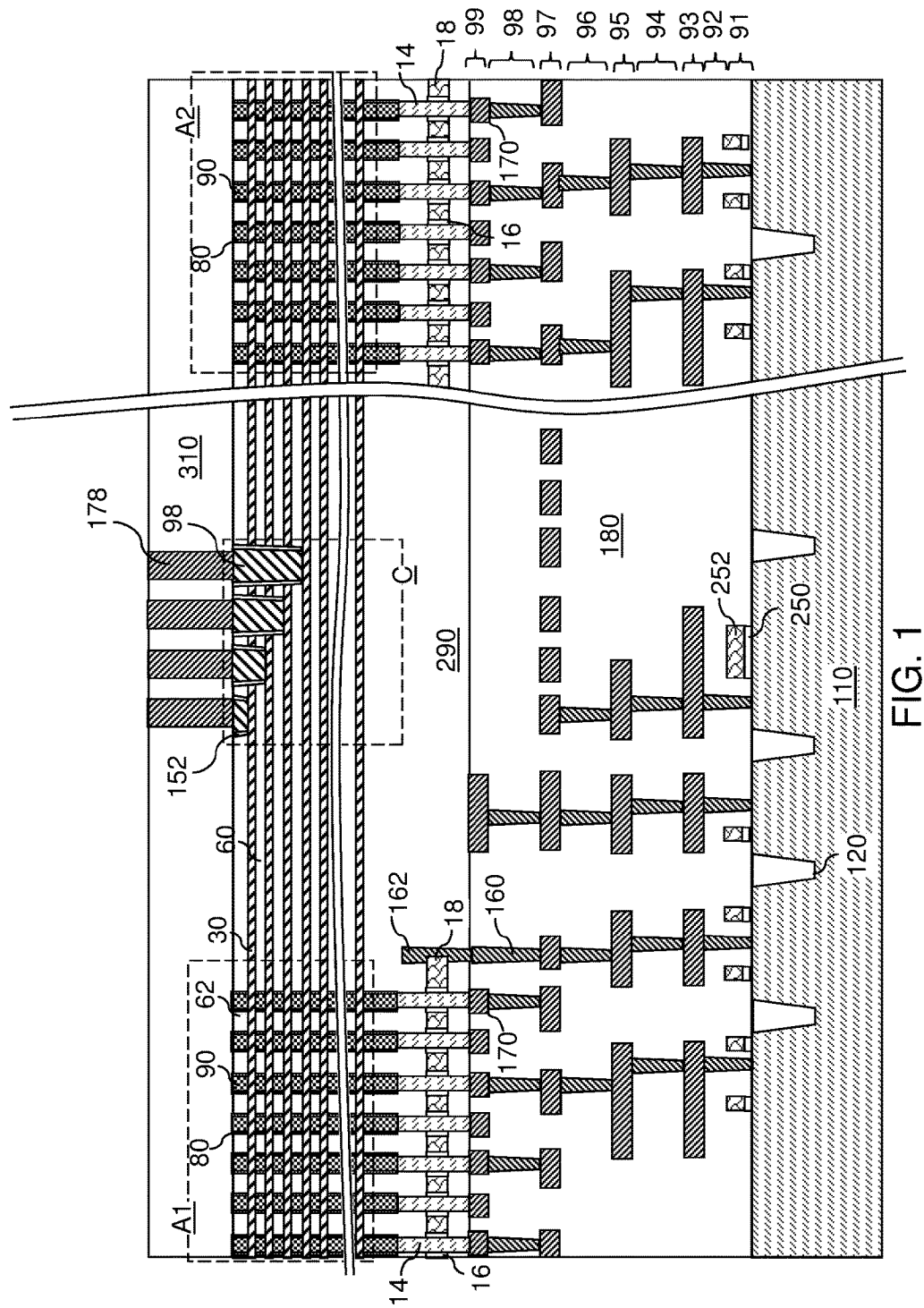
FIG. 1 is a vertical cross-sectional view of an exemplary structure that includes a three-dimensional memory device according to an embodiment of the present disclosure.

As discussed above, the present disclosure is directed to a three-dimensional memory devices employing through-stack contact via structures located in a contact region and methods of making the same, the various aspects of which are described below. The embodiments of the disclosure can be employed to form various semiconductor devices such as three-dimensional monolithic memory array devices comprising ReRAM or vertical NAND devices having a more compact through-stack contact via structures.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays.

The various three dimensional memory devices of the present disclosure can include a ReRAM device, and can be fabricated employing the various embodiments described herein. It is understood that a criss-cross array of memory elements that can be accessed by any access scheme can be employed for the resistive memory devices of the present disclosure, and the exemplary structures of the present disclosure are described herein merely provide non-limiting examples of implementation of the memory devices of the present disclosure.

Referring to FIG. 1, an exemplary structure including a three-dimensional memory device is illustrated according to a first embodiment of the present disclosure. A peripheral portion of a first array region (e.g., first memory plane) A1, a peripheral portion of a second array region (e.g., second memory plane) A2, and a contact region (e.g., word line hook up region) C are illustrated. The exemplary structure includes a substrate 110, which can include a semiconductor material layer. In one embodiment, the substrate 110 can be a silicon substrate.

Various semiconductor devices can be formed on the substrate 110. For example, shallow trench isolation structures 120 can be formed in an upper portion of the substrate 110 by forming isolation trenches and filling the isolation trenches with a dielectric material such as silicon oxide. Gate stacks (250, 252) can be formed on the top surface of the substrate 110 by deposition and patterning of a gate dielectric layer and a gate electrode layer. Patterned portions of the gate dielectric layer include gate dielectrics 250. Patterned portions of the gate electrode layer include gate electrodes 252. The level of the gate stacks (250, 252) is herein referred to as a gate level 91. Active regions (not explicitly shown) such as source regions, drain regions, source extension regions, and drain extension regions can be formed by implantation of ions into the upper portion of the substrate 110. Gate spacers including a dielectric material can be formed around the gate stacks (250, 252) by deposition of a conformal dielectric material layer and an anisotropic etch.

Lower interconnect level dielectric material layers 180, lower interconnect level via structures 160, and lower interconnect level line structures 170 can be formed over the various semiconductor devices that are formed on the substrate 110. The levels of the lower interconnect level dielectric material layers 180, the lower interconnect level via structures 160, and the lower interconnect level line structures 170 can include a substrate contact level 92, various metal line levels (such as the levels 93, 95, 97, 99), and various metal via levels (such as levels 94, 96, 98).

Memory level dielectric material layers 290 can be subsequently formed over the lower interconnect level dielectric material layers. Access transistors can be formed at a lower level of the memory level dielectric material layers 290. The access transistors can include access transistor gate electrodes 18, access transistor gate dielectrics 16, and vertical semiconductor stacks 14. Each vertical semiconductor stack 14 can include a vertical channel region that is laterally surrounded by a respective access transistor gate dielectric 16, and a pair of a source region and a drain region located above and below the channel region. The level of the access transistor gate electrodes 18 is herein referred to as a select gate level. Various conductive structures 162 can be formed at a bottom region of the memory level dielectric material layers 290, which can include the level of the select gate level. When referred to with respect to memory devices to be formed above the level of the conductive structures 162, the conductive structures 162 are referred to as a subset of underlying conductive structures, which include the conductive structures 162, the lower interconnect level via structures 160, and the lower interconnect level line structures 170.

Suitable liners may be formed over the access transistors. An alternating stack of insulating layers 60 and sacrificial material layers can be formed over the liners. Separation trenches in a multi-finger configuration can be formed in array regions, and line trenches can be formed in contact regions. Resistive memory pillars (80, 90) can be formed through the alternating stack in a subset of volumes of the separation trenches. Each resistive memory pillar includes a resistive memory film 80 and a vertical bit line 90. Support pillars (not shown) can be formed through the alternating stack in a subset of volumes of the line trenches. Each support pillar can includes either a dielectric material or a dummy resistive memory film and a conductive fill structure.

A series of photoresist layers are applied and patterned to form respective openings. The pattern of the openings is transferred into respective subset of layers within the alternating stack employing a respective anisotropic etch process to form connecting via cavities between pairs of line trenches. Sacrificial materials are removed from the separation trenches between each pair of resistive memory pillars. The sacrificial material layers are subsequently replaced with electrically conducive layers 30 to provide an alternating stack (30, 60) of insulating layers 60 and electrically conducive layers 30. Insulating spacers 152 are formed in the connecting via trenches and adjoining portions of the line trenches. Contact via structures 98 can be formed inside the insulating spacers 152 to provide electrical contact to the electrically conductive layers 30.

Upper interconnect level dielectric material layers 310, upper interconnect level via structures, and upper interconnect level line structures can be subsequently formed. The upper interconnect level via structures or the upper interconnect level line structures can include, for example, word line connection structures 178, which are electrically connected to (i.e., electrically shorted to) the contact via structures and may include via structures and/or line structures.

The process of forming access transistors, a resistive memory array, and contact via structures is described in detail in subsequent sections.

Figure 2A:
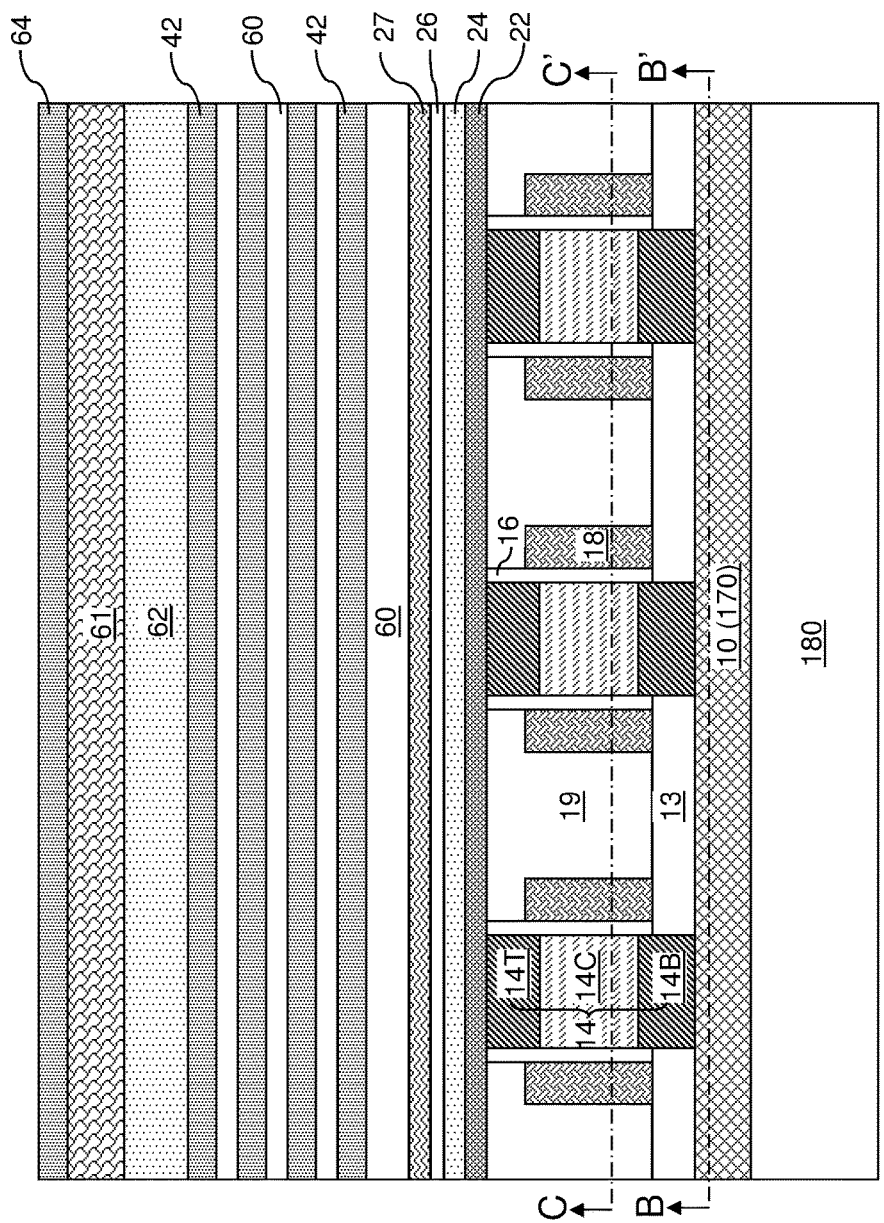
FIG. 2A is a vertical cross-sectional view of an array region of the exemplary structure after formation of access transistors, a silicon nitride liner, a first silicon oxide liner, a second silicon oxide liner, a semiconductor material liner, an alternating stack of insulating layers and sacrificial material layers, an insulating cap layer, a first hard mask layer, and a planarization stopping layer according to an embodiment of the present disclosure.
Figure 2B:
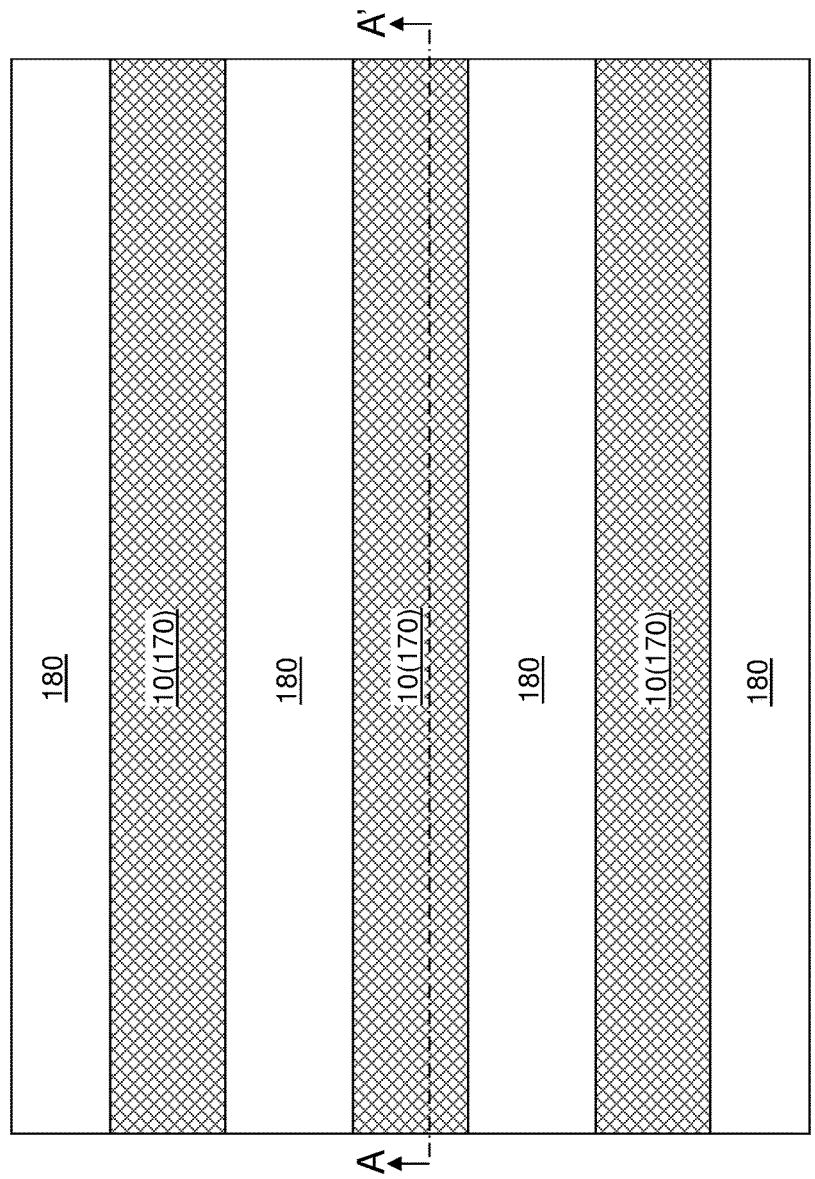
FIG. 2B is a horizontal cross-sectional view of the exemplary structure along the horizontal plane B-B' of the exemplary structure of FIG. 2A.
Figure 2C:
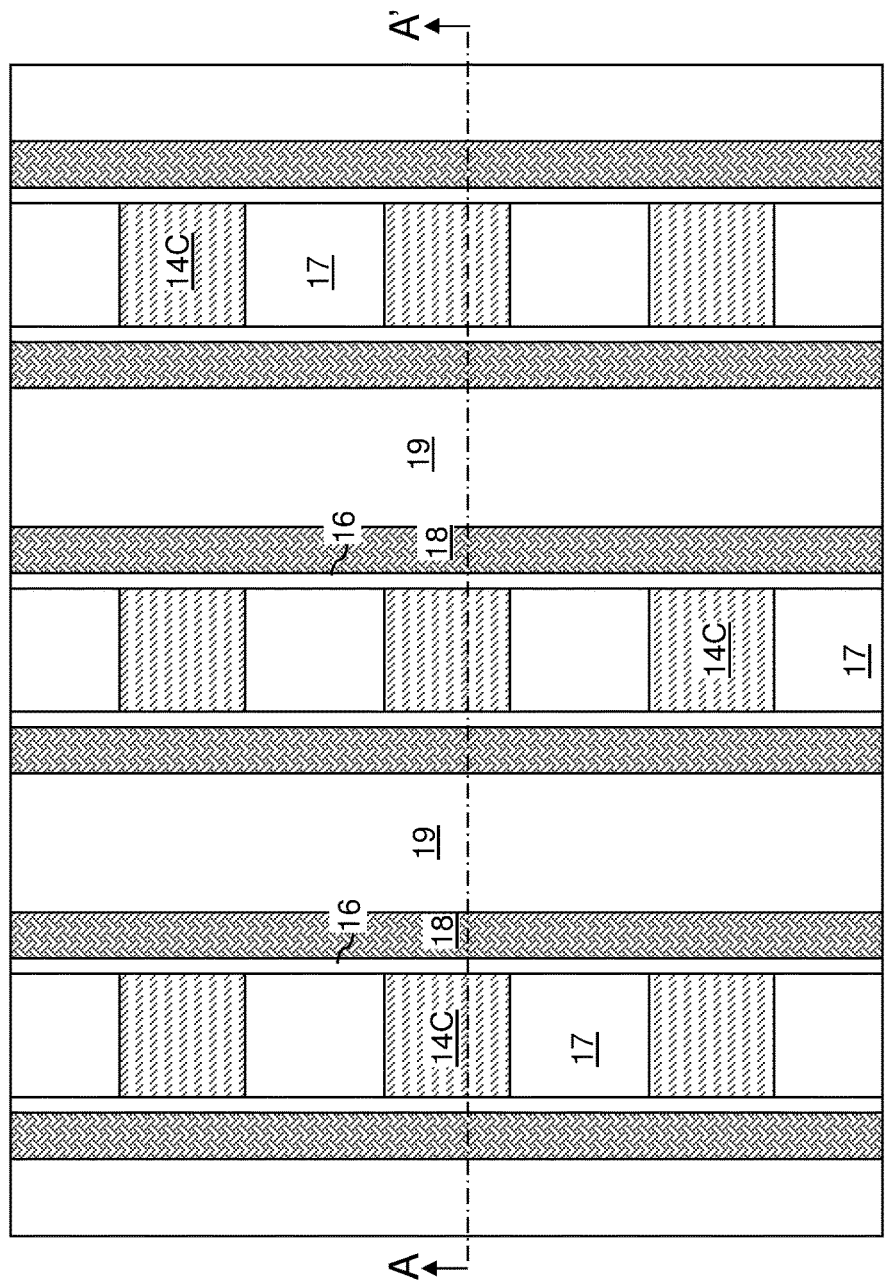
FIG. 2C is a horizontal cross-sectional view of the exemplary structure along the horizontal plane C-C' of the exemplary structure of FIG. 2A.
Figure 4A:
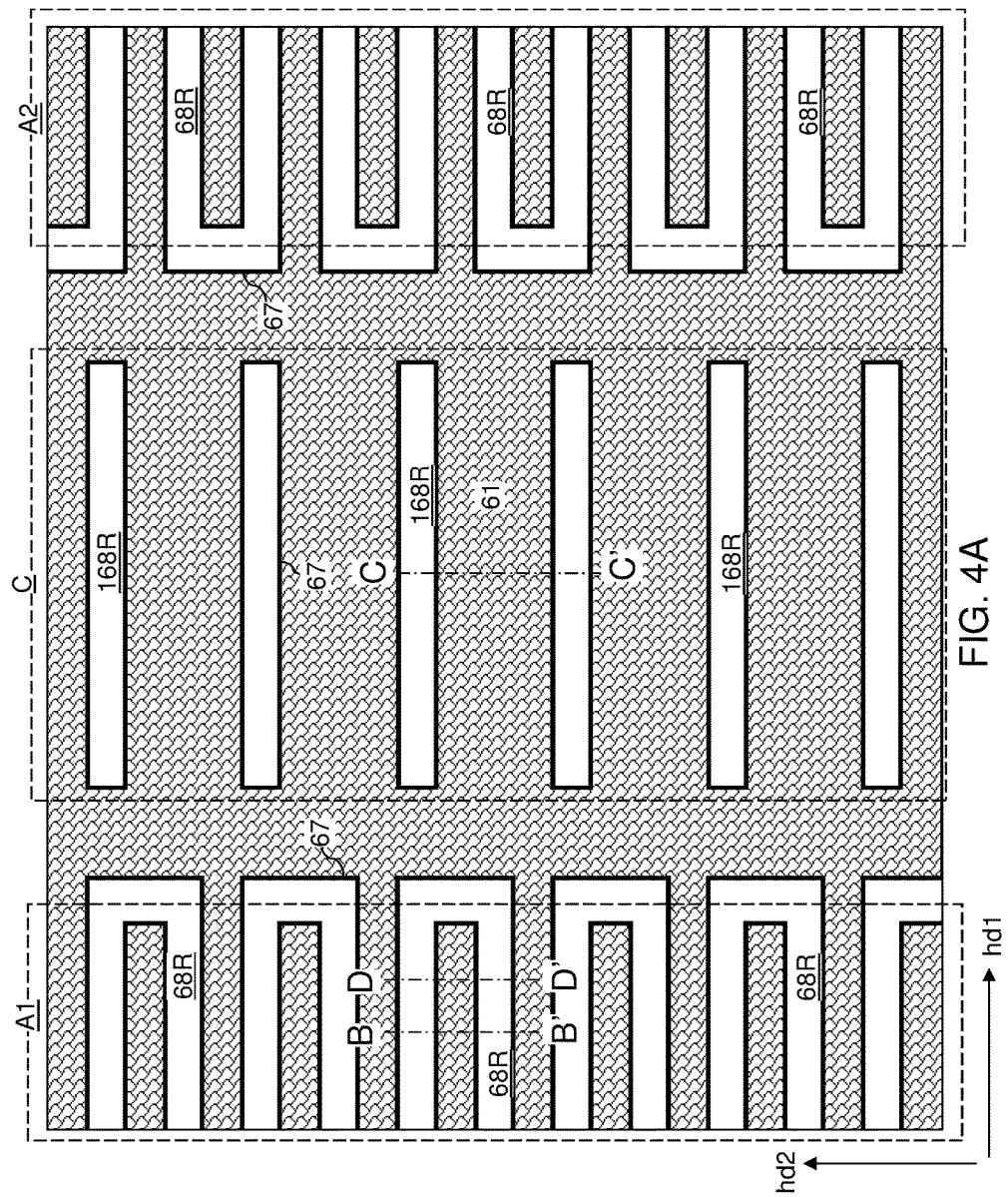
FIG. 4A is a top-down view of an area of the exemplary structure after formation of array sacrificial wall structures and contact sacrificial wall structures according to an embodiment of the present disclosure.
Figure 4C:
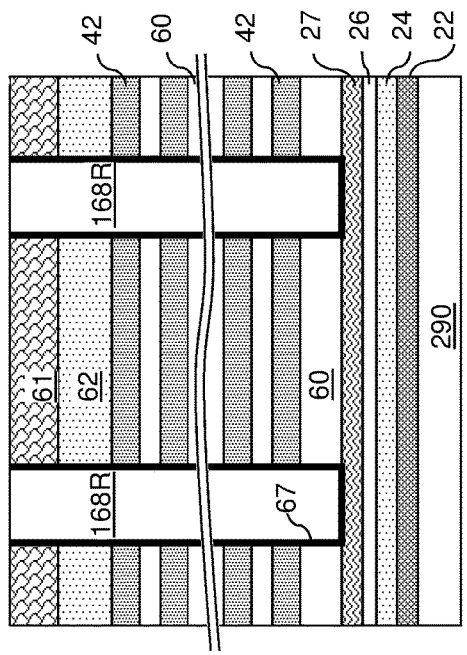
FIG. 4C is a vertical cross-sectional view along the plane C-C' of the exemplary structure of FIG. 4A according to an embodiment of the present disclosure.
Figure 4B:
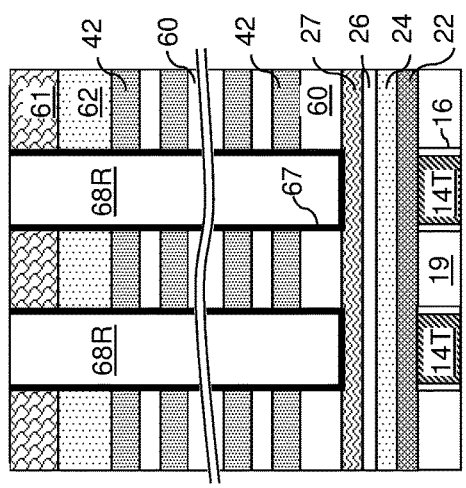
FIG. 4B is a vertical cross-sectional view along the plane B-B' of the exemplary structure of FIG. 4A according to an embodiment of the present disclosure.
Figure 4D:
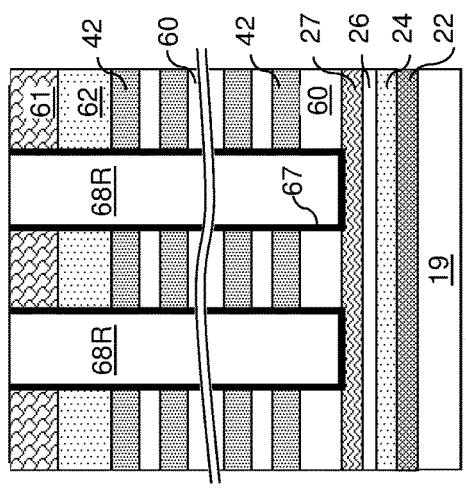
FIG. 4D is a vertical cross-sectional view along the plane D-D' of the exemplary structure of FIG. 4A according to an embodiment of the present disclosure.
Figure 5A:
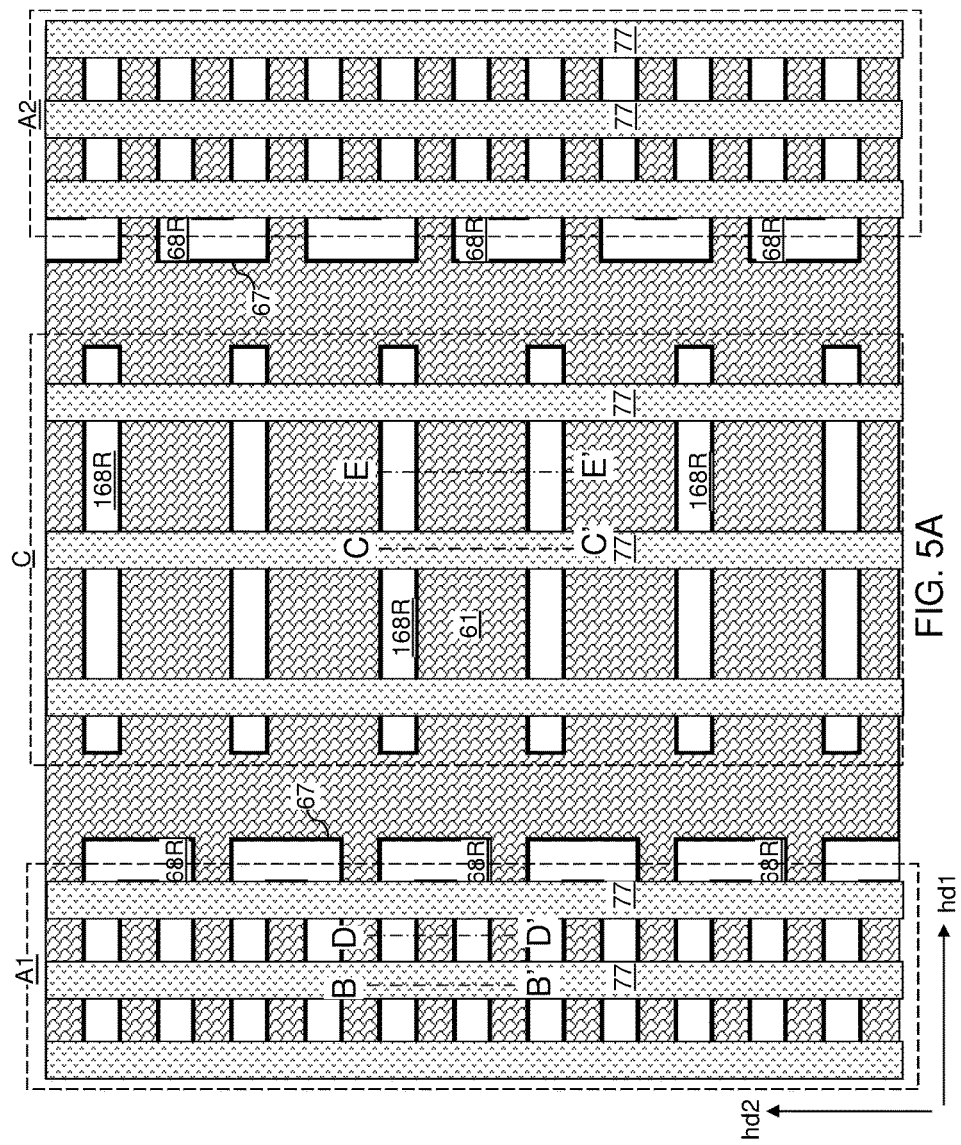
FIG. 5A is a top-down view of an area of the exemplary structure after formation of a second hard mask layer and a patterned photoresist layer according to an embodiment of the present disclosure.
Figure 5B:
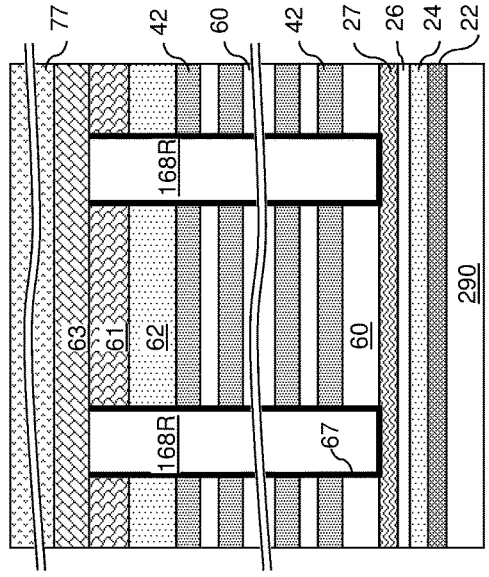
FIG. 5B is a vertical cross-sectional view along the plane B-B' of the exemplary structure of FIG. 5A according to an embodiment of the present disclosure.
Figure 5C:
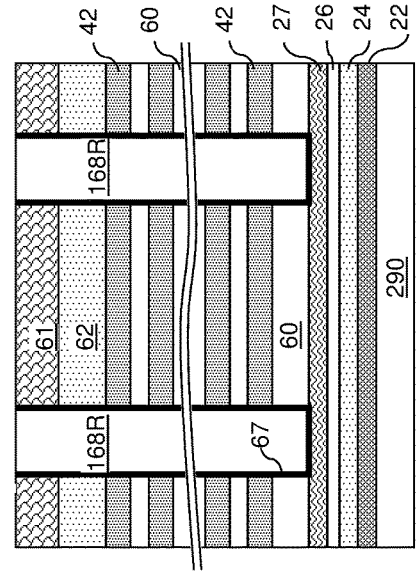
FIG. 5C is a vertical cross-sectional view along the plane C-C' of the exemplary structure of FIG. 5A according to an embodiment of the present disclosure.
Figure 5D:
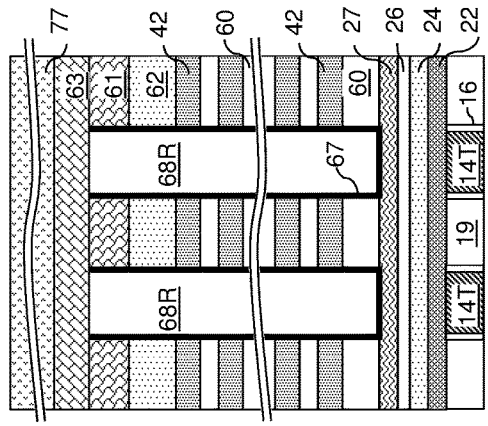
FIG. 5D is a vertical cross-sectional view along the plane D-D' of the exemplary structure of FIG. 5A according to an embodiment of the present disclosure.
Figure 5E:
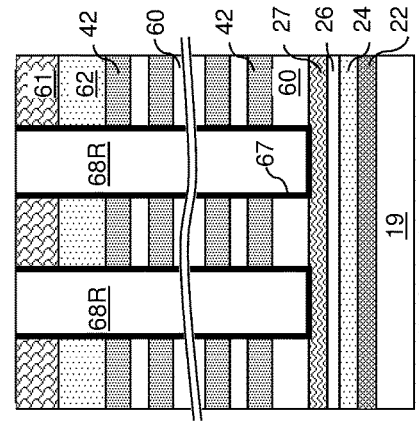
FIG. 5E is a vertical cross-sectional view along the plane E-E' of the exemplary structure of FIG. 5A according to an embodiment of the present disclosure.
Figure 6A:
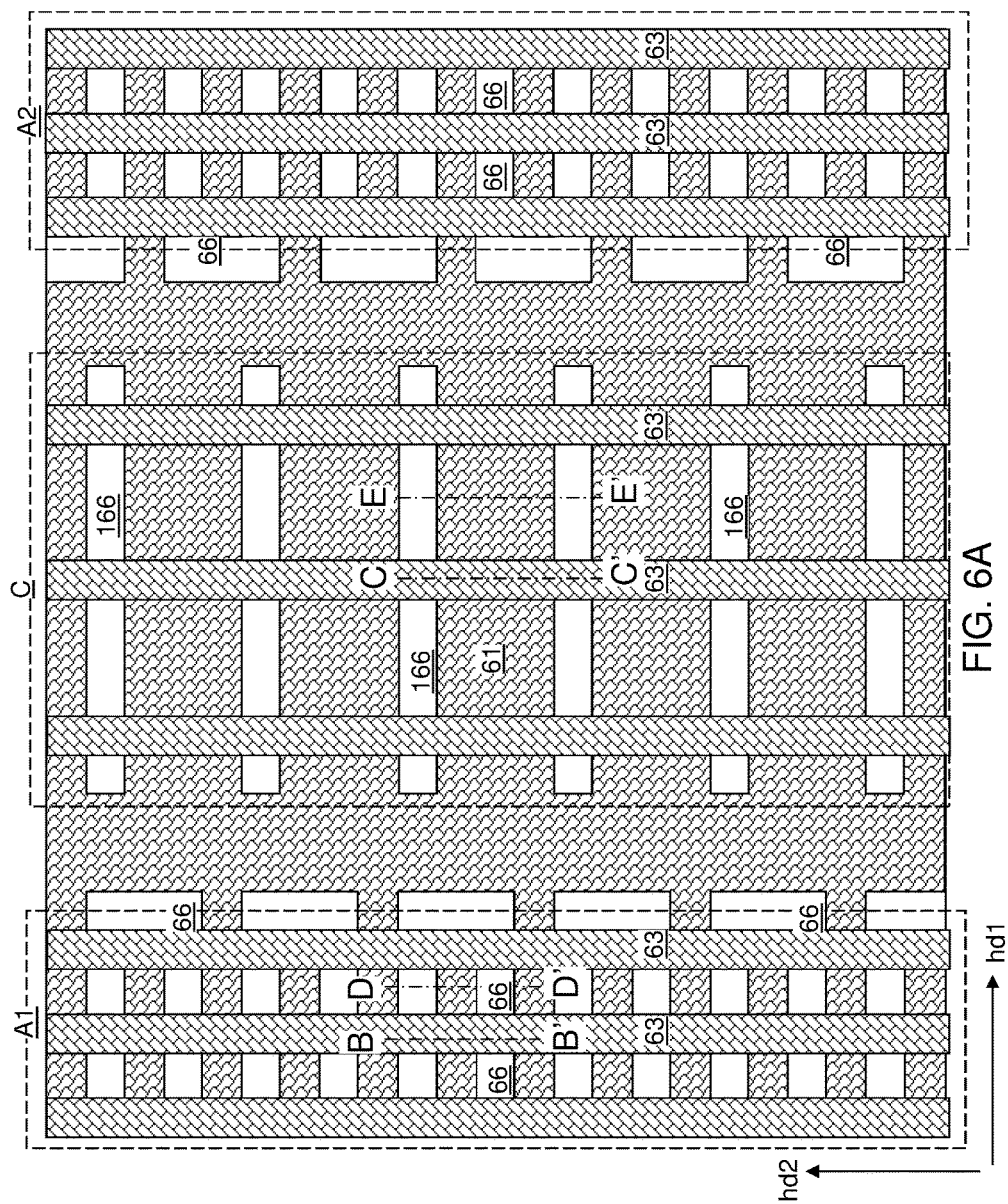
FIG. 6A is a top-down view of an area of the exemplary structure after patterning the second hard mask layer and formation of sacrificial pillar cavities and sacrificial template cavities according to an embodiment of the present disclosure.
Figure 6B:
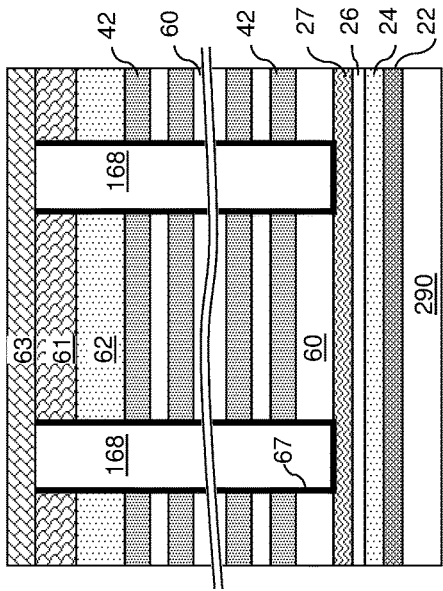
FIG. 6B is a vertical cross-sectional view along the plane B-B' of the exemplary structure of FIG. 6A according to an embodiment of the present disclosure.
Figure 6C:
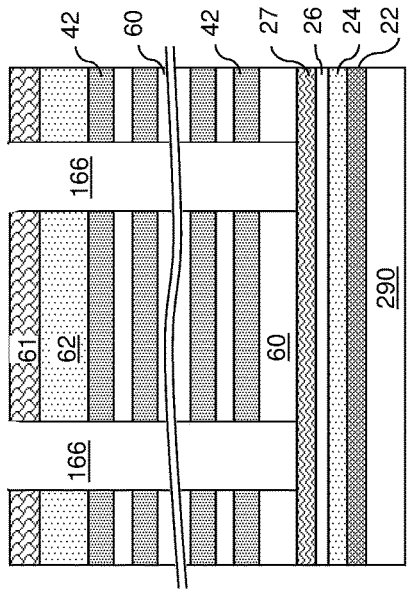
FIG. 6C is a vertical cross-sectional view along the plane C-C' of the exemplary structure of FIG. 6A according to an embodiment of the present disclosure.
Figure 6D:
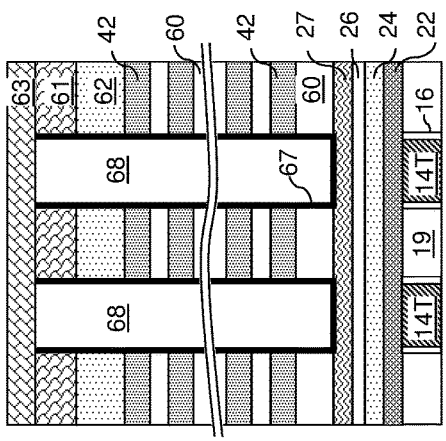
FIG. 6D is a vertical cross-sectional view along the plane D-D' of the exemplary structure of FIG. 6A according to an embodiment of the present disclosure.
Figure 6E:
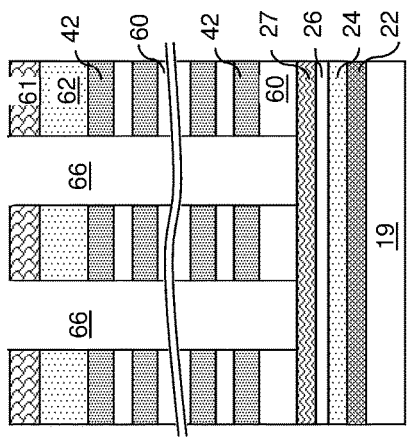
FIG. 6E is a vertical cross-sectional view along the plane E-E' of the exemplary structure of FIG. 6A according to an embodiment of the present disclosure.
Figure 7A:
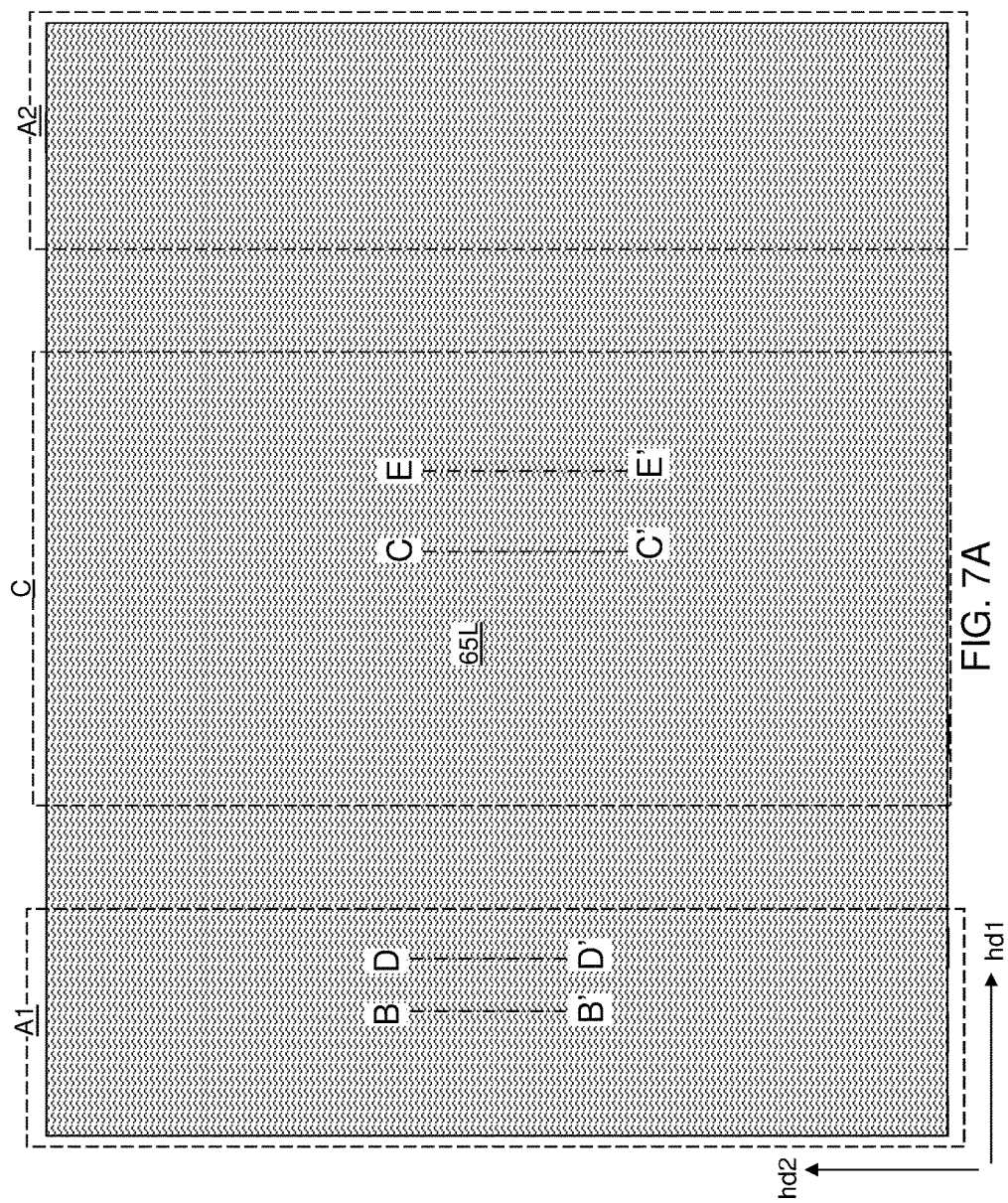
FIG. 7A is a top-down view of an area of the exemplary structure after depositing a template material layer according to an embodiment of the present disclosure.
Figure 7C:
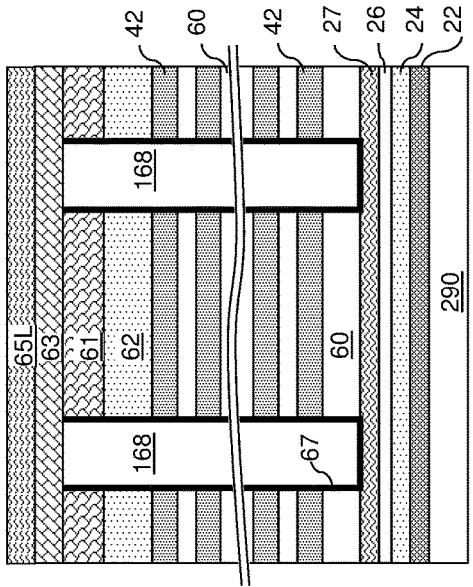
FIG. 7C is a vertical cross-sectional view along the plane C-C' of the exemplary structure of FIG. 7A according to an embodiment of the present disclosure.
Figure 7E:
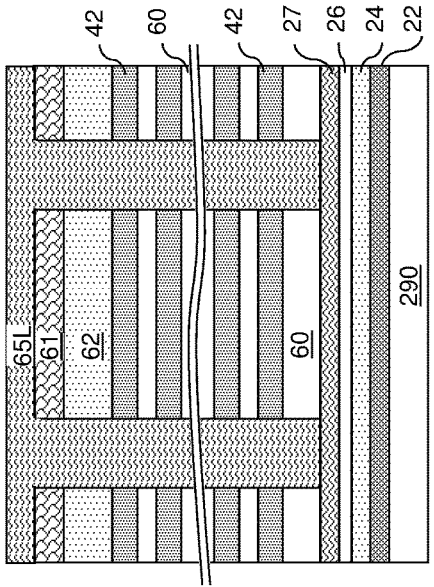
FIG. 7E is a vertical cross-sectional view along the plane E-E' of the exemplary structure of FIG. 7A according to an embodiment of the present disclosure.
Figure 7B:
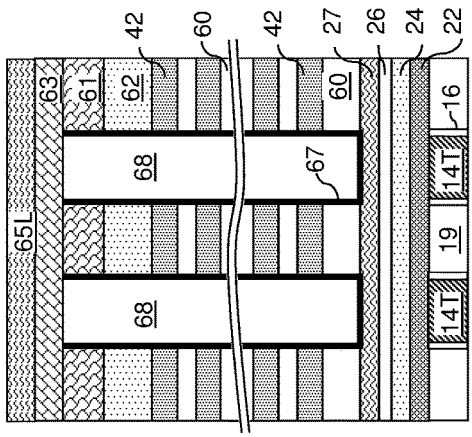
FIG. 7B is a vertical cross-sectional view along the plane B-B' of the exemplary structure of FIG. 7A according to an embodiment of the present disclosure.
Figure 7D:
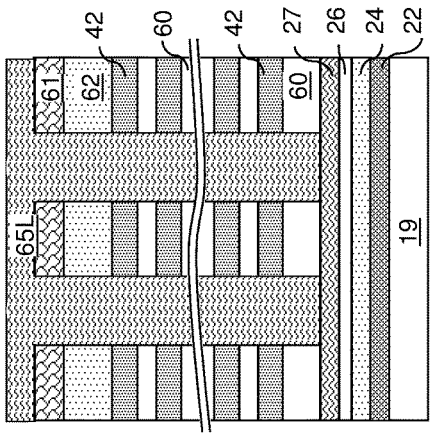
FIG. 7D is a vertical cross-sectional view along the plane D-D' of the exemplary structure of FIG. 7A according to an embodiment of the present disclosure.
Figure 8A:
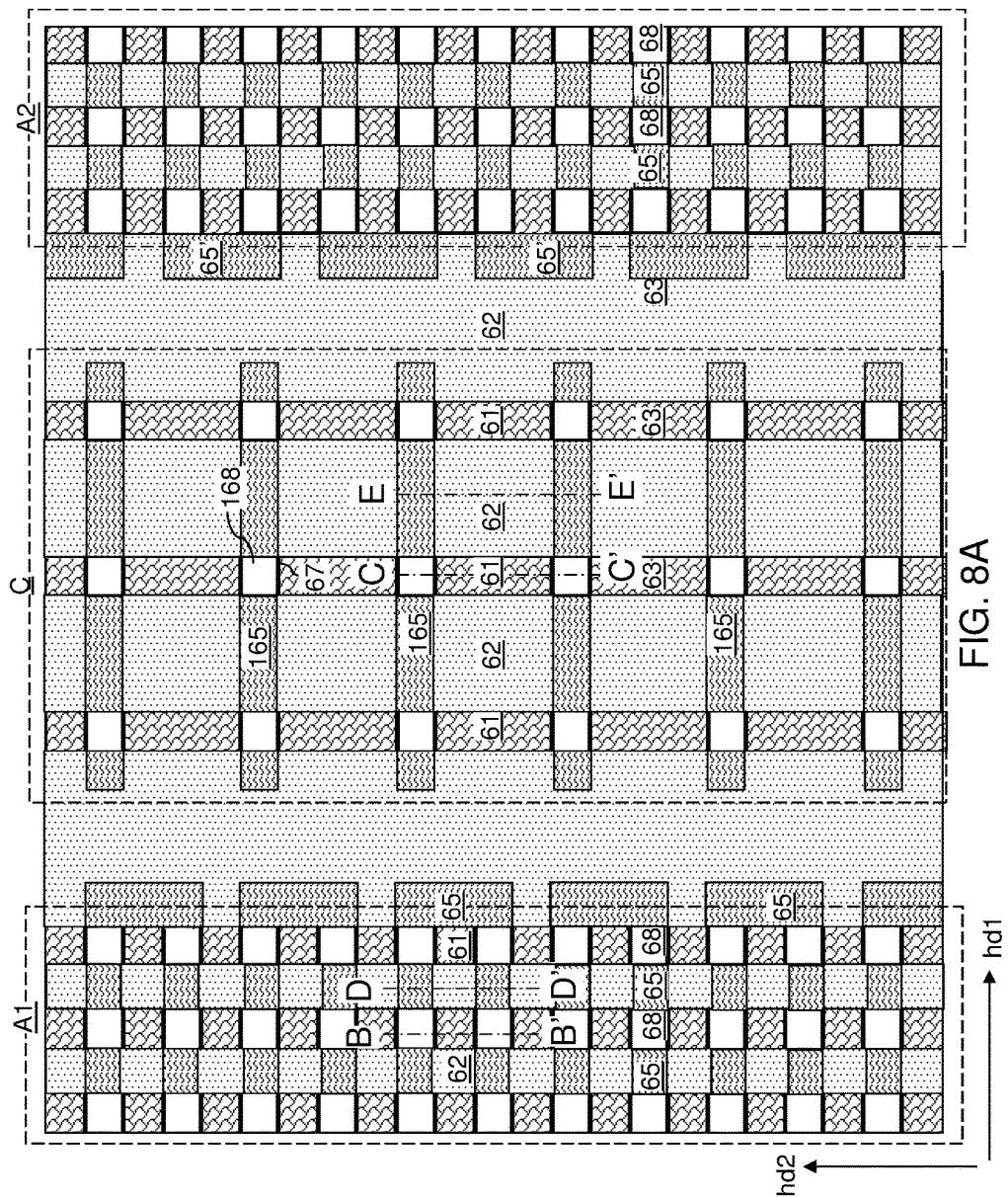
FIG. 8A is a top-down view of an area of the exemplary structure after formation of sacrificial pillar structures and sacrificial template structures according to an embodiment of the present disclosure.
Figure 8B:
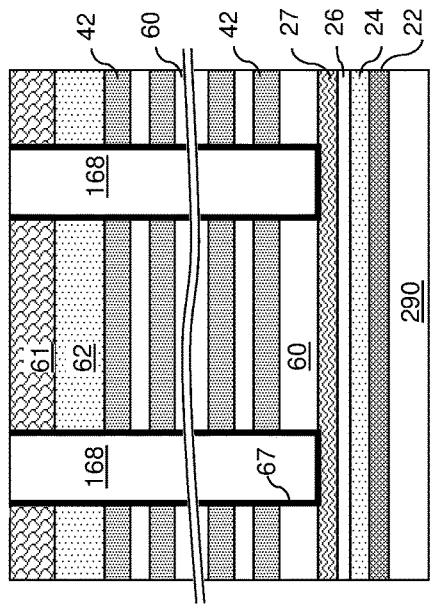
FIG. 8B is a vertical cross-sectional view along the plane B-B' of the exemplary structure of FIG. 8A according to an embodiment of the present disclosure.
Figure 8D:
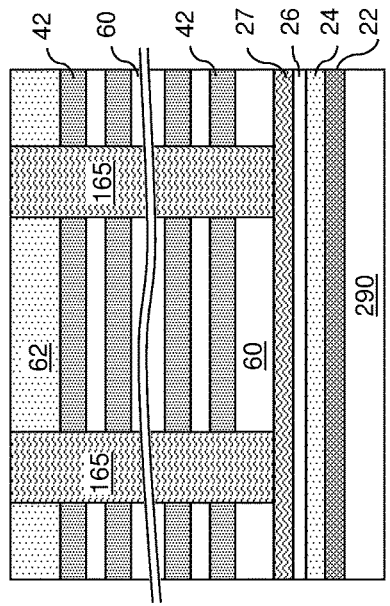
FIG. 8D is a vertical cross-sectional view along the plane D-D' of the exemplary structure of FIG. 8A according to an embodiment of the present disclosure.
Figure 8C:
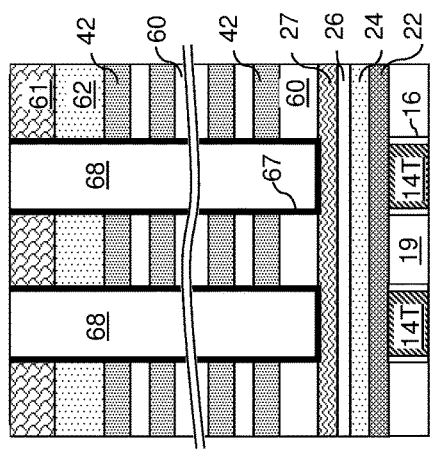
FIG. 8C is a vertical cross-sectional view along the plane C-C' of the exemplary structure of FIG. 8A according to an embodiment of the present disclosure.
Figure 8E:
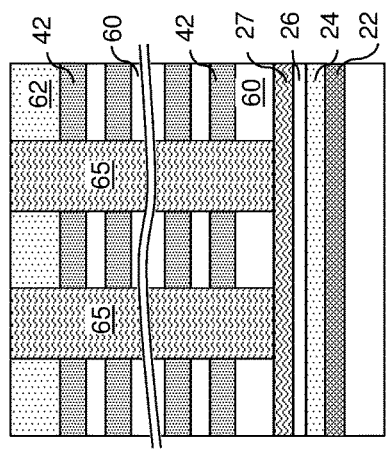
FIG. 8E is a vertical cross-sectional view along the plane E-E' of the exemplary structure of FIG. 8A according to an embodiment of the present disclosure.
Figure 9B:
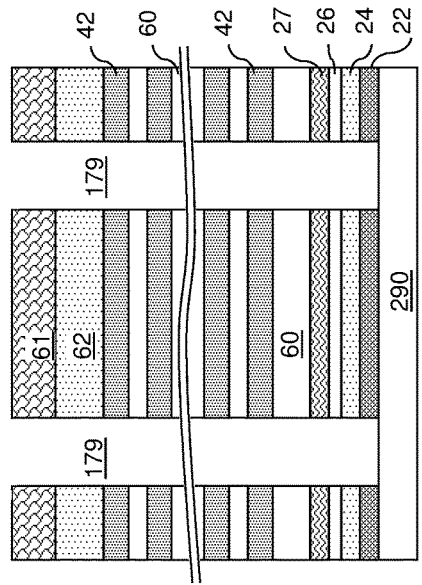
FIG. 9B is a vertical cross-sectional view along the plane B-B' of the exemplary structure of FIG. 9A according to an embodiment of the present disclosure.
Figure 9D:
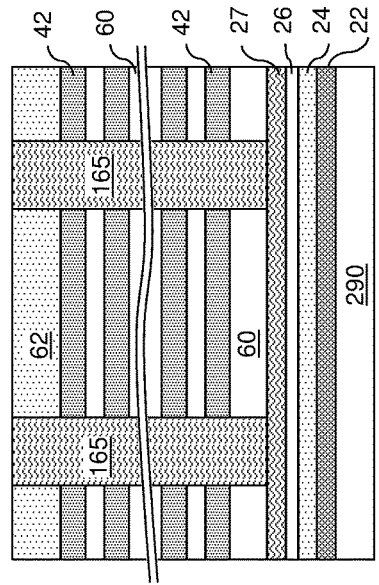
FIG. 9D is a vertical cross-sectional view along the plane D-D' of the exemplary structure of FIG. 9A according to an embodiment of the present disclosure.
Figure 9C:
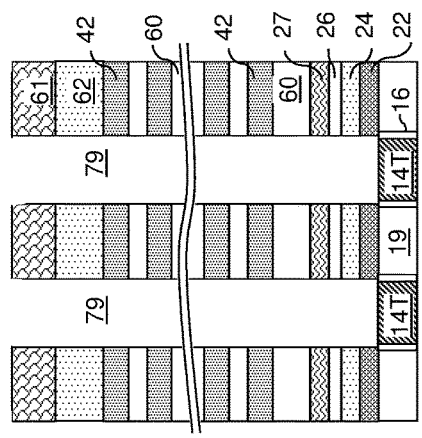
FIG. 9C is a vertical cross-sectional view along the plane C-C' of the exemplary structure of FIG. 9A according to an embodiment of the present disclosure.
Figure 9E:
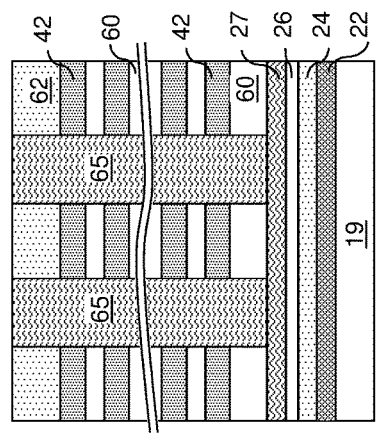
FIG. 9E is a vertical cross-sectional view along the plane E-E' of the exemplary structure of FIG. 9A according to an embodiment of the present disclosure.
Figure 10A:
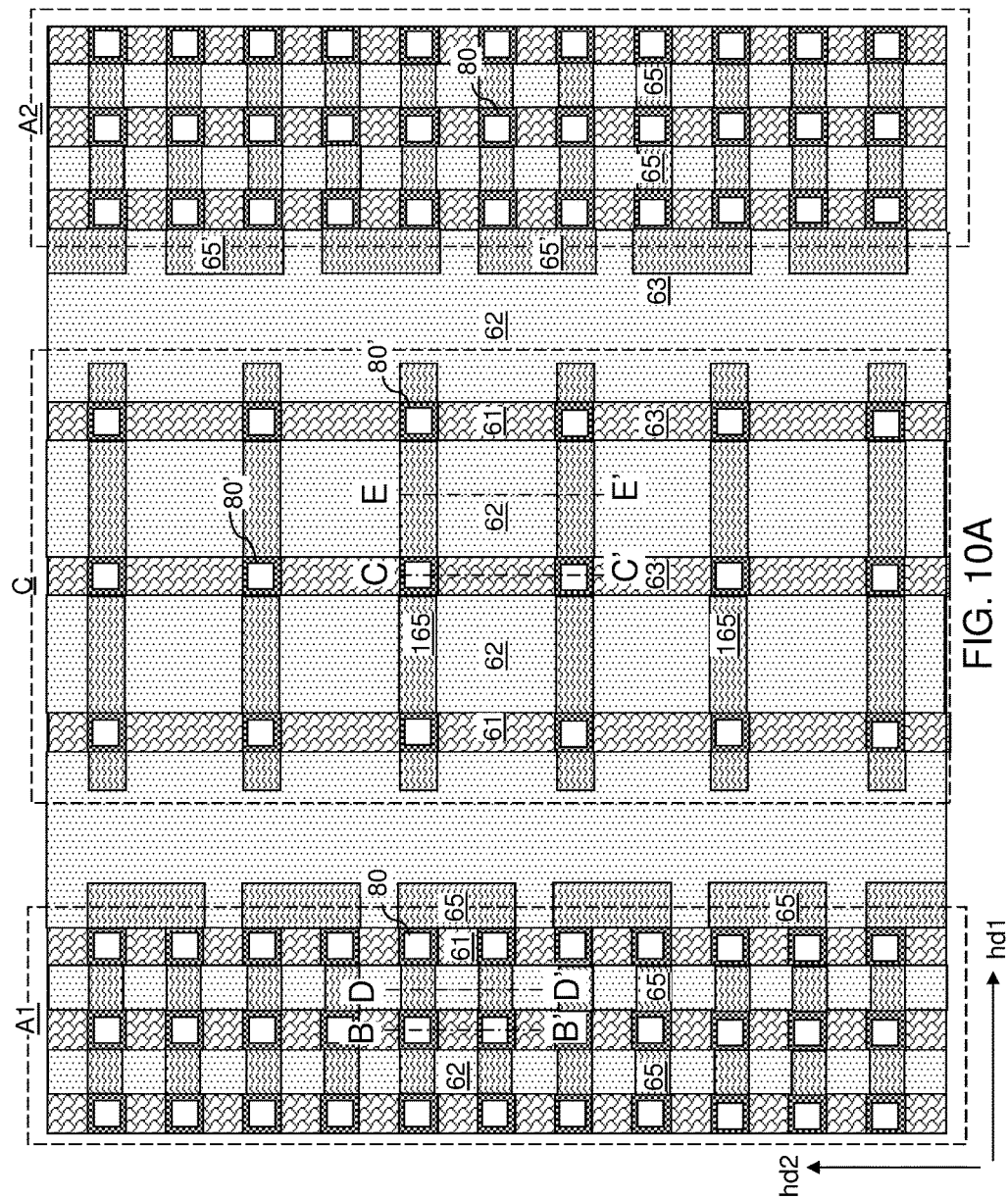
FIG. 10A is a top-down view of an area of the exemplary structure after formation of a resistive memory film in each of the array pillar cavities and the contact pillar cavities according to an embodiment of the present disclosure.
Figure 10B:
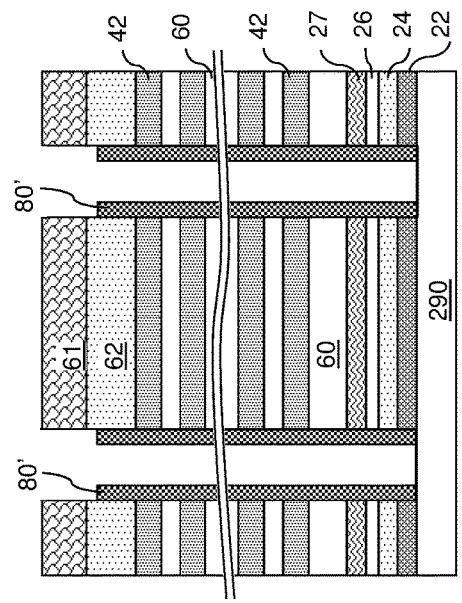
FIG. 10B is a vertical cross-sectional view along the plane B-B' of the exemplary structure of FIG. 10A according to an embodiment of the present disclosure.
Figure 10C:
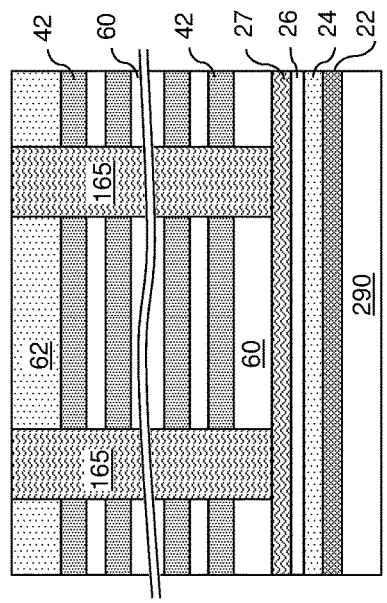
FIG. 10C is a vertical cross-sectional view along the plane C-C' of the exemplary structure of FIG. 10A according to an embodiment of the present disclosure.
Figure 10D:
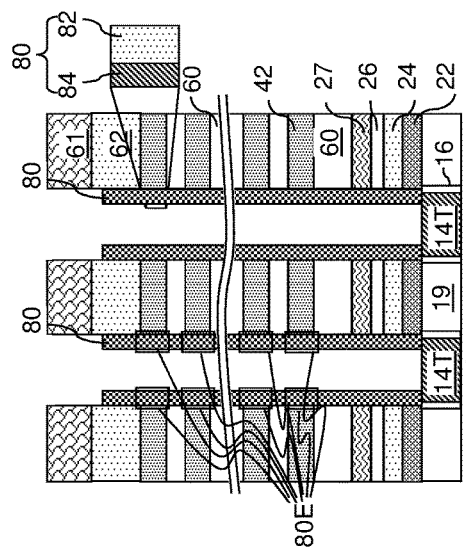
FIG. 10D is a vertical cross-sectional view along the plane D-D' of the exemplary structure of FIG. 10A according to an embodiment of the present disclosure.
Figure 10E:
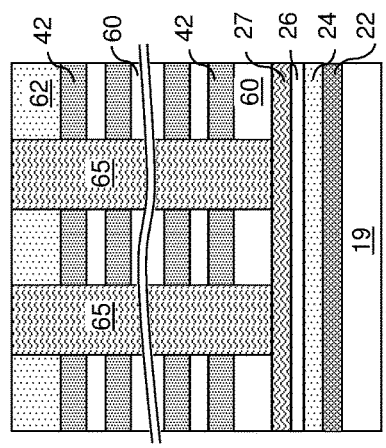
FIG. 10E is a vertical cross-sectional view along the plane E-E' of the exemplary structure of FIG. 10A according to an embodiment of the present disclosure.
Figure 11A:
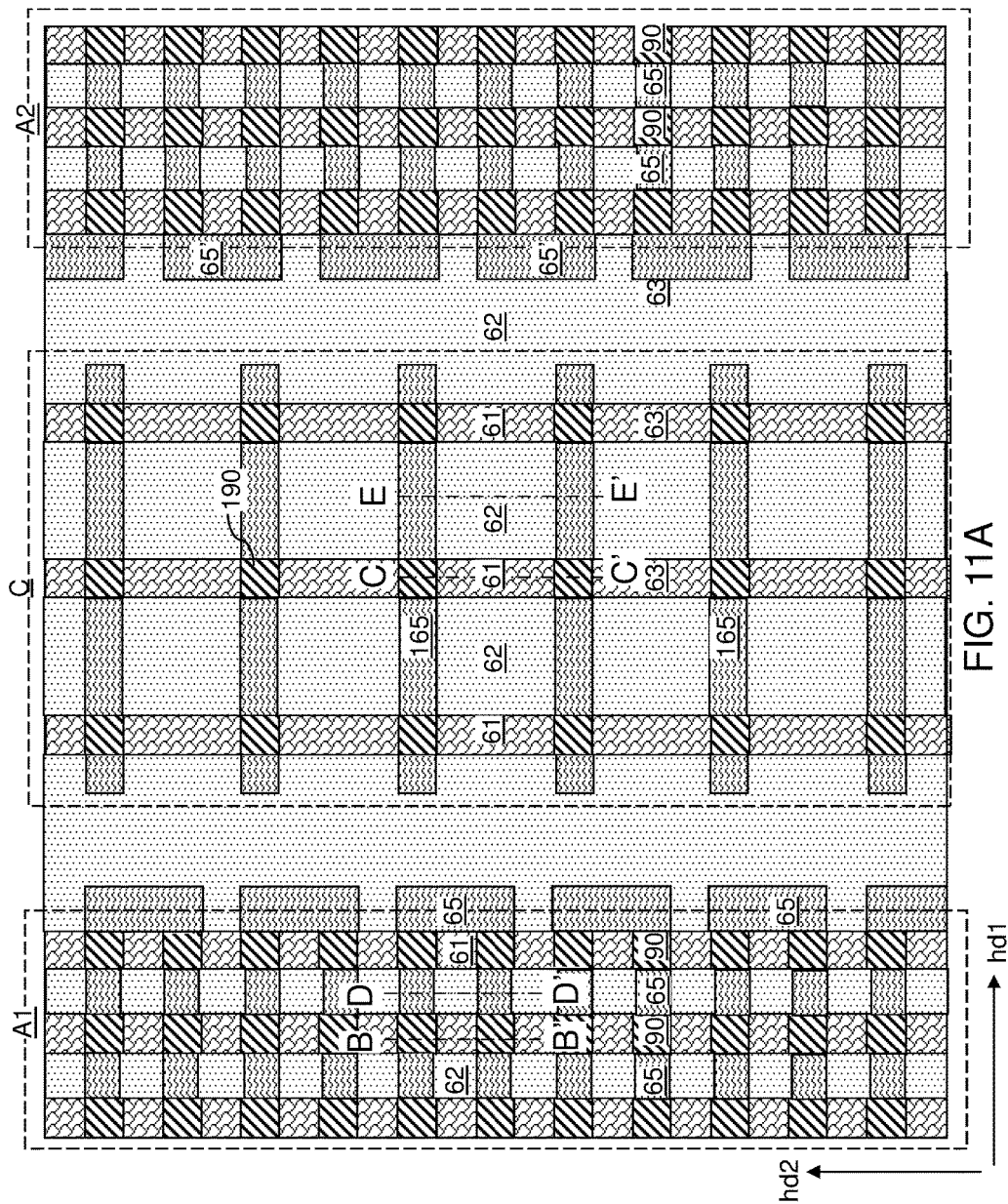
FIG. 11A is a top-down view of an area of the exemplary structure after formation of vertical bit lines and conductive fill structures according to an embodiment of the present disclosure.
Figure 11B:
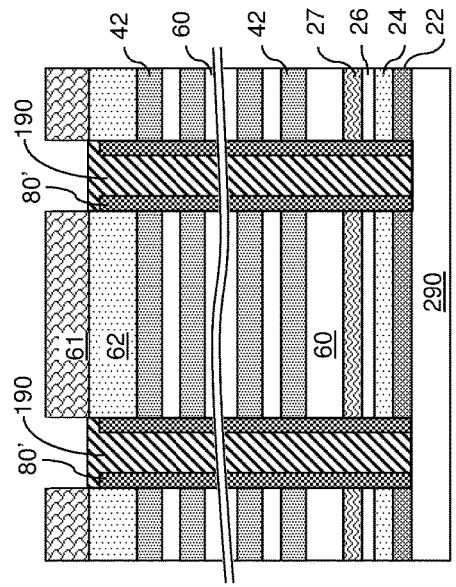
FIG. 11B is a vertical cross-sectional view along the plane B-B' of the exemplary structure of FIG. 11A according to an embodiment of the present disclosure.
Figure 11C:
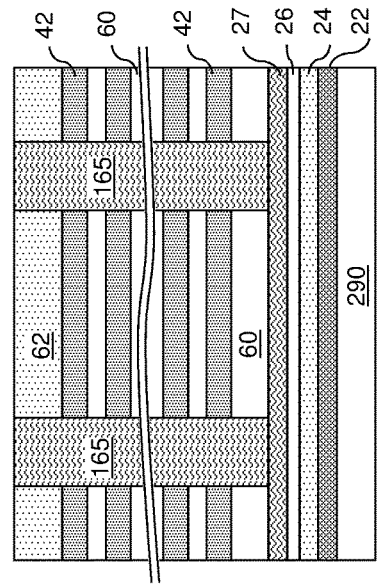
FIG. 11C is a vertical cross-sectional view along the plane C-C' of the exemplary structure of FIG. 11A according to an embodiment of the present disclosure.
Figure 11D:
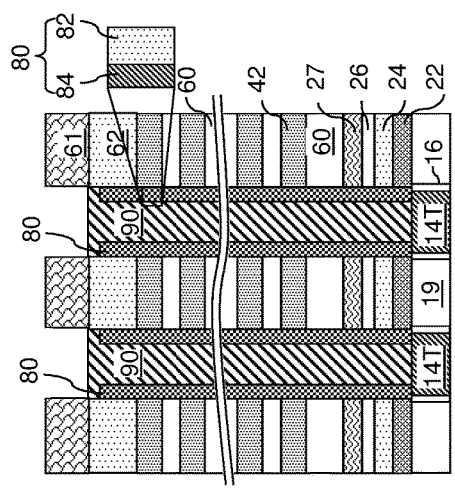
FIG. 11D is a vertical cross-sectional view along the plane D-D' of the exemplary structure of FIG. 11A according to an embodiment of the present disclosure.
Figure 11E:
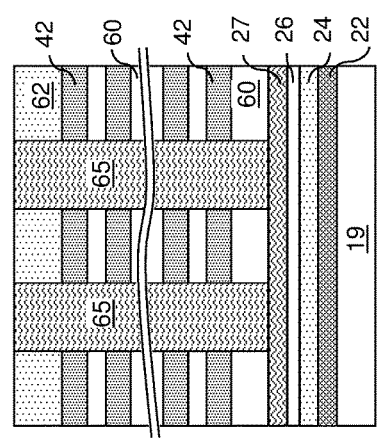
FIG. 11E is a vertical cross-sectional view along the plane E-E' of the exemplary structure of FIG. 11A according to an embodiment of the present disclosure.
Figure 12A:
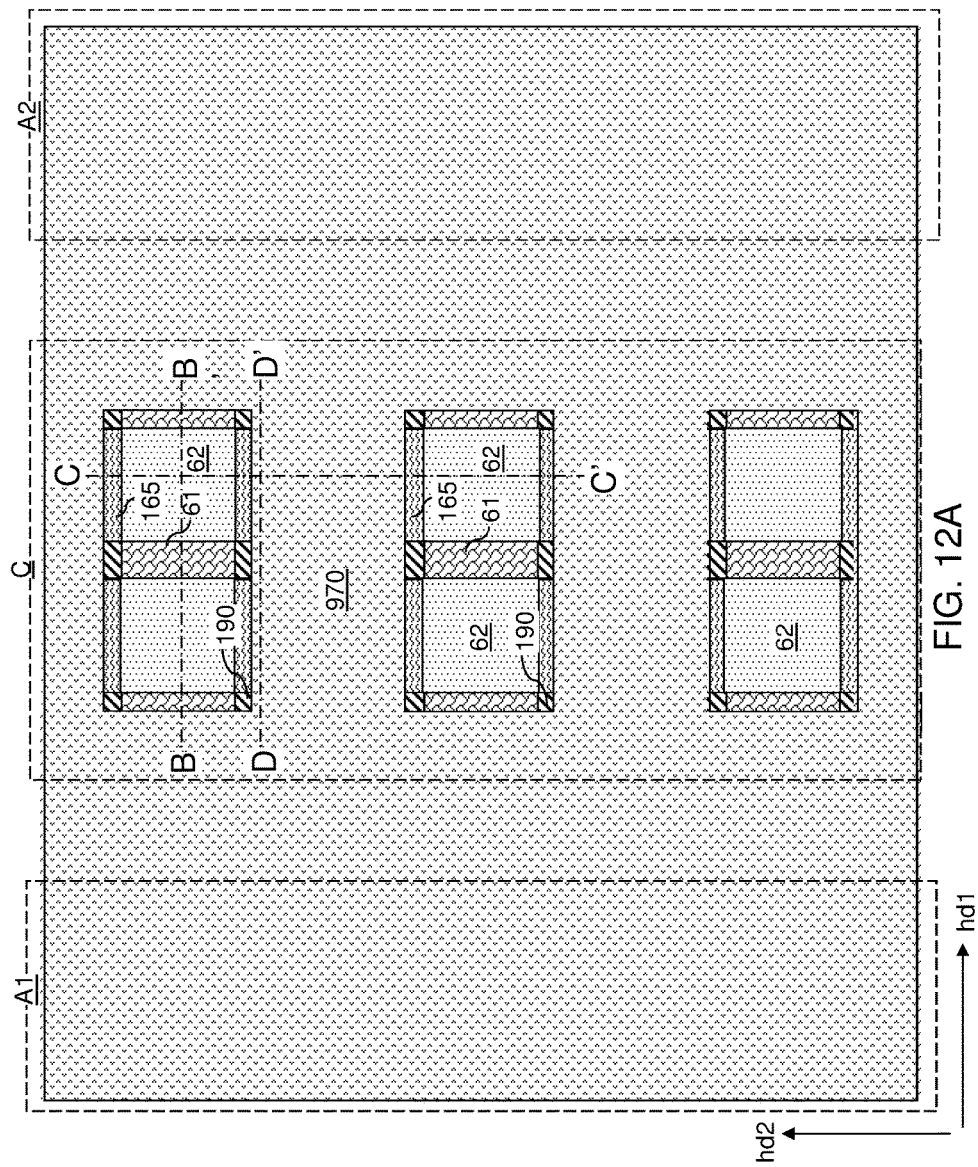
FIG. 12A is a top-down view of an area of the exemplary structure after application and patterning of a first photoresist layer for contact formation according to an embodiment of the present disclosure.
Figure 12B:
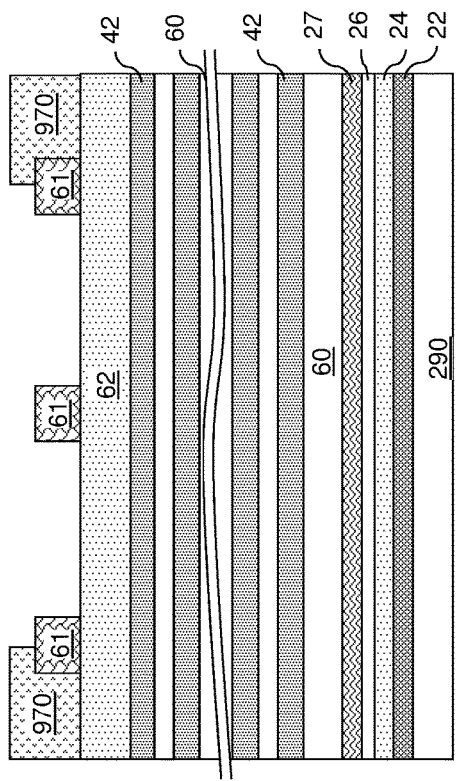
FIG. 12B is a vertical cross-sectional view along the plane B-B' of the exemplary structure of FIG. 12A according to an embodiment of the present disclosure.
Figure 12C:
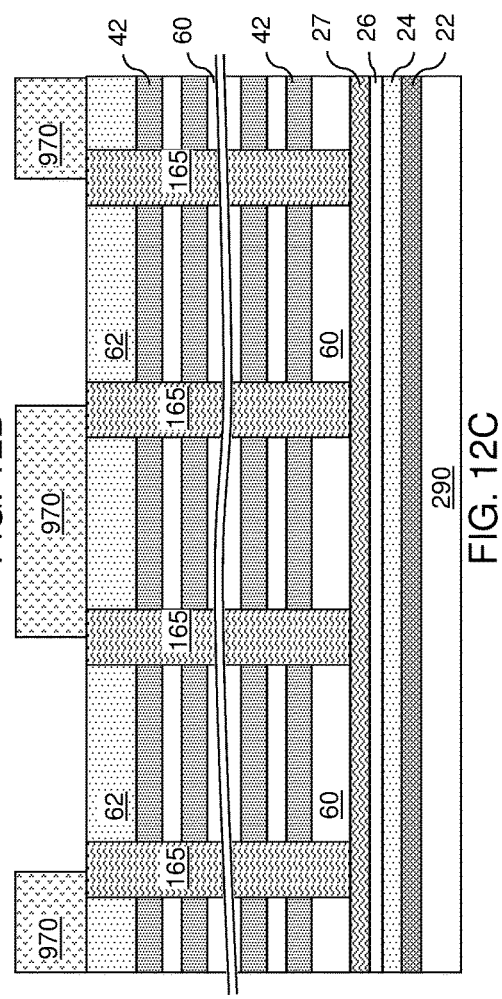
FIG. 12C is a vertical cross-sectional view along the plane C-C' of the exemplary structure of FIG. 12A according to an embodiment of the present disclosure.
Figure 12D:
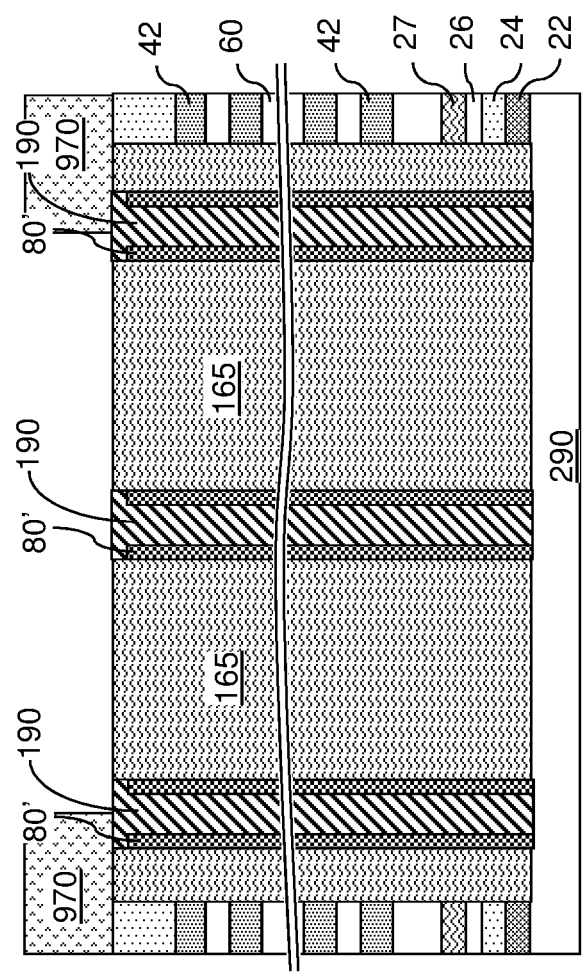
FIG. 12D is a vertical cross-sectional view along the plane D-D' of the exemplary structure of FIG. 12A according to an embodiment of the present disclosure.
Figure 13D:
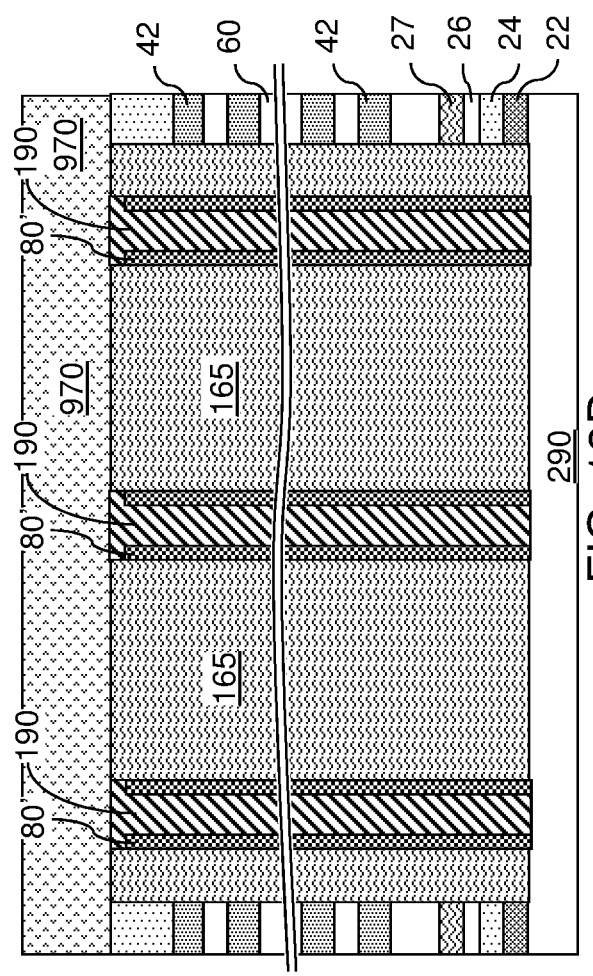
FIG. 13D is a vertical cross-sectional view along the plane D-D' of the exemplary structure of FIG. 13A according to an embodiment of the present disclosure.

FIGS. 2A-2C illustrate an array region of the exemplary structure during manufacture. Specifically, FIGS. 2A-2C correspond to a processing step after formation of access transistors, various liners (22, 24, 26, 27), an alternating stack of insulating layers 60 and sacrificial material layers 42, an insulating cap layer 62, a first hard mask layer 61, and a planarization stopping layer 64. The illustrated area of FIGS. 2A-2C may be, for example, one of the first array region A1 and the second array region A2.

After formation of various lower level metal interconnect structures (160, 170) at various levels of the lower interconnect level dielectric material layers 180, global bit lines 10 can be formed as a subset of the lower interconnect level line structures 170 within an upper portion of the lower interconnect level dielectric material layers 180. The global bit lines 10 are parallel electrically conductive lines that are laterally spaced apart in a first horizontal direction, and extending in a second horizontal direction. The global bit lines 10 can be formed, for example, by depositing at least one conductive material layer, and patterning the at least one conductive material layer employing a combination of lithographic methods and an anisotropic etch. The at least one conductive material layer can include, for example, at least one elemental metal (such as W, Co, Cu, and Al), a conductive doped semiconductor material, an intermetallic alloy including at least two elemental metals, a conductive metallic nitride, or a conductive metallic carbide. For example, the at least one conductive material layer can include a metallic barrier layer (such as a layer of TiN, TaN, or WN) and a metal layer (such as a layer of W, Ti, Ta, Cu, Al, or an alloy thereof). The space between the global bit lines 10 can be filled with a dielectric material (such as silicon oxide), which may be an uppermost layer of the lower interconnect level dielectric material layers 180. The dielectric material can be subsequently planarized to remove excess portions from above a horizontal plane including the top surfaces of the global bit lines 10 to form separator dielectric material portions, which are portions of the lower interconnect level dielectric material layers 180. A one-dimensional array of the global bit lines 10 can extend along the first horizontal direction with a periodicity that is equal to the sum of the width of a global bit line 10 and the width of a separator dielectric material portion. Alternatively, the one-dimensional array of the global bit lines 10 can be formed within trenches of an uppermost layer of the lower interconnect level dielectric material layers 180 by filling the trenches with at least one conductive material.

A two-dimensional array of select devices can be formed on the global bit lines 10 such that multiple select devices are formed on each global bit line 10. In one embodiment, the select devices can be transistor such as vertical thin film transistors employing a polycrystalline semiconductor channel. Examples of suitable transistors for the select devices are described, for example, in U.S. patent application Ser. No. 14/206,196, filed Mar. 12, 2014, which is incorporated by reference herein in its entirety. In case the select devices are field effect transistors, the select transistors are herein referred to access transistors.

Bit line access transistors are subsequently formed on global bit line 10. Each access transistor can be a vertical field effect transistor, and can include a bottom active region 14B (which can be a source region or a drain region), a semiconductor channel 14C, and a top active region 14T (which can be a drain region if the underlying bottom active region 14B is a source region, and a source region if the underlying bottom active region 14C is a drain region). As used herein, an "active region" refers to a source region or a drain region.

The bit line access transistors can be formed by forming a semiconductor layer stack 14 including a first doped semiconductor layer for forming the bottom active regions 14B, a semiconductor channel material layer for forming the semiconductor channels 14C, and a second doped semiconductor layer for forming the top active regions 14T, which has a same type of doping as the first semiconductor layer. The semiconductor layer stack 14 is patterned employing a combination of lithographic methods and an anisotropic etch such that each patterned portion of the semiconductor layer stack 14 overlies an area of a respective global bit line 10 and is laterally spaced from one another by trenches extending along the second horizontal direction. Subsequently, a dielectric material (such as silicon nitride and/or silicon oxide) is deposited in the trenches and planarized to remove the dielectric material from above rails of the semiconductor layer stack 14 that extend along the second horizontal direction. The remaining portions of the semiconductor layer stack 14 and the planarized dielectric material portions constitute alternating rail structures in which rails of semiconductor layer stack 14 and rails of the planarized dielectric material extend along the second horizontal direction and alternate along the first horizontal direction.

The remaining portions of the semiconductor layer stack 14 and the planarized dielectric material portions are patterned to form trenches that extend along the first horizontal direction. Each patterned portion of the semiconductor layer stack 14 includes a vertical stack of a bottom active region 14B, a semiconductor channel 14C, and a top active region 14T. Each patterned portion of the dielectric material constitutes a dielectric pillar structure 17, which can be located between a pair of vertical stacks of a bottom active region 14B, a semiconductor channel 14C, and a top active region 14T that are spaced from each other along the first horizontal direction. Each alternating sequence of dielectric pillar structures 17 and vertical stacks of a bottom active region 14B, a semiconductor channel 14C, and a top active region 14T that extend along the first horizontal direction forms a composite rail structure (14B, 14C, 14T, 17). The composite rail structures (14B, 14C, 14T, 17) are laterally spaced from one another along the second horizontal direction. Top surfaces of the global bit lines 10 and the separator dielectric portions 12 can be physically exposed at the bottom of each trench that laterally extends along the first horizontal direction.

A spacer dielectric layer 13 can be formed at the bottom the trenches by depositing a self-planarizing dielectric material (such as spin-on glass) or by filling the trenches with a dielectric material (such as organosilicate glass), planarizing the deposited dielectric material, and recessing the dielectric material selective to the dielectric pillar structures 17 and the vertical stacks of the bottom active regions 14B, the semiconductor channels 14C, and the top active regions 14T. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. Each spacer dielectric layer 13 can be formed over of the global bit lines 10 and the lower interconnect level dielectric material layers 180 such that the top surface of the spacer dielectric layer 13 is located at a target height for placing a bottom edge of gate electrodes 18 to be subsequently formed. For example, the top surface of the spacer dielectric layer 13 can be at a level about the interface between the remaining portions of the first conductivity type semiconductor layer and the channel material layer.

The gate dielectrics 16 and the gate electrodes 18 of the access transistors can be subsequently formed, for example, by depositing a conformal gate dielectric layer (e.g., silicon oxide) and a conformal conductive material layer (e.g., heavily or degenerately doped polysilicon) in the trenches that separate the one-dimensional array of rail structures, and by anisotropically etching the conformal conductive material layer. The remaining vertical portions of the conformal conductive material layer constitute the gate electrodes 18, which extend along the first horizontal direction. Each remaining portion of the conformal gate dielectric layer constitutes a gate dielectric 16. Each gate electrode 18 is laterally spaced from an adjacent rail structure by a vertical portion of a gate dielectric 16.

Remaining volumes of the trenches are filled with at least one dielectric material. Excess portions of the at least one dielectric material can be removed from above the horizontal plane including the top surfaces of the rail structures (which include contiguous portions of the semiconductor layer stack 14 and the dielectric pillar structures 17 that are present between a pair of trenches) by a planarization process, which can employ, for example, chemical mechanical planarization. Each remaining portion of the deposited dielectric material in the trenches constitutes an access transistor level dielectric rail 19.

Each access transistor level dielectric rail 19 extends along the first horizontal direction parallel to the composite rail structures (14B, 14C, 14T, 17). Each composite rail structure (14B, 14C, 14T, 17) includes remaining portions of the semiconductor layer stack 14 and the dielectric pillar structures 17 between a neighboring pair of access transistor level dielectric rails 19. Each access transistor level dielectric rail 19 can have a substantially vertical bottom portion, or can have a tapered bottom portion in which the width of the access transistor level dielectric rail 19 monotonically or strictly increases as a function of a vertical distance from the substrate 6. In one embodiment, each access transistor level dielectric rail 19 can include at least one dielectric material such as silicon nitride and/or silicon oxide. The access transistor level dielectric rails 19 and the composite rail structures (14T, 14C, 14B, 27) alternate along the second horizontal direction.

At least one liner layer (22, 24, 26, 27) may be optionally formed over the access transistor level dielectric rails 19 and the composite rail structures (14T, 14C, 14B, 27). The least one liner layer (22, 24, 26, 27), if present, includes at least one material layer that can function as an etch stop layer. In a non-limiting illustrative example, the at least one liner layer (22, 24, 26, 27) can include a silicon nitride liner 22, a first silicon oxide liner 24, a second silicon oxide liner 26, and a semiconductor material liner 27. Each of the layers in the at least one liner layer (22, 24, 26, 27), and may have a thickness in a range from 3 nm to 60 nm, although lesser and greater thicknesses can also be employed. The semiconductor material liner 27 can include a semiconductor material such as amorphous silicon or polysilicon.

An alternating stack (60, 42) of insulating layers 60 and sacrificial material layers 42 can be formed over the at least one liner layer (22, 24, 26, 27). The insulating layers 60 can include, for example, silicon oxide. The sacrificial material layers 42 can include, for example, silicon nitride. The thickness of each insulating layer 60 may be in a range from 10 nm to 60 nm, although lesser and greater thicknesses can also be employed. The thickness of each sacrificial material layer 42 can be in a range from 10 nm to 60 nm, although lesser and greater thicknesses can also be employed. In one embodiment, the insulating layers 60 can have the same thickness, which is herein referred to as a first thickness. In one embodiment, the sacrificial material layers 42 can have the same thickness, which is herein referred to as a second thickness. The number of repetitions of a pair of an insulating layer 60 and a sacrificial material layer 42 within the alternating stack (60, 42) can be in a range from 4 to 1,024, although lesser and greater number of repetition can also be employed.

An insulating cap layer 62 can be formed over the alternating stack (60, 42). The insulating cap layer 62 can have the same composition as the insulating layers 60, and may have a thickness that is greater than the thickness of each insulating layer 60. The insulating cap layer 62 can have a thickness in a range from 100 nm to 400 nm, although lesser and greater thicknesses can also be employed.

A first hard mask layer 61 can be deposited over the insulating cap layer 62. The first hard mask layer 61 includes a material that can be employed as a hard mask for etching the materials of the insulating layers 60 and the sacrificial material layers 42. For example, the first hard mask layer 61 can include amorphous silicon or polysilicon. The thickness of the first hard mask layer 61 can be in a range from 60 nm to 300 nm, although lesser and greater thicknesses can also be employed.

A planarization stopping layer 64 can be deposited over the first hard mask layer 61. The planarization stopping layer 64 includes a material that can be employed as a stopping layer during chemical mechanical planarization. For example, the planarization stopping layer 64 can include silicon nitride. The thickness of the planarization stopping layer 64 can be in a range from 30 nm to 200 nm, although lesser and greater thicknesses can also be employed.

Referring to FIGS. 3A-3D, a photoresist layer is applied over the planarization stopping layer, and is lithographically patterned to form line openings therein. The pattern of the line openings in the photoresist layer can be transferred through the planarization stopping layer 64, the first hard mask layer 61, the insulating cap layer 62, and the alternating stack (60, 42) by at least one anisotropic etch process. The semiconductor material liner 27 can be employed as an etch stop layer for the last anisotropic etch process.

At least one pair of line trenches 169 laterally extending along a first horizontal direction hd1 can be formed through the alternating stack (60, 42) in the contact region C. The line trenches 169 can be laterally spaced among one another along a second horizontal direction hd2, which is perpendicular to the first horizontal direction. Separation trenches 69 laterally extending along the first horizontal direction hd1 can be formed through the alternating stack (60, 42) in each of the array regions (A1, A2). The separation trenches 69 and the line trenches 169 can be formed by a same anisotropic etch process. The separation trenches 69 laterally separate different fingers of the alternating stack (60, 42). Upon replacement of the sacrificial material layers 42 with electrically conductive layers in a subsequent processing step, the separation trenches 69 provide lateral separation among word lines located at the same level, which are different portions of the electrically conductive layers that are formed at the same level.

An array region (A1 or A2) can be located between a respective pair of contact regions C. In this case, the separation trenches 69 in the array region (A1 or A2) can be in a serpentine configuration, and remaining patterned portions of the planarization stopping layer 64, the first hard mask layer 61, the insulating cap layer 62, and the alternating stack (60, 42) can have multiple fingers having a respective uniform width and laterally extending along the first horizontal direction hd1. Each of the multiple fingers of the alternating stack (60, 42) can have a respective uniform width, can extending along the same horizontal direction (such as the first horizontal direction hd1), and can be parallel among one another.

Referring to FIGS. 4A-4D, sacrificial wall structures (67, 68R, 168R) can be formed in the separation trenches 69 and the line trenches 169. For example, a sacrificial liner 67 can be formed within each of the separation trenches 69 and the line trenches 169 by conformal deposition of a sacrificial liner material, which may include silicon nitride. The thickness of the sacrificial liner 67 can be in a range from 1 nm to 6 nm, although lesser and greater thicknesses can also be employed. A sacrificial fill material can be deposited in remaining volumes of the separation trenches 69 and the line trenches 169. The sacrificial fill material can be a material that can be removed selective to the materials of the insulating cap layer 62 and the first hard mask layer 61 by an anisotropic etch. For example, the sacrificial fill material can include a flowable oxide material. The flowable dielectric material may also be deposited using flowable chemical vapor deposition (FCVD). The flowable dielectric material deposited by flowable chemical vapor deposition (FCVD) may be a substantially carbon free silicon oxide material including a high atomic percentage of hydrogen. Such a flowable silicon oxide material is rich in hydrogen, and the atomic concentration of hydrogen in a flowable silicon oxide material may be in a range from 1% to 15%, although lesser and greater atomic percentages may also be employed. Flowable chemical vapor deposition (FCVD) provides for a liquid-like film that flows freely into trench like geometries to provide a bottom up, void-free and seam-free fill. Flowable chemical vapor deposition can fill gaps having aspect ratios of up to 30:1. One example, of a flowable chemical vapor deposition process is available from Applied Materials, Inc.™ under the trade name Eterna® FCVD system. A flowable oxide can be etched by an anisotropic etch process selective to silicon oxide deposited by thermal or plasma decomposition of tetraethylorthosilicate (TEOS) with a selectivity greater than 30. In one embodiment, the selectivity of flowable oxide to TEOS oxide may be greater than 100.

The sacrificial fill material and the sacrificial liner 67 can be planarized by a planarization process employing the planarization stopping layer 64 as a stopping layer. For example, chemical mechanical planarization (CMP) can be employed to remove portions of the sacrificial fill material and the sacrificial liner 67 from above the top surface of the planarization stopping layer 64. A recess etch may be performed to recess top surfaces of the sacrificial fill material and remaining portions of the sacrificial liner 67 to a level of the top surface of the first hard mask layer 61. The planarization stopping layer 64 can be removed selective to the first hard mask layer 61, for example, by a wet etch. Each remaining portion of the sacrificial fill material within the separation trenches 69 is herein referred to as an array sacrificial fill portion 68R. Each remaining portion of the sacrificial fill material within the line trenches 169 is herein referred to as a contact sacrificial fill portion 168R.

Each of the separation trenches 69 is filled with an array sacrificial wall structure (67, 68R), which can include an optional sacrificial liner 67 and an array sacrificial fill portion 68R. Each of the line trenches 169 is filled with a contact sacrificial wall structure (67, 168R), which can include an optional sacrificial liner 67 and a contact sacrificial fill portion 168R. The array sacrificial wall structures (67, 68R) and the contact sacrificial wall structures (67, 168R) can vertically extend through the first hard mask layer 61, the insulating cap layer 62, and each layer within the alternating stack (60, 42).

Referring to FIGS. 5A-5E, a second hard mask layer 63 can be deposited over the first hard mask layer 61, the array sacrificial wall structures (67, 68R), and the contact sacrificial wall structures (67, 168R). The second hard mask layer 63 includes a material that can be employed as an etch mask for etching the materials of the insulating layers 60 and the sacrificial material layers 42. The second hard mask layer 63 may include the same material as the first hard mask layer 61, or may include a different material from the first hard mask layer 61. For example, the second hard mask layer 63 can include amorphous silicon or polysilicon. The thickness of the second hard mask layer 63 can be in a range from 60 nm to 300 nm, although lesser and greater thicknesses can also be employed.

A photoresist layer 77 can be applied over the second hard mask layer 63, and can be lithographically patterned to form strip shapes that extend perpendicular to the lengthwise direction of the array sacrificial wall structures (67, 68R), and perpendicular to the lengthwise direction of the contact sacrificial wall structures (67, 168R). For example, if the array sacrificial wall structures (67, 68R) and the contact sacrificial wall structures (67, 168R) laterally extend along the first horizontal direction hd1, the patterned photoresist layer 77 can laterally extend along the second horizontal direction hd2, which is perpendicular to the first horizontal direction hd1.

The pattern in the patterned photoresist layer 77 can be transferred into the second hard mask layer, for example, by an anisotropic etch. The second hard mask layer 63 can be patterned into strip shapes. In one embodiment, the patterned second hard mask layer 63 can be in multiple discrete portions that straddle the separation trenches and the line trenches and the material portions therein, i.e., the array sacrificial wall structures (67, 68R) and the contact sacrificial wall structures (67, 168R). In one embodiment, the areas of the patterned second hard mask layer 63 can be selected such that the overlap areas between the patterned second hard mask layer 63 and the array sacrificial wall structures (67, 68R) correspond to areas in which resistive memory pillars are to be subsequently formed. Further, the areas of the patterned second hard mask layer 63 can be selected such that the overlap areas between the patterned second hard mask layer 63 and the contact sacrificial wall structures (67, 168R) correspond to areas in which support pillars are to be subsequently formed. The photoresist layer 77 can be subsequently removed, for example, by ashing.

Referring to FIGS. 6A-6E, portions of the array sacrificial wall structures (67, 68R) and the contact sacrificial wall structures (67, 168R) that are not masked by the combination of the first hard mask layer 61 and the second hard mask layer 63 are etched by an anisotropic etch process. Each unmasked portion of the array sacrificial fill portions 68R and the contact sacrificial fill portion 168R can be removed by an anisotropic etch. In case sacrificial liners 67 are present, an isotropic etch such as a wet etch may be performed to remove portions of the sacrificial liners 67 after the anisotropic etch process. Sacrificial pillar cavities 66 are formed in volumes from which unmasked portions of the array sacrificial wall structures (67, 68R) are removed. Sacrificial template cavities 166 are formed in volumes from which unmasked portions of the contact sacrificial wall structures (67, 168R) are removed.

In one embodiment, a subset of the sacrificial pillar cavities 66 can have a rectangular horizontal cross-sectional shape. In one embodiment, each sacrificial template cavity 166 can have a rectangular horizontal cross-sectional shape. Each remaining portion of the array sacrificial wall structures (67, 68R) constitutes an array sacrificial spacer structure (67, 68), and includes an array sacrificial spacer portion 68 (which is a remaining portion of an array sacrificial fill portions 68R), and optionally includes a sacrificial liner 67. Each remaining portion of the contact sacrificial wall structures (67, 168R) constitutes a contact sacrificial spacer structure (67, 168), and includes a contact sacrificial spacer portion 168 (which is a remaining portion of a contact sacrificial fill portions 168R), and optionally includes a sacrificial liner 67.

Referring to FIGS. 7A-7E, a template material layer 65L is deposited in the sacrificial pillar cavities 66 and the sacrificial template cavities 166. The template material layer 65L includes a sacrificial material that can be employed as an etch mask for etching the materials of the insulating layers 60 and the sacrificial material layers 42, and can be subsequently removed selective to the materials of the insulating layers 60 and the sacrificial material layers 42. For example, the template material layer 65L can include polysilicon. Thus, portions of the sacrificial wall structures (67, 68R, 168R) that are not covered by the patterned second hard mask layer 63 are replaced with the material of the template material layer 65L, which is a sacrificial fill material.

Referring to FIGS. 8A-8E, the portions of the template material layer 65L and the second hard mask layer 63 that overlie a horizontal plane including the top surfaces of the array sacrificial spacer structures (67, 68) and the contact sacrificial spacer structures (67, 168) can be removed, for example, by chemical mechanical planarization. Each remaining portion of the template material layer 65L that fills a sacrificial pillar cavity 66 constitutes a sacrificial pillar structure 65. Each remaining portion of the template material layer 65L that fills a sacrificial template cavity 166 constitutes a sacrificial template structure 165. The sacrificial pillar structures 65 and the sacrificial template structures 165 include the sacrificial fill material of the template material layer 65L, which may be the same as, or different from, the material of the first hard mask layer 61. In one embodiment, the sacrificial pillar structures 65, the sacrificial template structures 165, and the first hard mask layer 61 include polysilicon.

Referring to FIGS. 9A-9E, pillar cavities (79, 179) can be formed by removing remaining portions of the sacrificial wall structures (67, 68R, 168R) selective to the sacrificial pillar structures 65, the sacrificial template structures 165, and the alternating stack (60, 42). Specifically, the materials of the array sacrificial spacer structures (67, 68) and the contact sacrificial spacer structures (67, 168) can be removed by an anisotropic etch selective to the materials of the first hard mask layer 61, the insulating cap layer 62, the sacrificial pillar structures 65, and the sacrificial template structures 165. For example, if the array sacrificial spacer portions 68 and the contact sacrificial spacer portions 168 include a flowable oxide material, an anisotropic etch process can be performed to remove the material of the array sacrificial spacer portions 68 and the contact sacrificial spacer portions 168. If sacrificial liners 67 are present, the sacrificial liners 67 can be removed by an isotropic etch such as a wet etch.

An array pillar cavity 79 is formed in each volume from which an array sacrificial spacer structure (67, 68) is removed. A contact pillar cavity 179 is formed in each volume from which a contact sacrificial spacer structure (67, 168) is removed. Another anisotropic etch process can be performed to remove underlying portions of the various liners (22, 24, 26, 27). Each of the array pillar cavities 79 and the contact pillar cavities 179 can be vertically extended through the various liners (22, 24, 26, 27) by the anisotropic etch process. The array pillar cavities 79 can be formed in areas that overlie the array of access transistors. Thus, a top active region 14T can be physically exposed at the bottom of each array pillar cavity 79 after the anisotropic etch process. A surface of a layer among the memory level dielectric material layers 290 can be physically exposed at the bottom of each contact pillar cavity 179.

Referring to FIGS. 10A-10E, a resistive memory element (e.g., resistive memory film) 80 can be formed within each one of the array pillar cavities 79, and a dummy resistive memory element (e.g., dummy resistive memory film) 80' can be formed within each one of the contact pillar cavities 179. The resistive memory films 80 and the dummy resistive memory films 80' can be formed simultaneously by a conformal depositing, and anisotropically etching, a resistive memory material layer 84 and an optional steering element layer 82.

Each resistive memory film 80 and each dummy resistive memory film 80' can include a resistive memory material layer 84, and may optionally include a steering element layer 82. As used herein, a "steering element" refers to an element that provides non-linear switching characteristics, i.e., a non-linear relationship between voltage applied thereacross and electrical current therethrough. In one embodiment, the steering element may have an asymmetric current-voltage characteristic (e.g., a diode which conducts current p lard y in one direction (asymmetric conductance) and which has a lower resistance to the flow of current in one direction, and a higher resistance in the other direction). Alternatively or additionally, the steering element may include a tunneling dielectric. As used herein, a "tunneling dielectric" refers to a dielectric material portion in which the predominant mode of electrical current conduction therethrough is charge carrier tunneling such as electron tunneling or hole tunneling. As used herein, a tunneling dielectric layer refers to a layer including at least one tunneling dielectric. As used herein, a "steering element layer" refers to a layer including at least one steering element.

The materials that can be employed for the resistive memory material layers 84 depend on the nature of the resist memory elements therein. In an illustrative example, the resistive memory element 80 may include a barrier modulated cell ("BMC") memory element including a barrier material (e.g., silicon, germanium, another semiconductor material, etc.) and a charge-modulated resistive memory material (e.g., a metal oxide, such as titanium oxide containing vacancies) for so-called storage class memory ("SCM"). The barrier material can be embodied as the steering element layer 82, and the charge-modulated resistive memory material can be embodied as the resistive memory material layer 84. As used herein, a "charge-modulated resistive memory material" refers to a resistive memory material that can have at least two different states of resistivity due to different states of charge distribution, which can be due to ion or vacancy modulation. Thus, the charge-modulated resistive memory materials of the present disclosure include vacancy modulated resistive memory materials that can change the distribution (e.g., location or concentration as function of location) of vacancies therein and ionic resistive memory materials that can change the distribution (e.g., location or concentration as function of location) of ions therein.

In another example, the resistive memory elements 80 may comprise filamentary memory elements. Application of the electrical voltage bias in one manner can cause decrease in the resistance of a dielectric resistive memory material layer 84, for example, by formation of filaments that function as leakage current paths through the layer 84. Application of a different type of electrical voltage bias can cause reversal of the resistance of the dielectric resistive memory material layer 84 to an original high-resistance state, such as by removal of the filaments from the layer 84. In another example, the resistive memory elements 80 may comprise phase change memory elements. Application of the electrical voltage bias in one manner can cause decrease in the resistance of a resistive memory material layer 84, for example, by increasing a crystallinity of the layer 84 (e.g., a chalcogenide material layer). Application of a different type of electrical voltage bias can cause reversal of the resistance of the layer 84 to an original high-resistance state, such as by decreasing the crystallinity of the layer 84.

The steering element layer 82 is optional. Thus, depending on the configuration of specific resistive random access memory, the steering element layer 82 may, or may not, be present. Generally speaking, steering elements known in the art can be optionally employed in conjunction with the resistive memory material layers 84 of the present disclosure. The steering element layers 82, if employed, can include at least one semiconductor element that provides a non-linear current-voltage characteristic. For example, the steering element layer can include at least one diode therein. In one embodiment, each diode can include a heavily doped n-doped semiconductor region (i.e., n+ region) having n-type dopants at an atomic concentration greater than $5.0 \times 10^{19}/cm^3$, and a lightly or lighter doped p-doped semiconductor region (i.e., p- or p region) including p-type dopants at an atomic concentration less than $5.0 \times 10^{19}/cm^3$. Alternatively, a heavily doped p-doped semiconductor region may be used instead. In one embodiment, the n-doped semiconductor regions can be embodied as discrete n-doped semiconductor material portions. In another embodiment, the n-doped semiconductor regions can be embodied as portions of a continuous n-doped semiconductor material layer. In one embodiment, each n-doped semiconductor region can be incorporated as a portion of a local bit line or electrode. In an alternative embodiment, a p-i-n diode, a Schottky diode or a metal-insulator-metal (MIM) non-linear device is used instead of a p-n diode.

Each portion of the resistive memory film 80 located at levels of the sacrificial material layers 42 constitutes resistive memory element 80E, in which information can be stored in the form of a high resistive state or a low resistive state of the respective portion of the resistive memory material layer 84. The total number of resistive memory elements 80E within each vertical stack of resistive memory elements 80E can be the same as the total number of sacrificial material layers 42, which can be the same as the total number of electrically conductive layers 30 to be subsequently formed. Each resistive memory film 80 includes vertically stacked resistive memory elements 80E. Thus, a two-dimensional array of vertically stacked resistive memory elements 80E is formed within a subset of volumes of the separation trenches 69 as formed at the processing steps of FIGS. 3A-3D. Therefore, the resistive memory elements 80E constitute a three-dimensional array.

The layer(s) of the restive memory films 80 can be deposited by a conformal deposition process such as chemical vapor deposition (CVD) or atomic layer deposition. The duration of the anisotropic etch can be selected such that a top surface of each resistive memory film 80 can be located on a respective sidewall of the insulating cap layer 62. Each resistive memory film 80 can be topologically homeomorphic to a torus. As used herein, an element is "topologically homeomorphic to a torus" if the element has a geometrical shape that can be continuously stretched to match a torus without creating or destroying a new hole. While the present disclosure is described employing an embodiment in which the steering element layer 82 is deposited prior to deposition of the resistive memory material layer 84, embodiments are expressly contemplated herein in which the resistive memory material layer 84 is deposited prior to deposition of the steering element layer 82.

A resistive memory film 80 is formed with each array pillar cavity 79 adjacent to the multiple fingers of the alternating stack (60, 42). The dummy resistive memory films 80' formed in the contact region C are not employed as resistive memory elements, and as such, are electrically inactive components. Thus, a dummy resistive memory film 80' is formed within each contact pillar cavity 179, which is formed within volumes of the line trenches 169 as formed at the processing steps of FIGS. 3A-3D.

Referring to FIGS. 11A-11E, at least one conductive material is deposited in each remaining volume of the array pillar cavities 79 and in each remaining volume of the contact pillar cavities 179. The at least one conductive material can include an elemental metal (e.g., tungsten, titanium, etc.), an intermetallic alloy, a conductive doped semiconductor material, and/or a conductive compound including at least one metal and at least one non-metal element such as a conductive metal nitride (e.g., TiN). Excess portions of the at least one conductive material can be removed from above the top surface of the first hard mask layer 61, for example, by a recess etch. The duration of the recess etch can be extended to further recess the at least one conductive material to a height that is approximately at the horizontal plane including the interface between the bottom surface of the first hard mask layer 61 and the insulating cap layer 62.

Each remaining portion of the at least one conductive material deposited in the array pillar cavities 79 constitutes a vertical bit line 90 (e.g., a local bit line) that is electrically shorted to the top active region 14T of an underlying access transistor. Each remaining portion of the at least one conductive material deposited in the contact pillar cavities 179 constitutes a conductive fill structures 190 (which is a dummy vertical bit line). The conductive fill structures 190 have the same material composition as the vertical bit lines 90, but are not electrically active. In one embodiment, the conductive fill structures 190 can be electrically floating. Thus, the deposited conductive material(s) within remaining volumes of the array pillar cavities 79 can form the vertical bit lines 90, which contact sidewalls of the resistive memory films 80. The deposited conductive material(s) within remaining volumes of the contact pillar cavities 179 can form dummy vertical bit lines, which contact sidewalls of the dummy resistive memory films 80'.

Subsequently, a series of photoresist layers can be applied and patterned to form respective openings over the exemplary structure. Each pattern of the openings can be transferred into respective subset of layers within the alternating stack (60, 42) employing a respective anisotropic etch process. During each anisotropic etch process, the first hard mask layer 61, the sacrificial template structures 165, and the conductive fill structures 190 can be employed as etch masks in addition to the respective photoresist layer. Connecting via cavities are formed between pairs of sacrificial template structures 165 by a series of lithographic photoresist patterning processes and anisotropic etch processes. A non-limiting exemplary sequence of processing steps is described in detail below.

Referring to FIGS. 12A-12D, a first photoresist layer 970 can be applied over the exemplary structure, and can be lithographically patterned to form openings in each region in which contact via structures for word lines are to be subsequently formed.

Referring to FIGS. 13A-13D, an anisotropic etch can be performed to etch through the insulating cap layer 62 within each opening in the first photoresist layer 970. In one embodiment, the first hard mask layer 61, the sacrificial template structures 165, and the conductive fill structures 190 can be employed as etch masks in addition to the first photoresist layer 970. Connecting via cavities 97 are formed between respective pairs of sacrificial template structures 165 within the areas of the opening in the first photoresist layer 970. Each connecting via cavity 97 laterally extends between a pair of sacrificial template structures 165. Thus, upon subsequent removal of the sacrificial template structures 165, each connecting via cavity 97 laterally connects volumes from which a pair of sacrificial template structures 165 is removed. The first photoresist layer 970 is subsequently removed, for example, by ashing.

Referring to FIGS. 14A-14C, a second photoresist layer 971 can be applied over the exemplary structure, and can be lithographically patterned to form openings in each region in which the connecting via cavities 97 are to be vertically extended by a pair of a sacrificial material layer 42 and an insulating layer 60. An anisotropic etch can be performed to etch through a sacrificial material layer 42 and an insulating layer 60 within each of the openings in the second photoresist layer 971. In one embodiment, the first hard mask layer 61, the sacrificial template structures 165, and the conductive fill structures 190 can be employed as etch masks in addition to the second photoresist layer 971. Connecting via cavities 97 are vertically extended through a sacrificial material layer 42 and an insulating layer 60 between respective pairs of sacrificial template structures 165 within each opening in the second photoresist layer 971. The second photoresist layer 971 is subsequently removed, for example, by ashing.

Figure 15A:
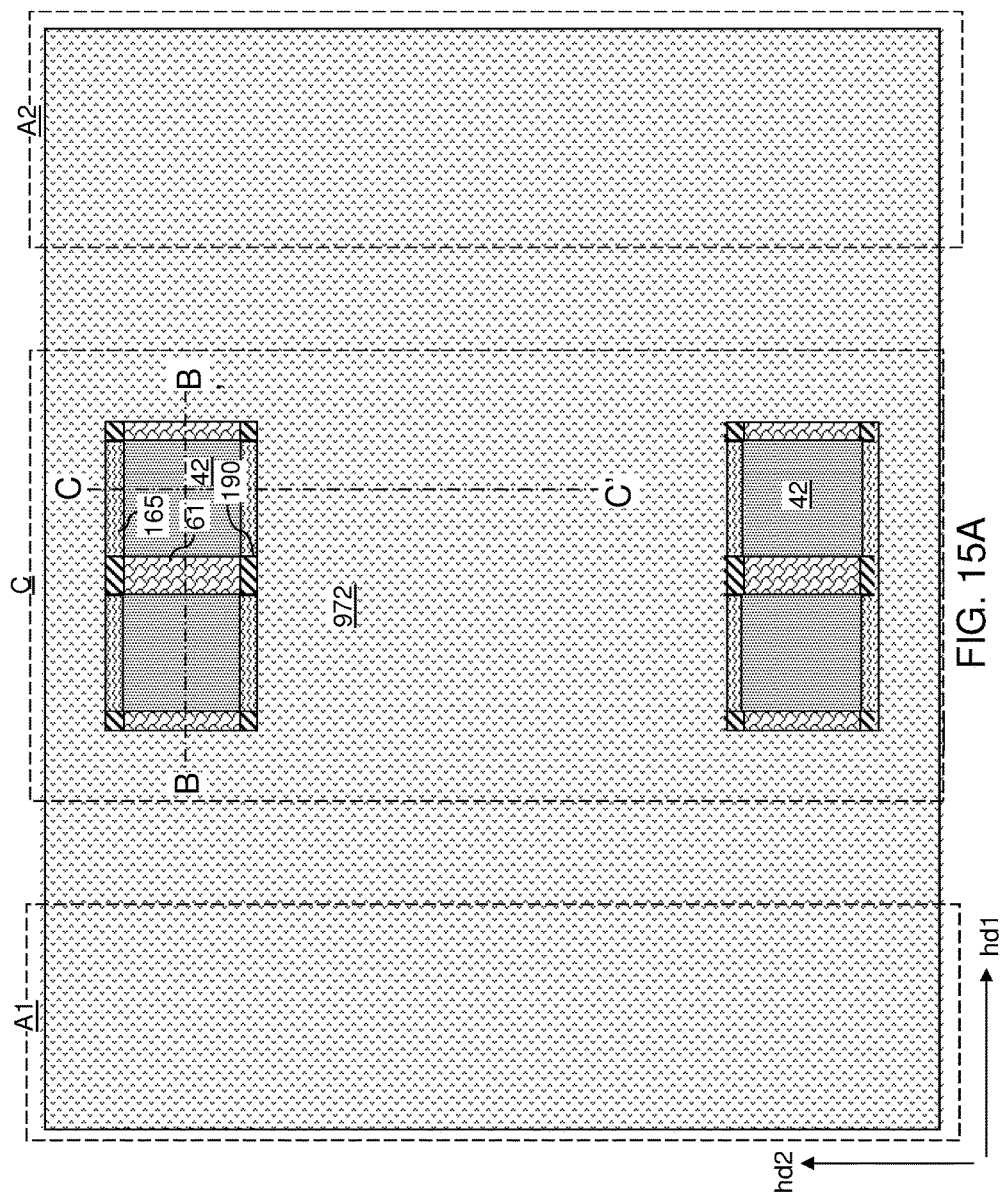
FIG. 15A is a top-down view of an area of the exemplary structure after performing a third contact etch process that etches two pairs of an insulating layer and a sacrificial material layer employing a third photoresist layer for contact formation according to an embodiment of the present disclosure.
Figure 15B:
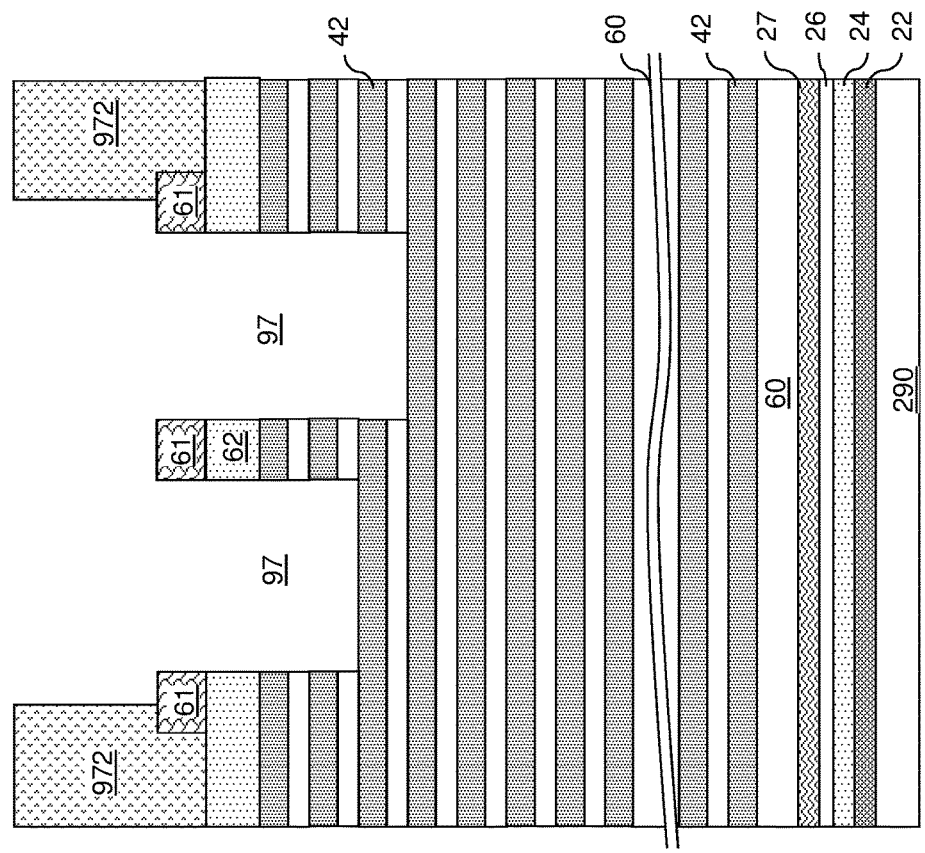
FIG. 15B is a vertical cross-sectional view along the plane B-B' of the exemplary structure of FIG. 15A according to an embodiment of the present disclosure.
Figure 15C:
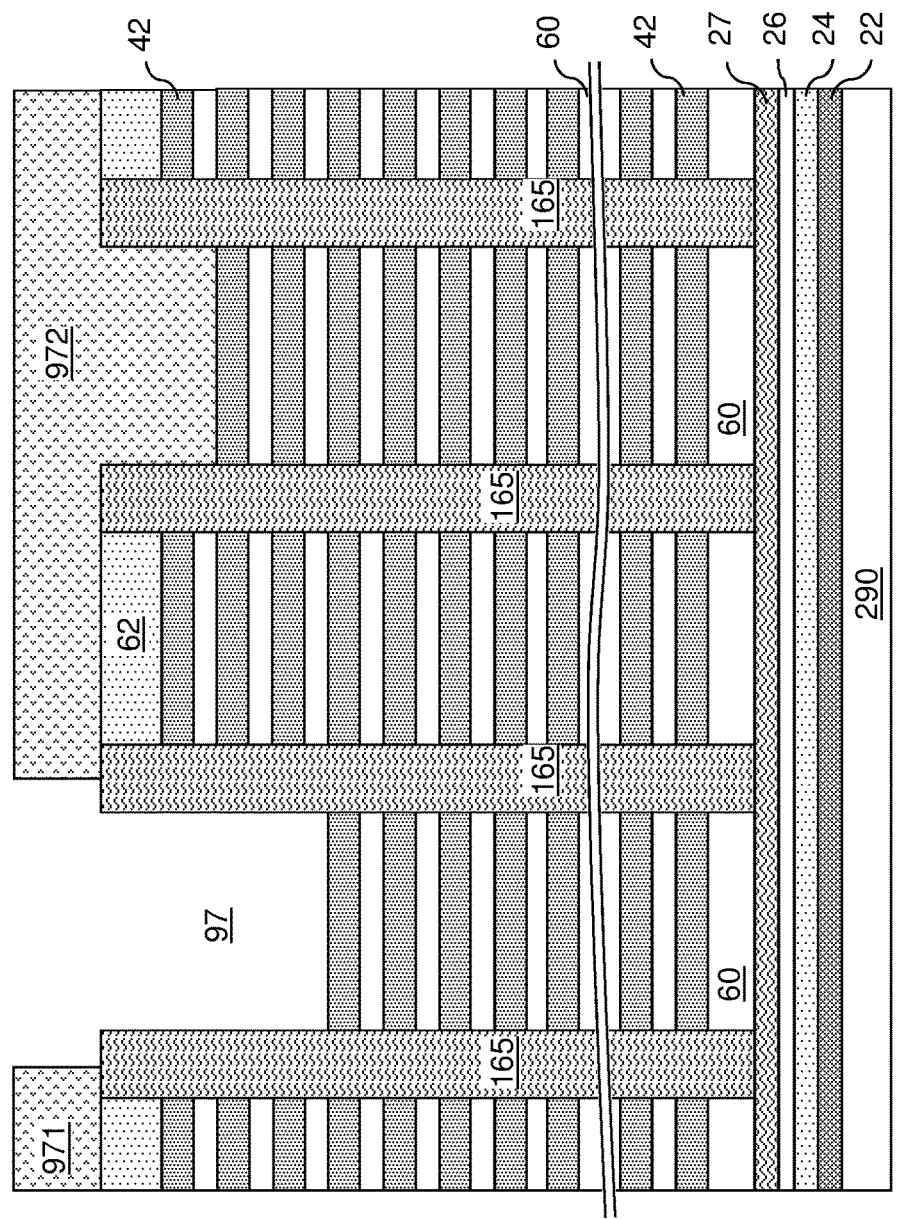
FIG. 15C is a vertical cross-sectional view along the plane C-C' of the exemplary structure of FIG. 15A according to an embodiment of the present disclosure.

Referring to FIGS. 15A-15C, a third photoresist layer 972 can be applied over the exemplary structure, and can be lithographically patterned to form openings in each region in which the connecting via cavities 97 are to be vertically extended by two pairs of a sacrificial material layer 42 and an insulating layer 60. An anisotropic etch can be performed to etch through two pairs of a sacrificial material layer 42 and an insulating layer 60 within each of the openings in the third photoresist layer 972. In one embodiment, the first hard mask layer 61, the sacrificial template structures 165, and the conductive fill structures 190 can be employed as etch masks in addition to the third photoresist layer 972. Connecting via cavities 97 are vertically extended through two pairs of a sacrificial material layer 42 and an insulating layer 60 between respective pairs of sacrificial template structures 165 within each opening in the third photoresist layer 972. The third photoresist layer 972 is subsequently removed, for example, by ashing.

Figure 16A:
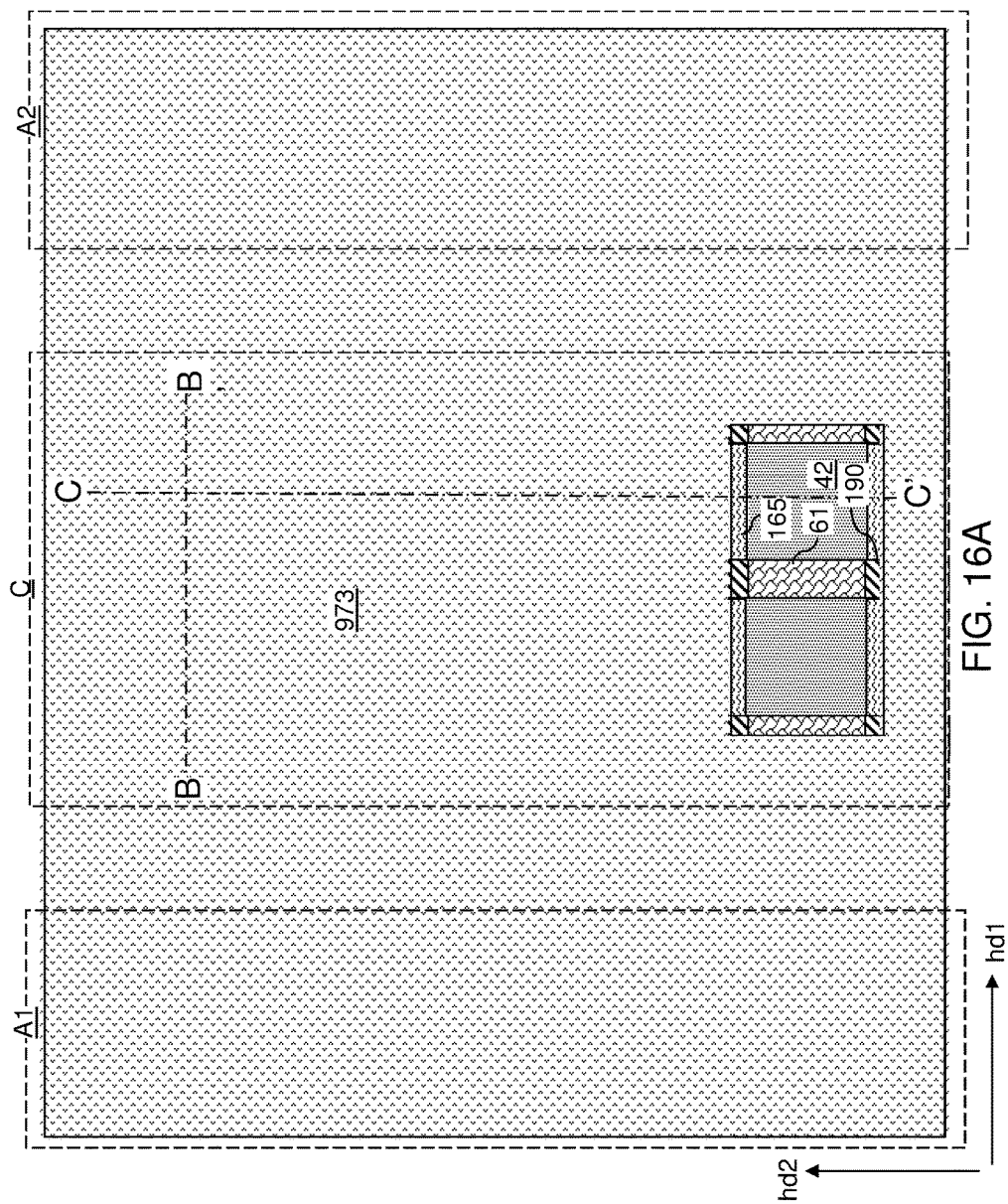
FIG. 16A is a top-down view of an area of the exemplary structure after performing a fourth contact etch process that etches four pairs of an insulating layer and a sacrificial material layer employing a fourth photoresist layer for contact formation according to an embodiment of the present disclosure.
Figure 16B:
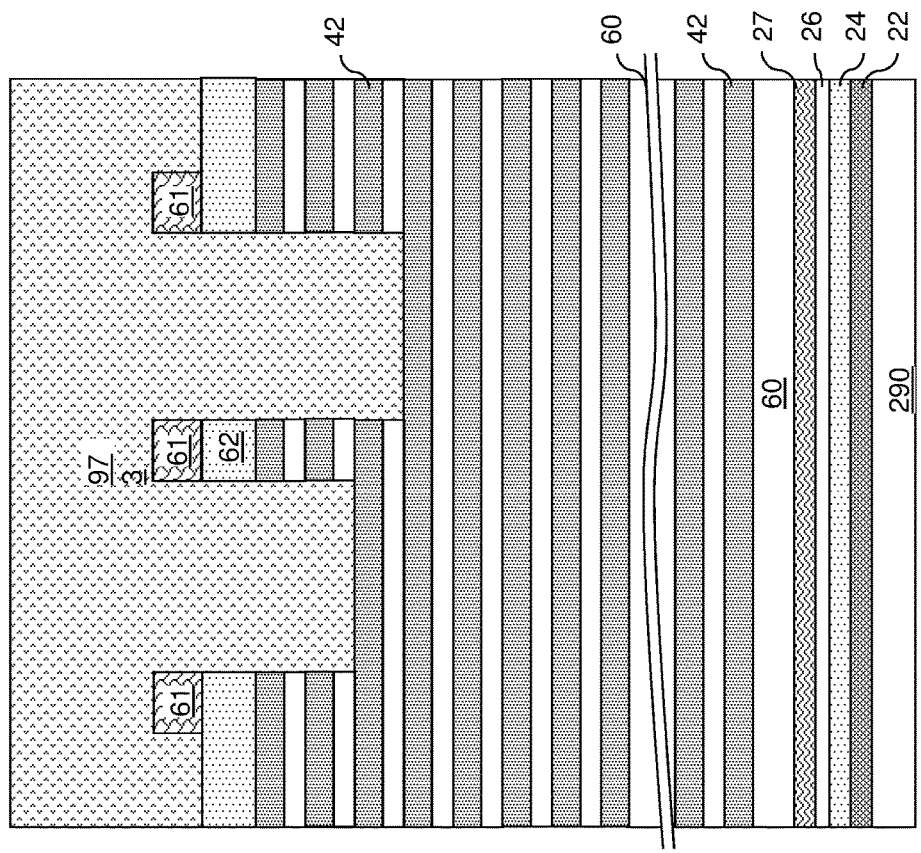
FIG. 16B is a vertical cross-sectional view along the plane B-B' of the exemplary structure of FIG. 16A according to an embodiment of the present disclosure.
Figure 16C:
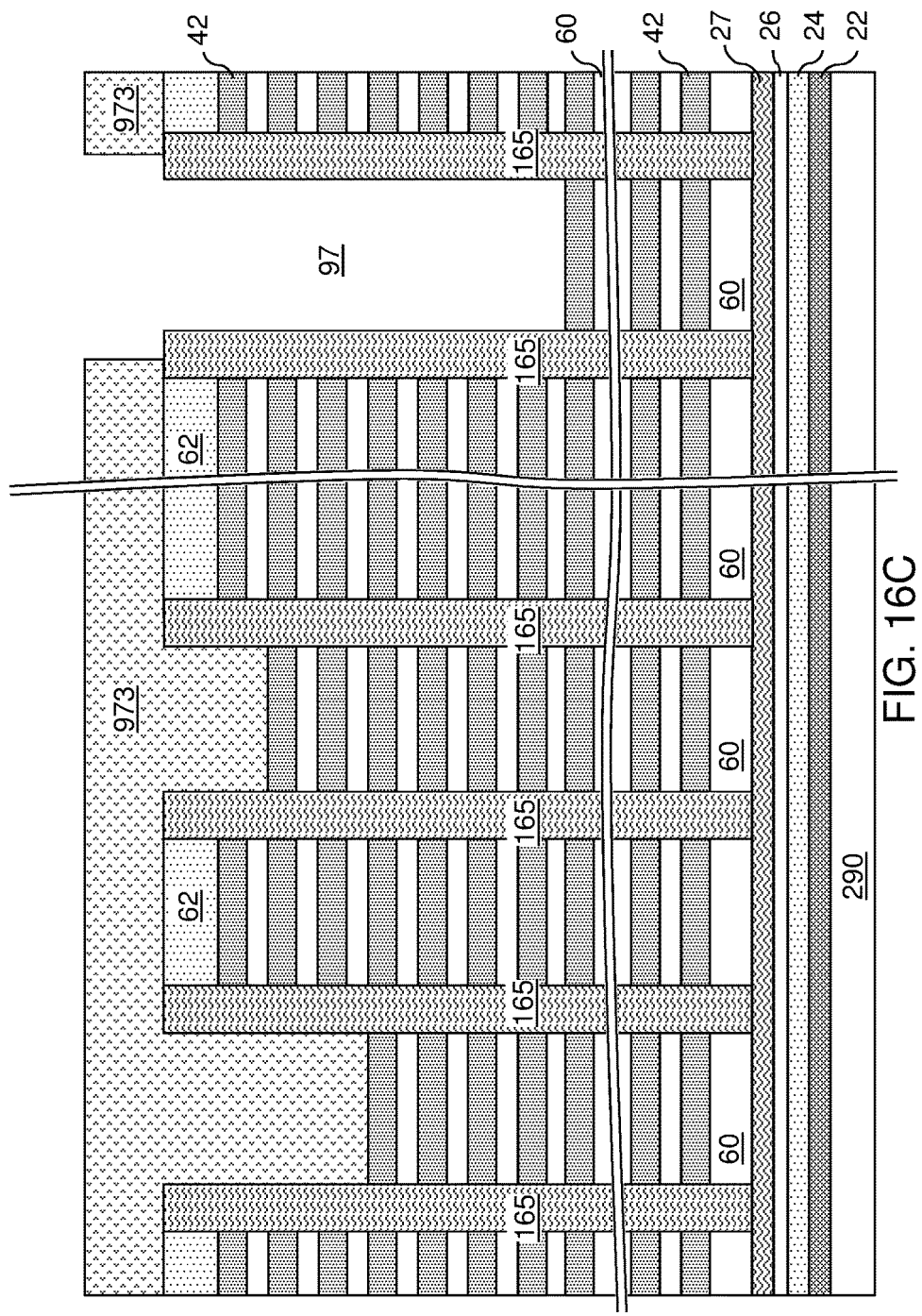
FIG. 16C is a vertical cross-sectional view along the plane C-C' of the exemplary structure of FIG. 16A according to an embodiment of the present disclosure.
Figure 17A:
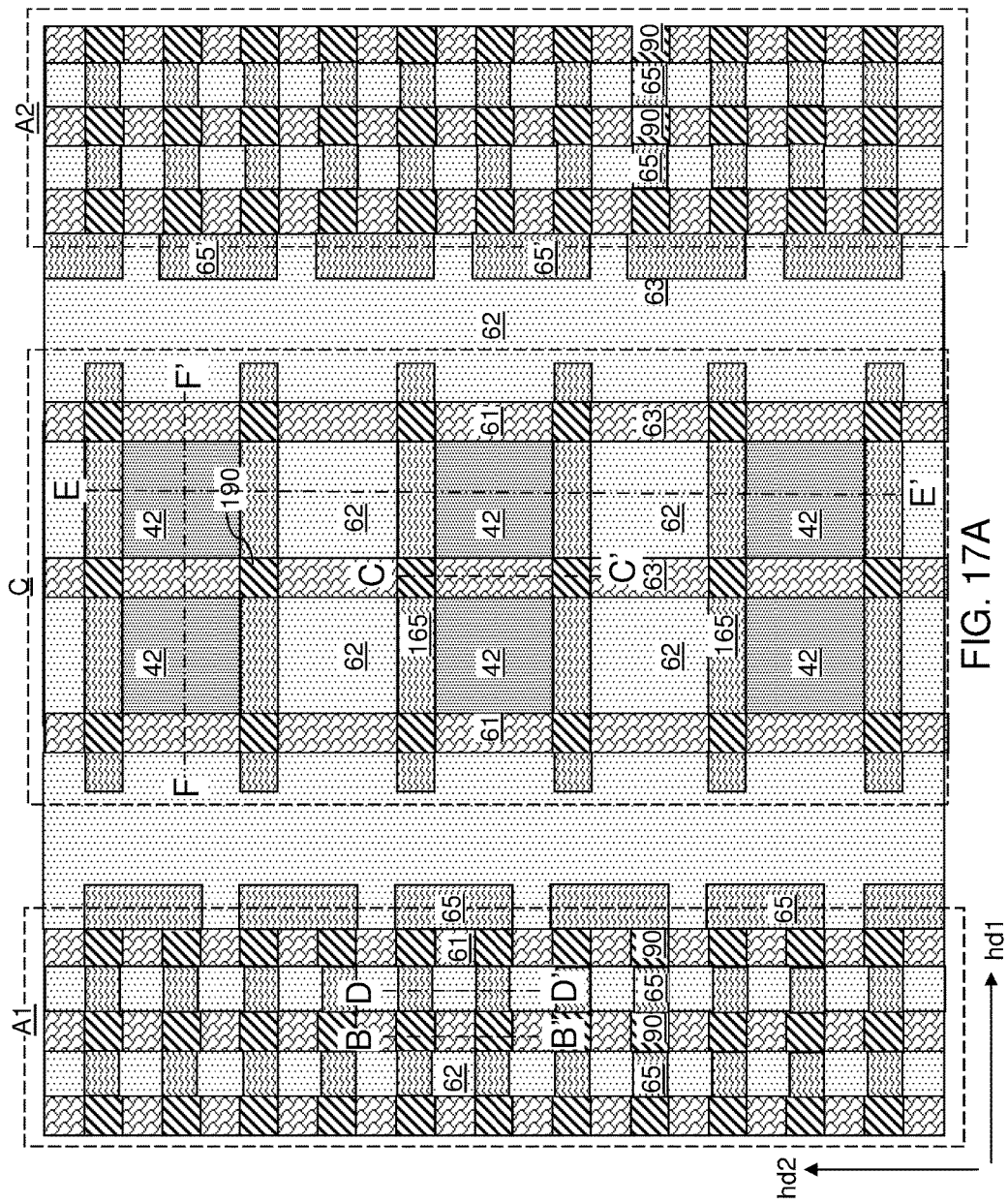
FIG. 17A is a top-down view of an area of the exemplary structure after forming connecting via cavities between pairs of sacrificial template structures according to an embodiment of the present disclosure.
Figure 17B:
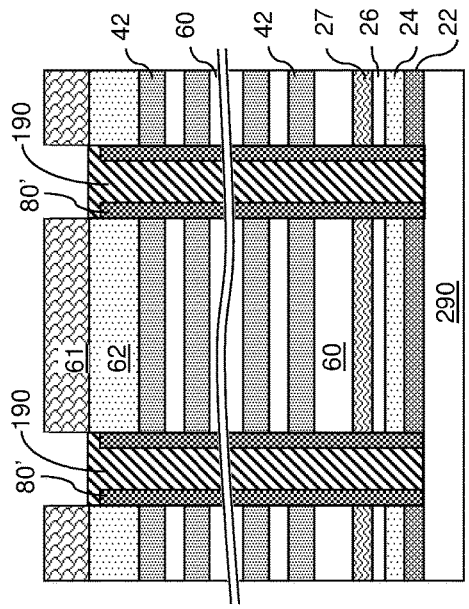
FIG. 17B is a vertical cross-sectional view along the plane B-B' of the exemplary structure of FIG. 17A according to an embodiment of the present disclosure.
Figure 17C:
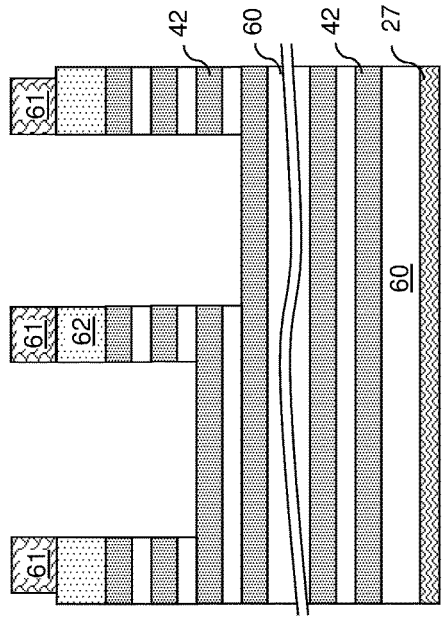
FIG. 17C is a vertical cross-sectional view along the plane C-C' of the exemplary structure of FIG. 17A according to an embodiment of the present disclosure.
Figure 17D:
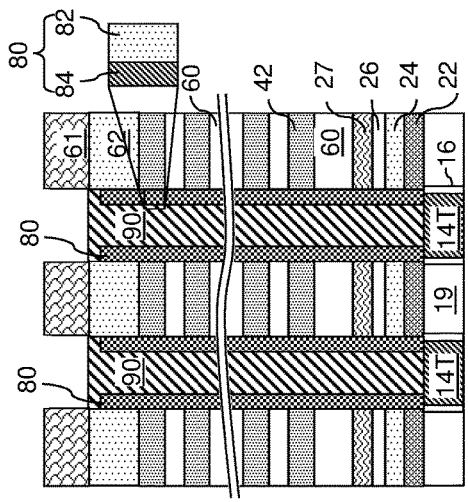
FIG. 17D is a vertical cross-sectional view along the plane D-D' of the exemplary structure of FIG. 17A according to an embodiment of the present disclosure.
Figure 17F:
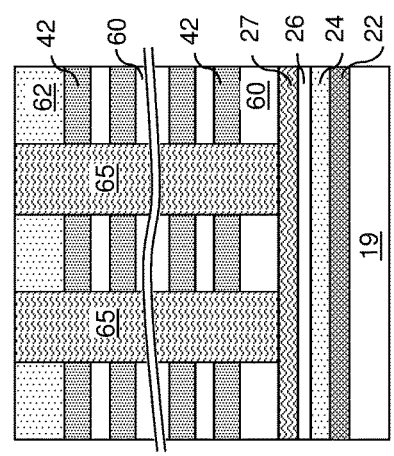
FIG. 17F is a vertical cross-sectional view along the plane F-F' of the exemplary structure of FIG. 17A according to an embodiment of the present disclosure.
Figure 17E:
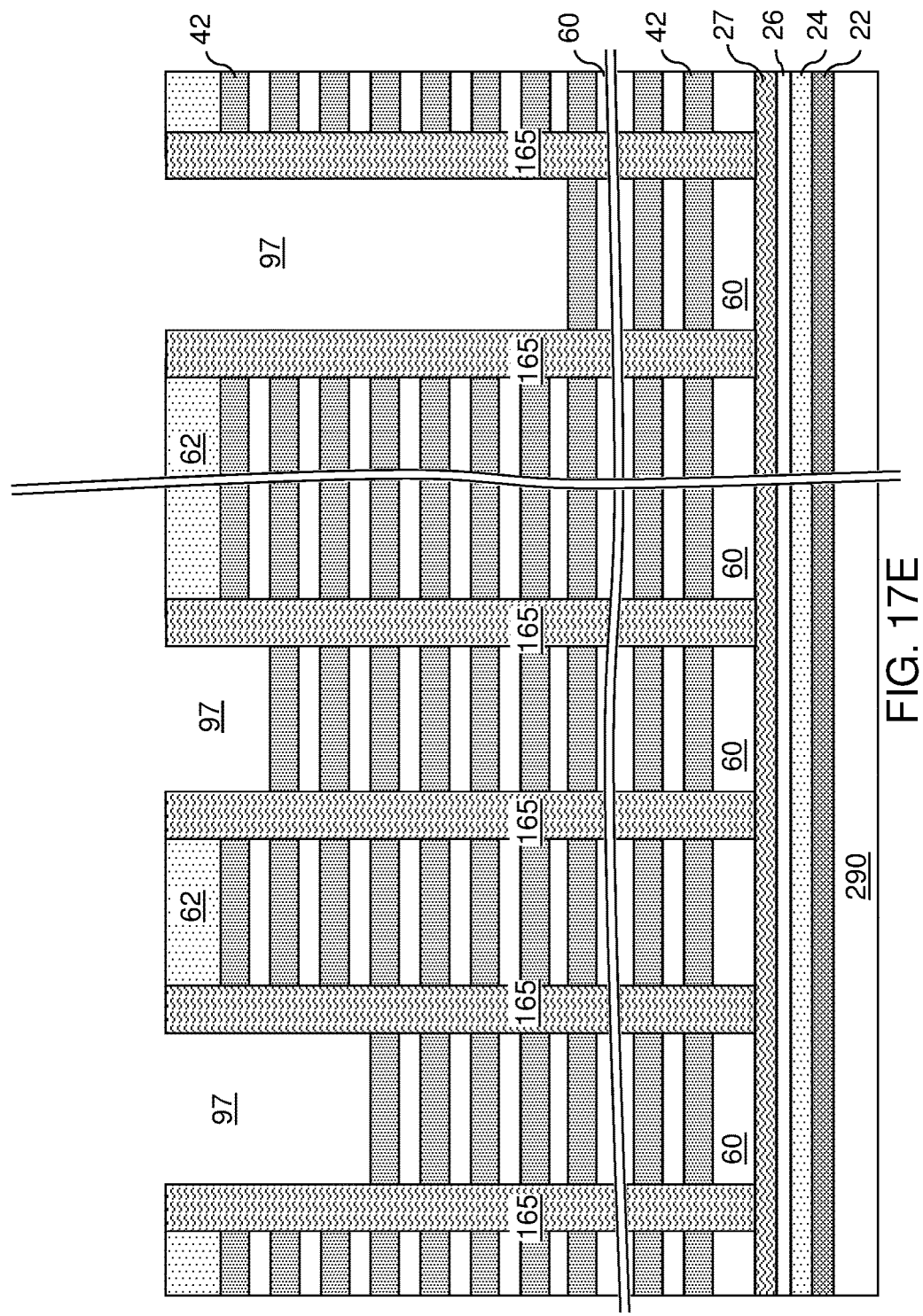
FIG. 17E is a vertical cross-sectional view along the plane E-E' of the exemplary structure of FIG. 17A according to an embodiment of the present disclosure.
Figure 18A:
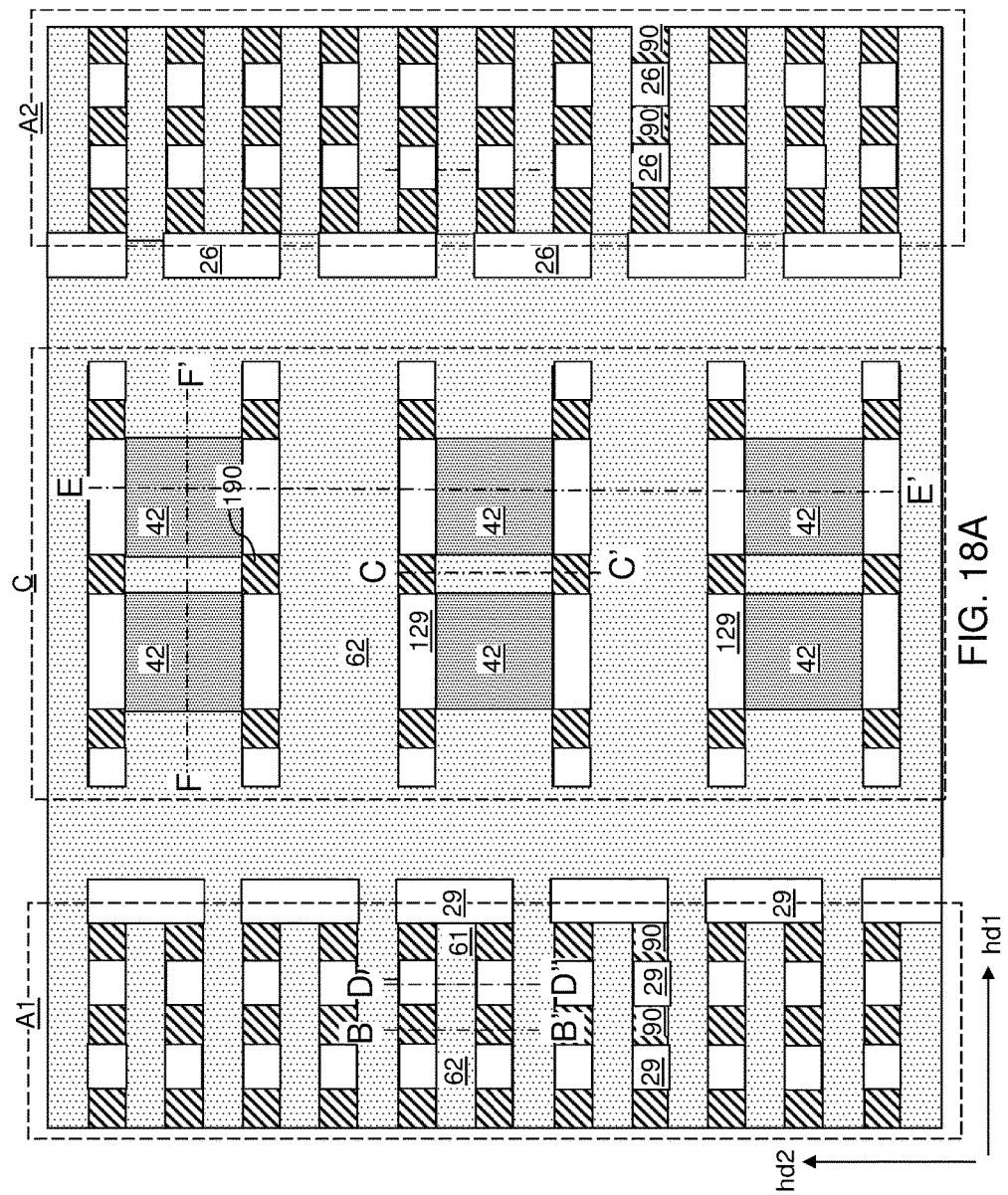
FIG. 18A is a top-down view of an area of the exemplary structure after removal of the sacrificial template structures according to an embodiment of the present disclosure.
Figure 18E:
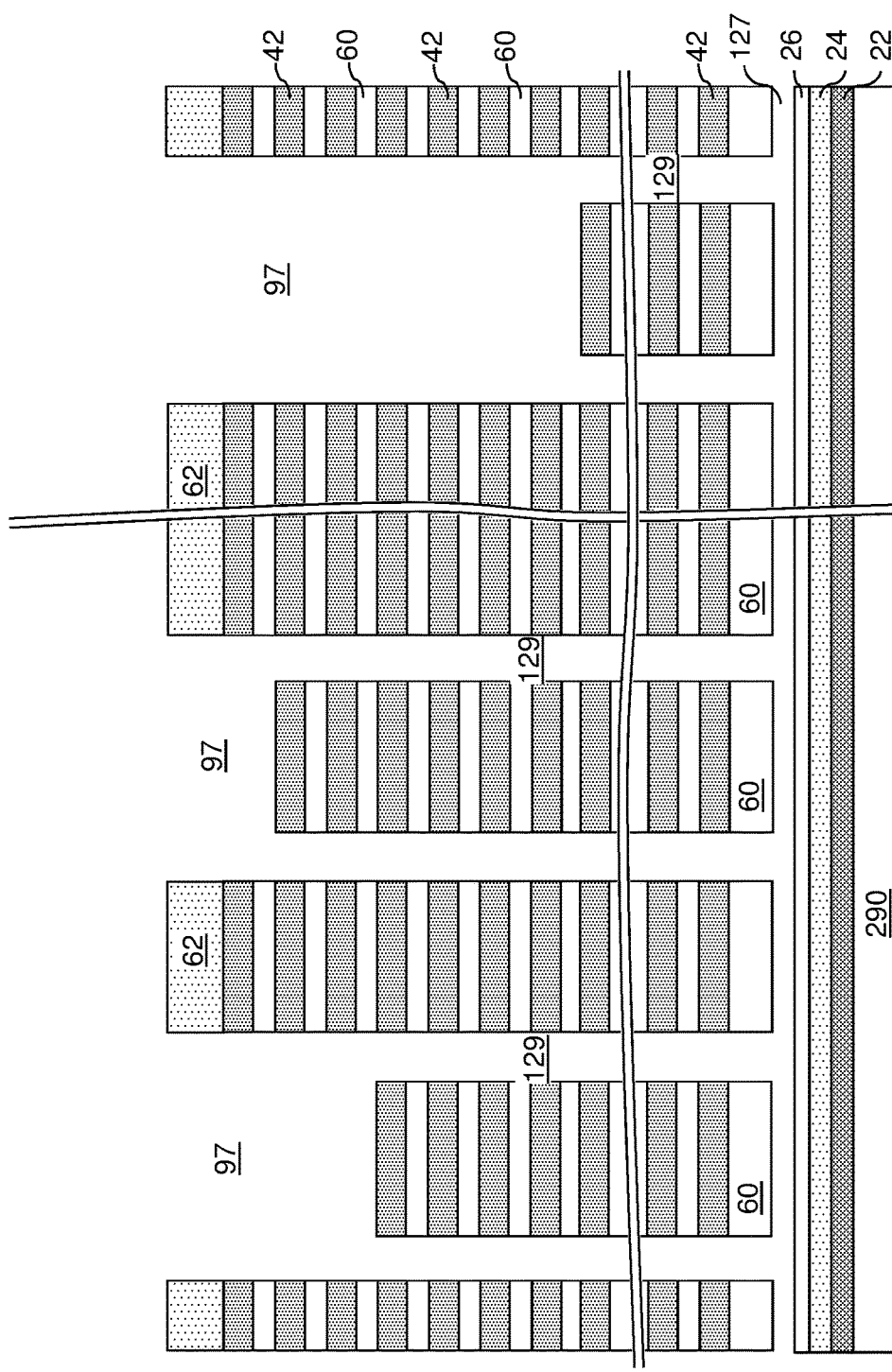
FIG. 18E is a vertical cross-sectional view along the plane E-E' of the exemplary structure of FIG. 18A according to an embodiment of the present disclosure.
Figure 19A:
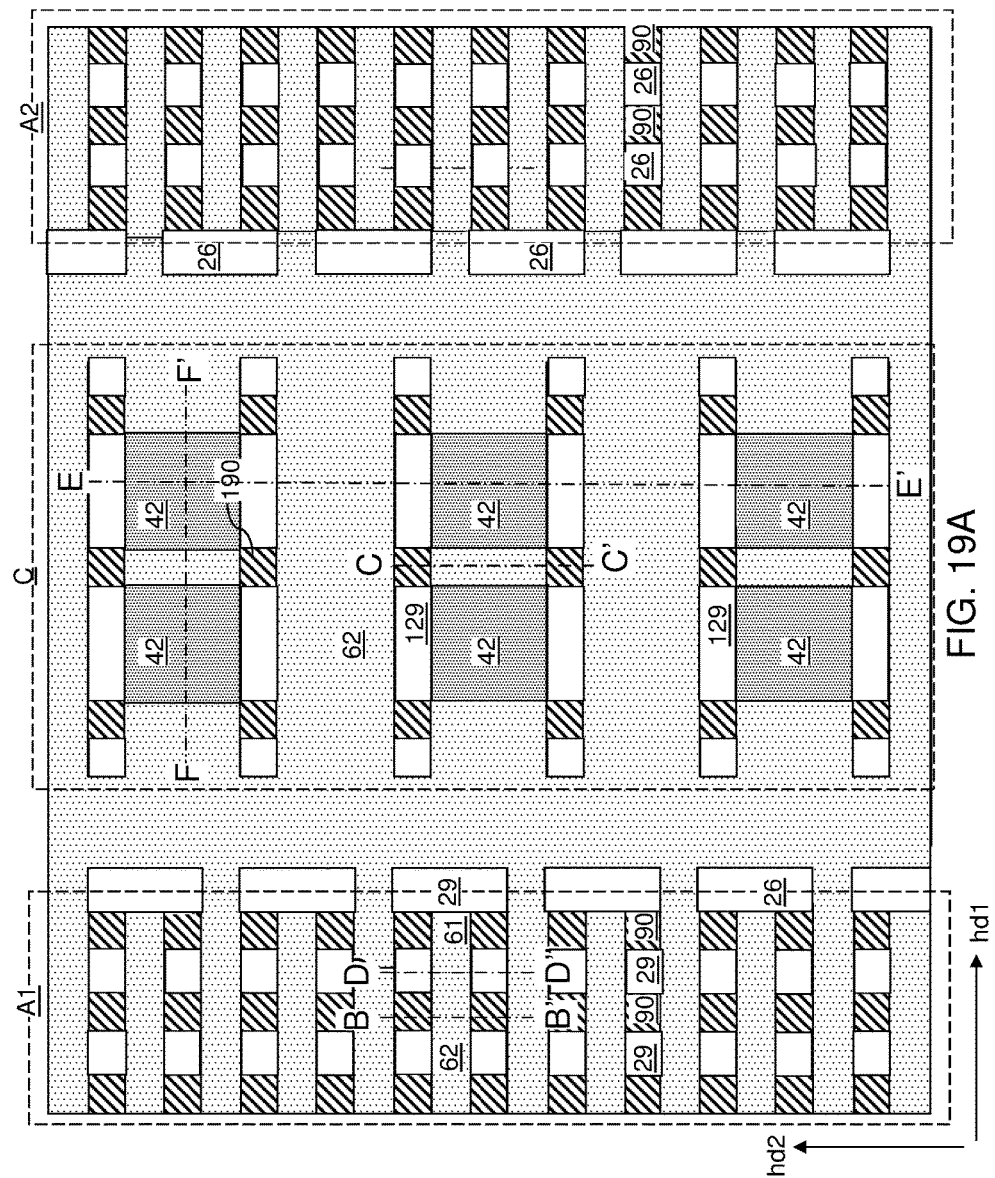
FIG. 19A is a top-down view of an area of the exemplary structure after formation of a dielectric liner according to an embodiment of the present disclosure.
Figure 19B:
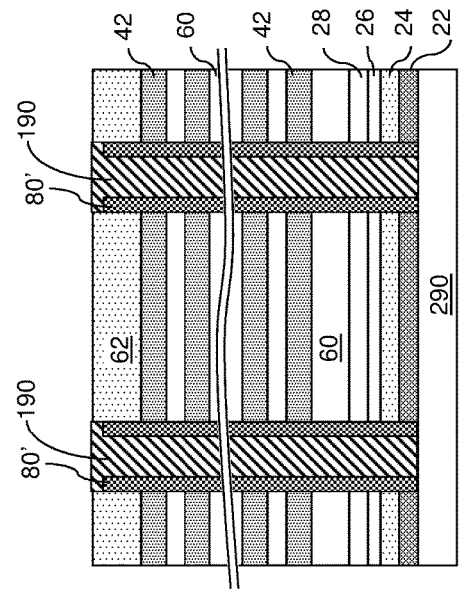
FIG. 19B is a vertical cross-sectional view along the plane B-B' of the exemplary structure of FIG. 19A according to an embodiment of the present disclosure.
Figure 19C:
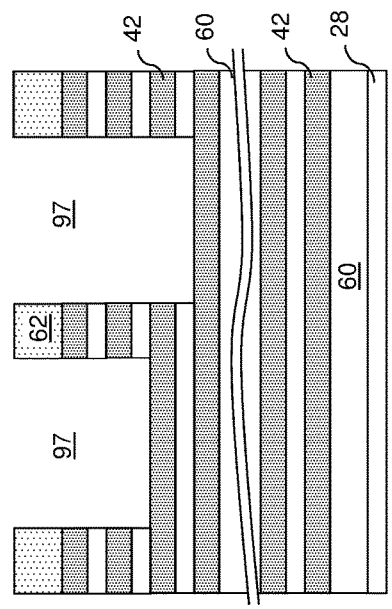
FIG. 19C is a vertical cross-sectional view along the plane C-C' of the exemplary structure of FIG. 19A according to an embodiment of the present disclosure.
Figure 19D:
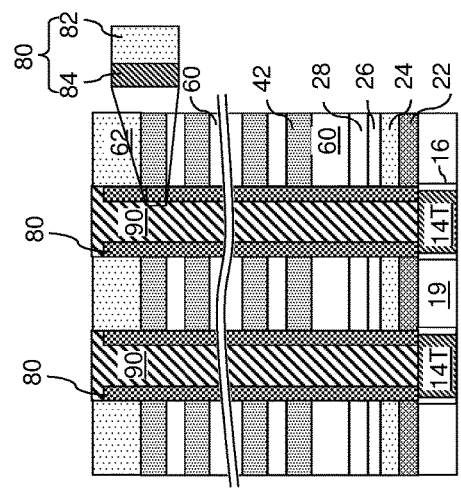
FIG. 19D is a vertical cross-sectional view along the plane D-D' of the exemplary structure of FIG. 19A according to an embodiment of the present disclosure.
Figure 19F:
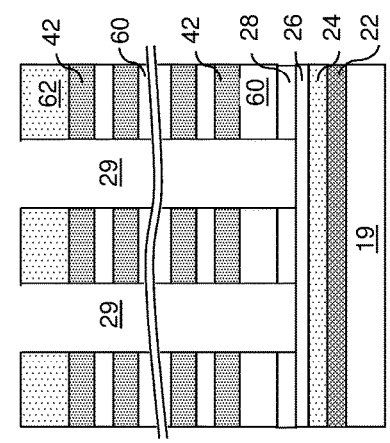
FIG. 19F is a vertical cross-sectional view along the plane F-F' of the exemplary structure of FIG. 19A according to an embodiment of the present disclosure.
Figure 19E:
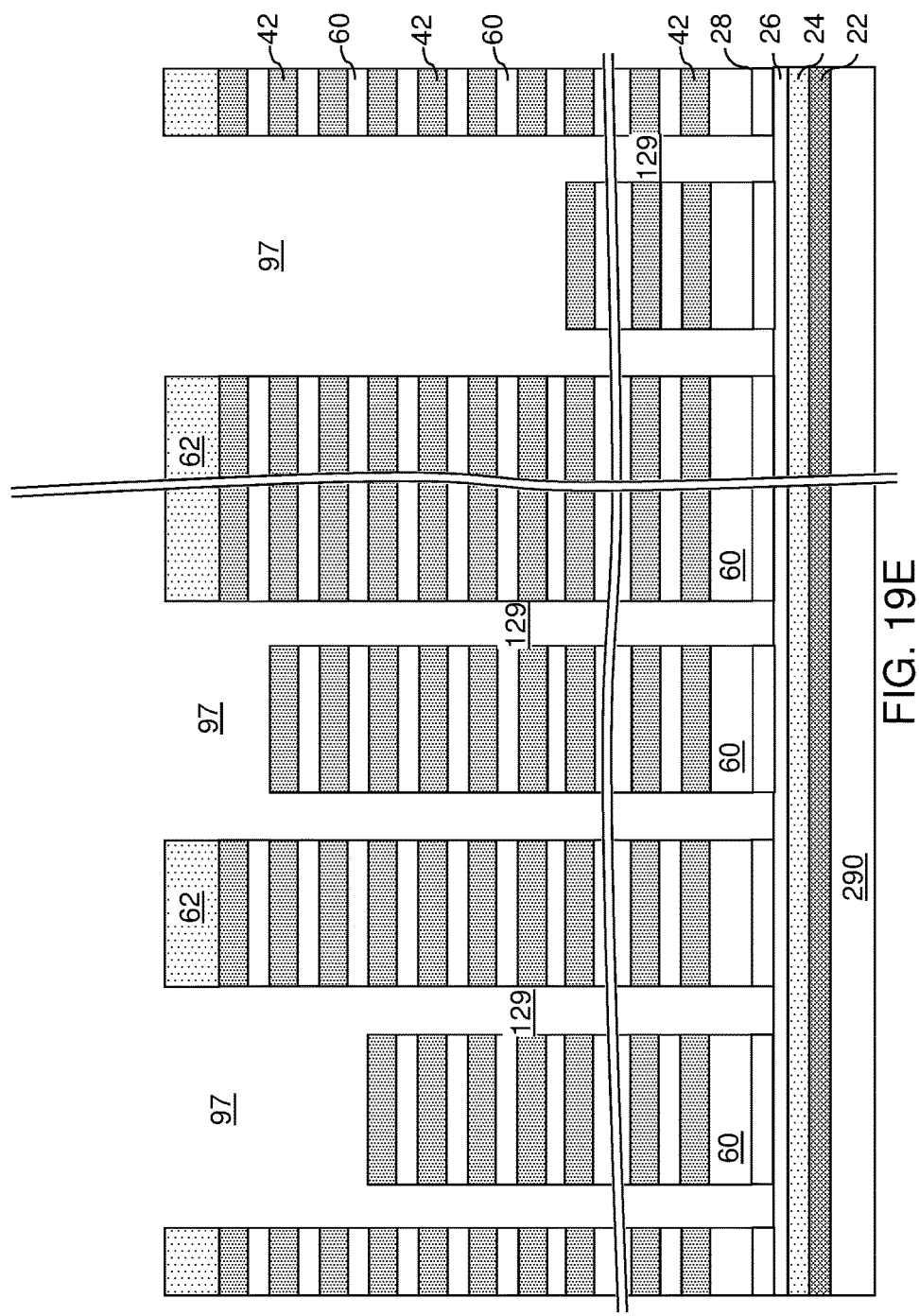
FIG. 19E is a vertical cross-sectional view along the plane E-E' of the exemplary structure of FIG. 19A according to an embodiment of the present disclosure.
Figure 20A:
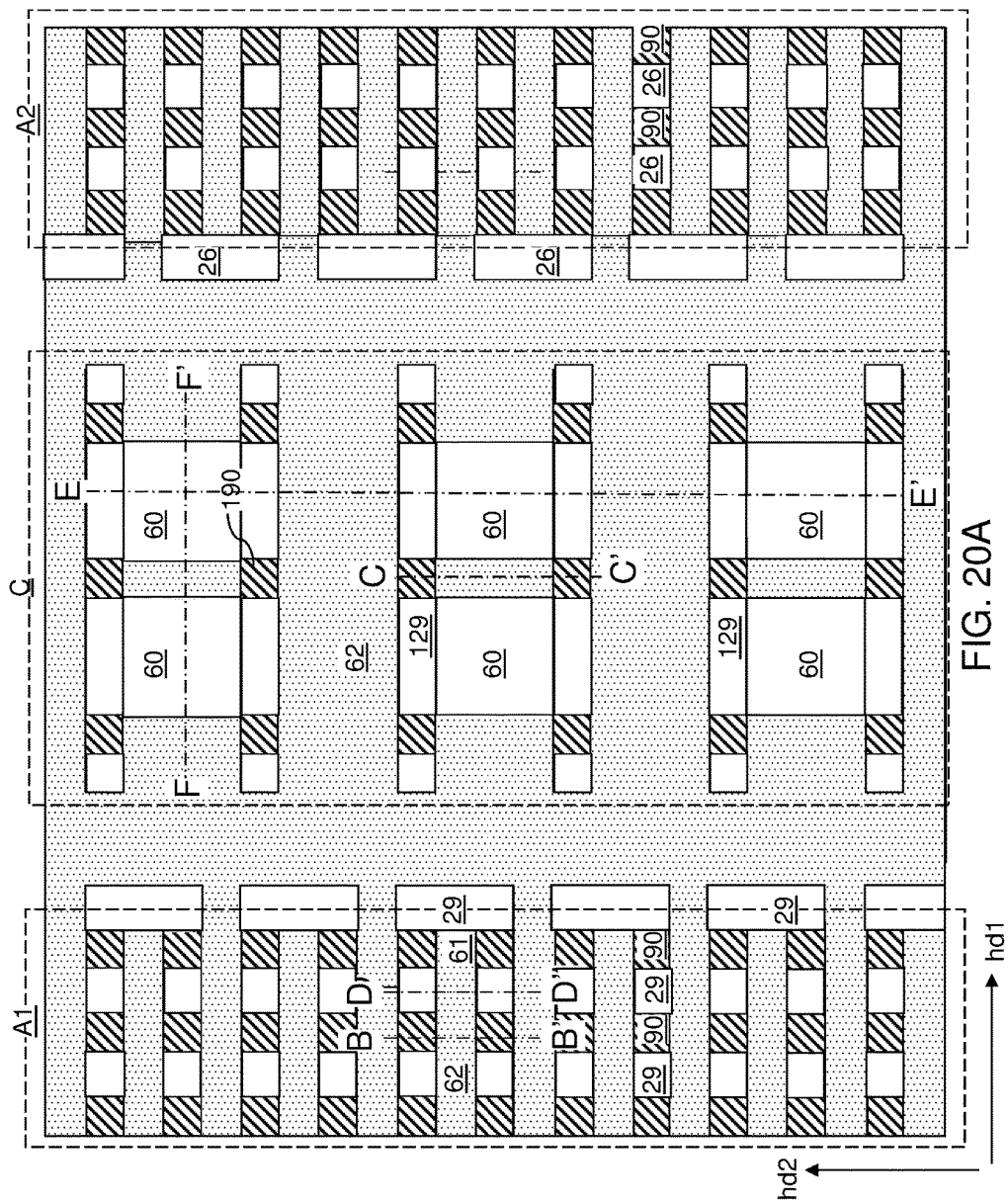
FIG. 20A is a top-down view of an area of the exemplary structure after removal of the sacrificial material layers according to an embodiment of the present disclosure.
Figure 20B:
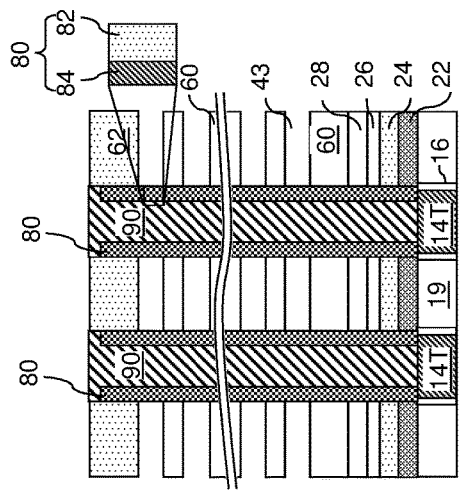
FIG. 20B is a vertical cross-sectional view along the plane B-B' of the exemplary structure of FIG. 20A according to an embodiment of the present disclosure.
Figure 20C:
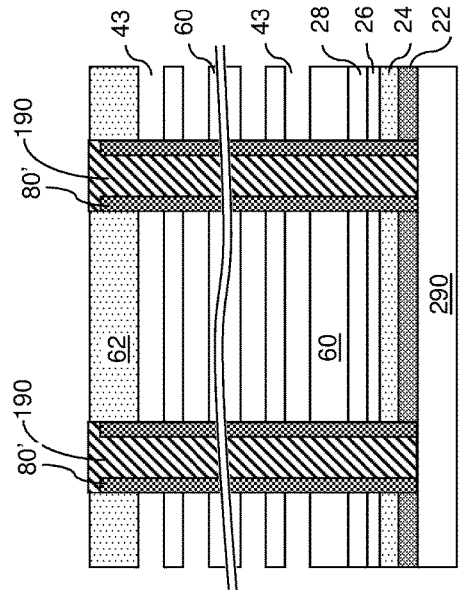
FIG. 20C is a vertical cross-sectional view along the plane C-C' of the exemplary structure of FIG. 20A according to an embodiment of the present disclosure.
Figure 20D:
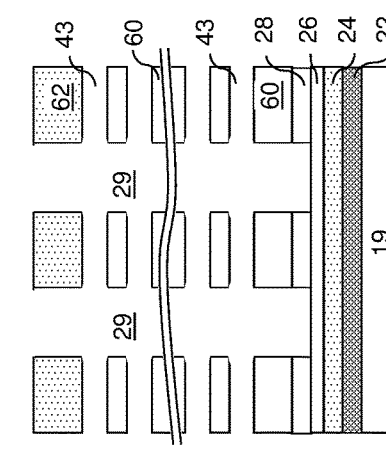
FIG. 20D is a vertical cross-sectional view along the plane D-D' of the exemplary structure of FIG. 20A according to an embodiment of the present disclosure.
Figure 20F:
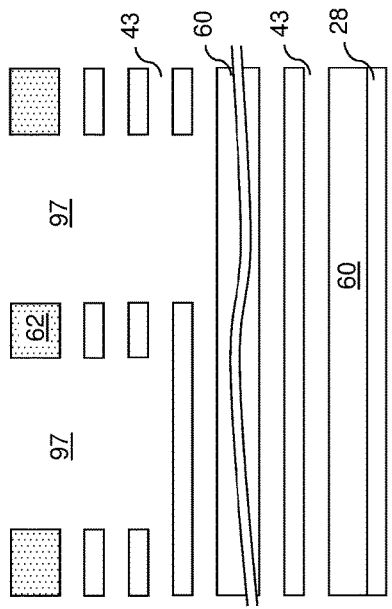
FIG. 20F is a vertical cross-sectional view along the plane F-F' of the exemplary structure of FIG. 20A according to an embodiment of the present disclosure.
Figure 20E:
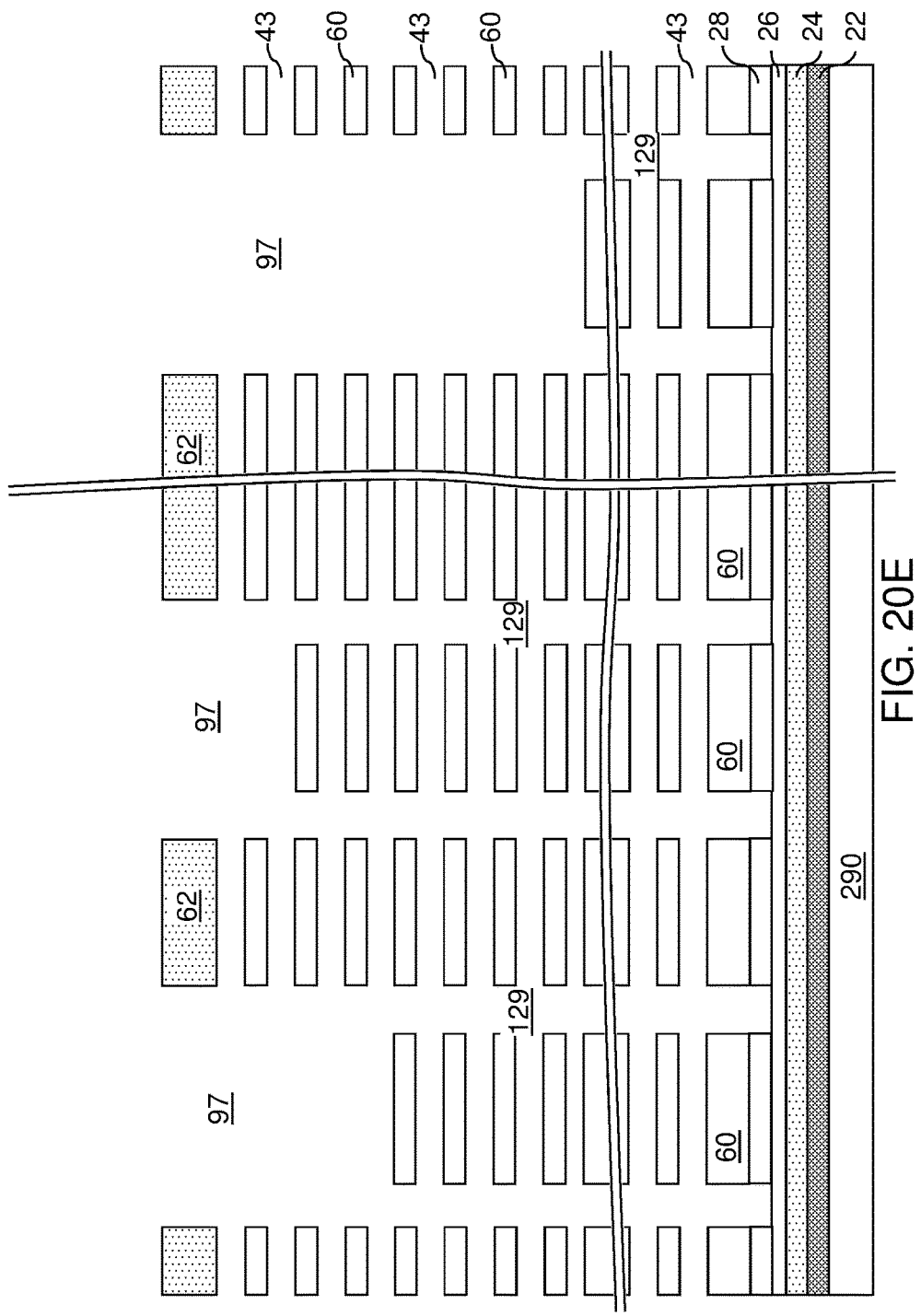
FIG. 20E is a vertical cross-sectional view along the plane E-E' of the exemplary structure of FIG. 20A according to an embodiment of the present disclosure.
Figure 21A:
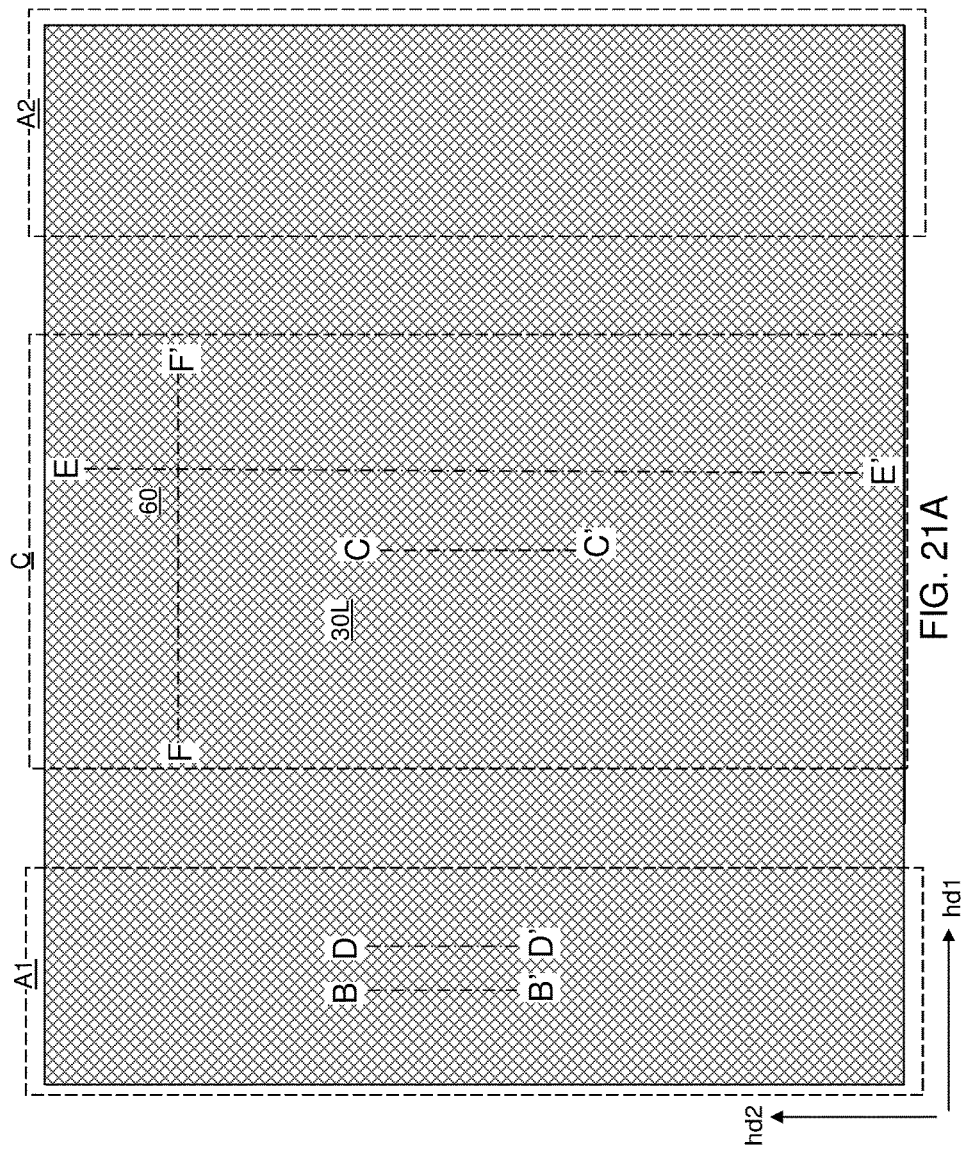
FIG. 21A is a top-down view of an area of the exemplary structure after formation of electrically conductive layers and a continuous conductive material layer according to an embodiment of the present disclosure.
Figure 21B:
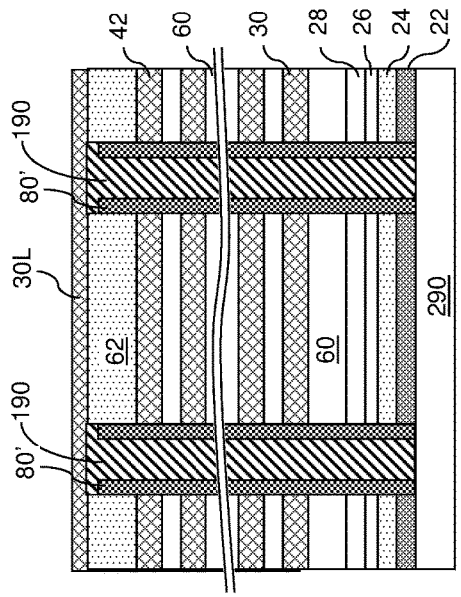
FIG. 21B is a vertical cross-sectional view along the plane B-B' of the exemplary structure of FIG. 21A according to an embodiment of the present disclosure.
Figure 21C:
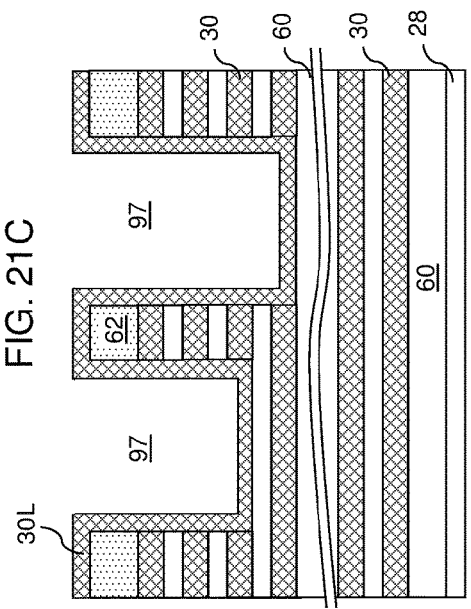
FIG. 21C is a vertical cross-sectional view along the plane C-C' of the exemplary structure of FIG. 21A according to an embodiment of the present disclosure.
Figure 21D:
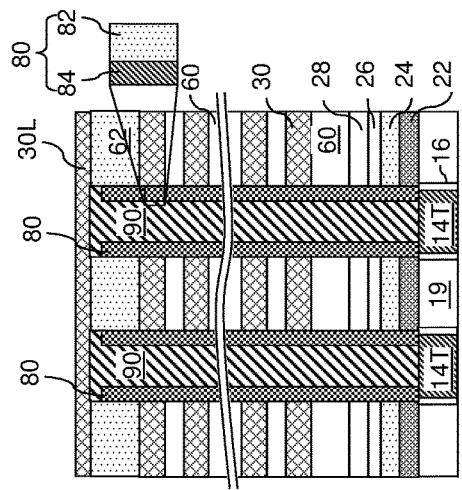
FIG. 21D is a vertical cross-sectional view along the plane D-D' of the exemplary structure of FIG. 21A according to an embodiment of the present disclosure.
Figure 21F:
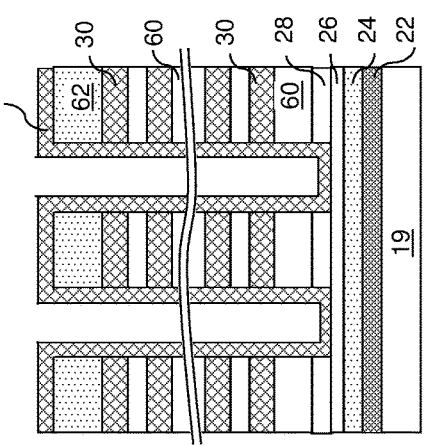
FIG. 21F is a vertical cross-sectional view along the plane F-F' of the exemplary structure of FIG. 21A according to an embodiment of the present disclosure.
Figure 21E:
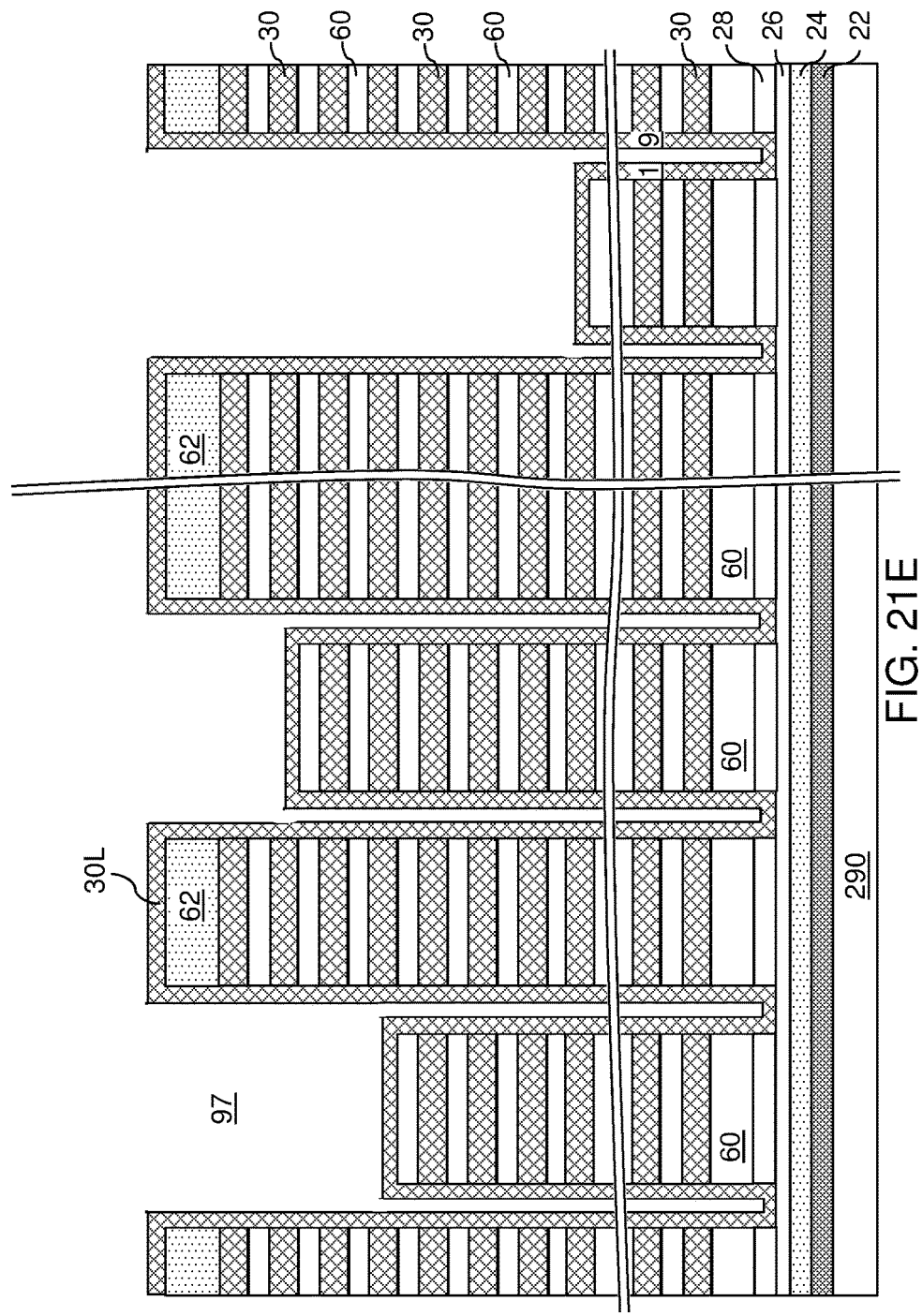
FIG. 21E is a vertical cross-sectional view along the plane E-E' of the exemplary structure of FIG. 21A according to an embodiment of the present disclosure.
Figure 22A:
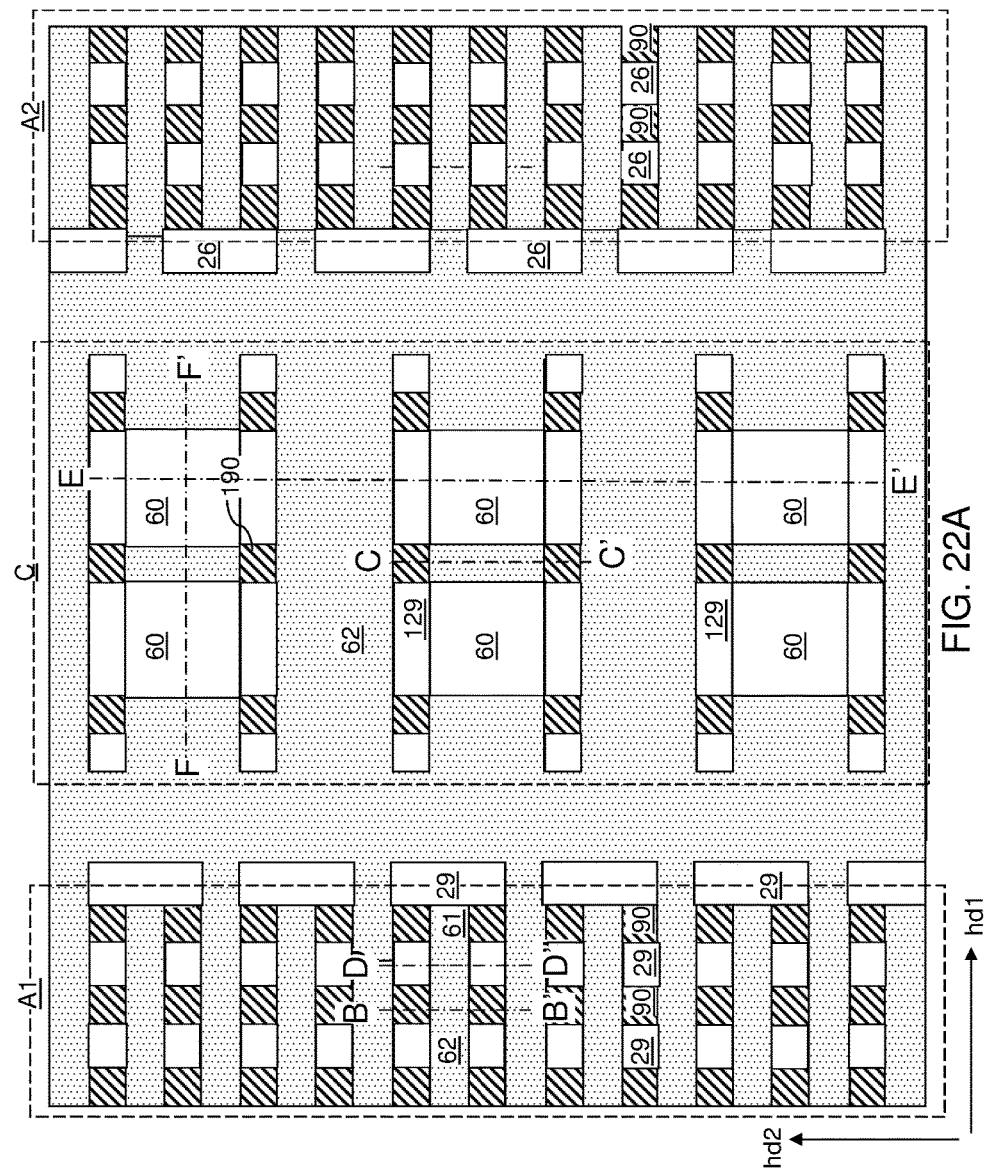
FIG. 22A is a top-down view of an area of the exemplary structure after removal of the continuous conductive material layer according to an embodiment of the present disclosure.
Figure 22E:
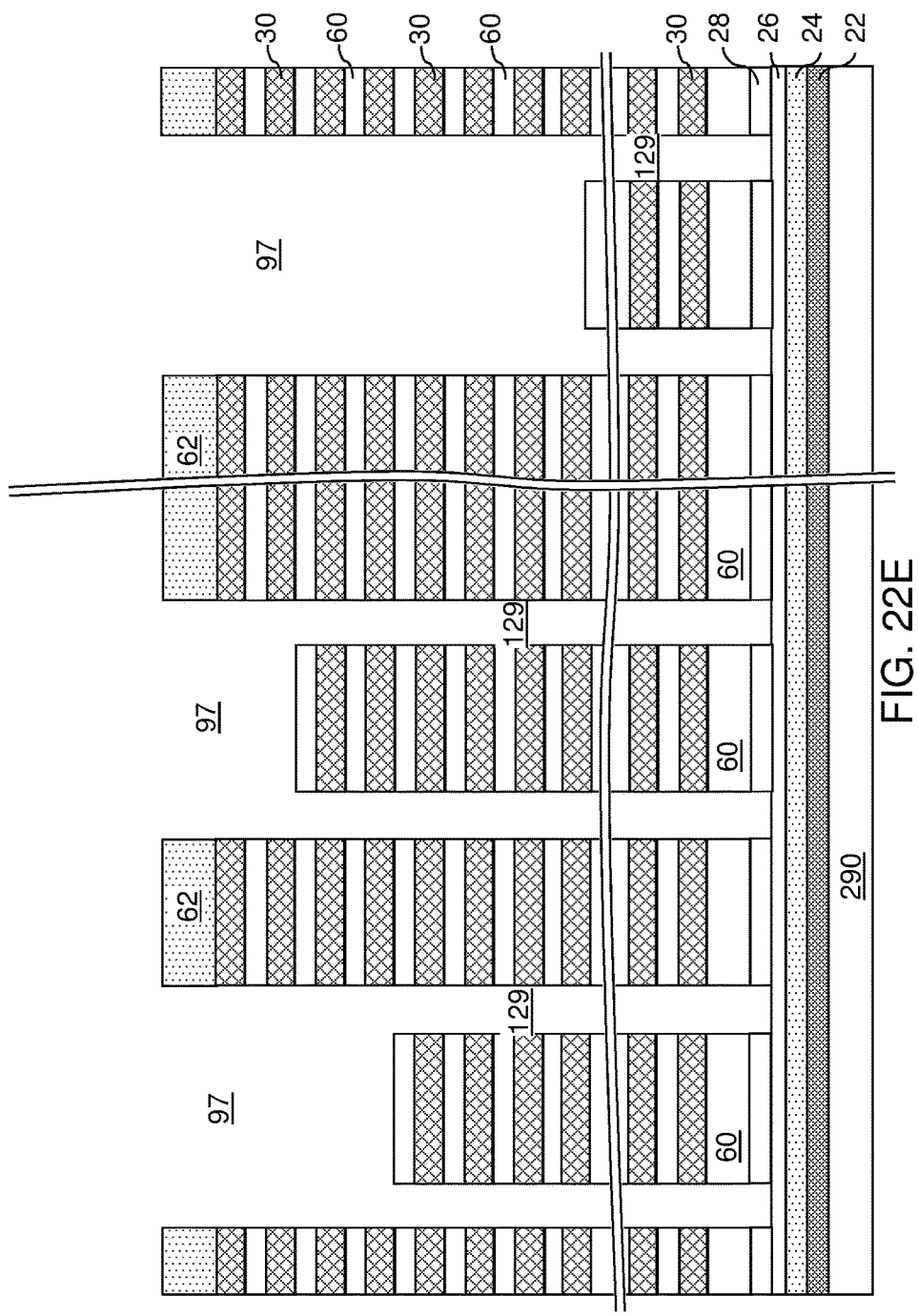
FIG. 22E is a vertical cross-sectional view along the plane E-E' of the exemplary structure of FIG. 22A according to an embodiment of the present disclosure.
Figure 23A:
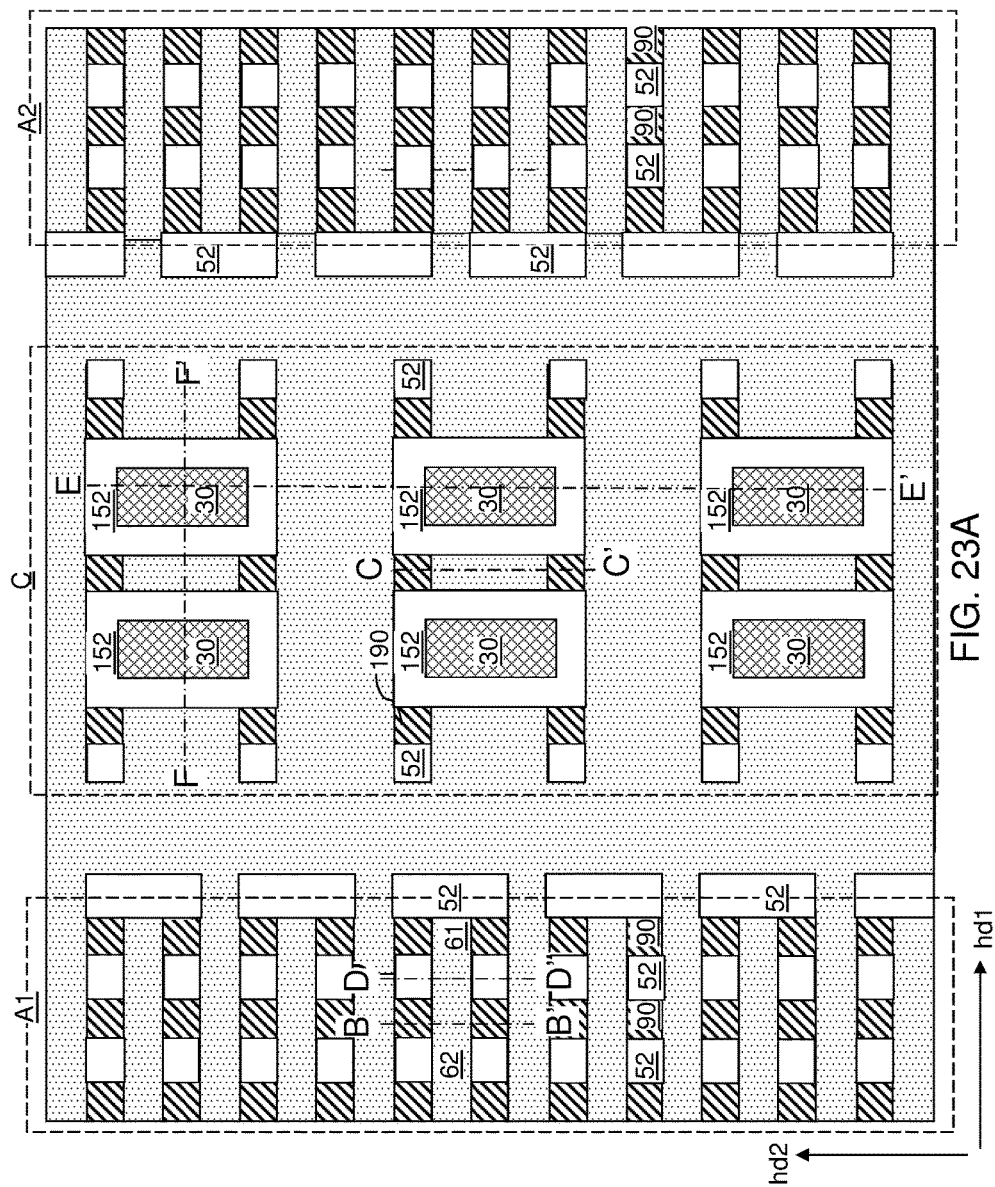
FIG. 23A is a top-down view of an area of the exemplary structure after formation of insulating spacers according to an embodiment of the present disclosure.
Figure 23B:
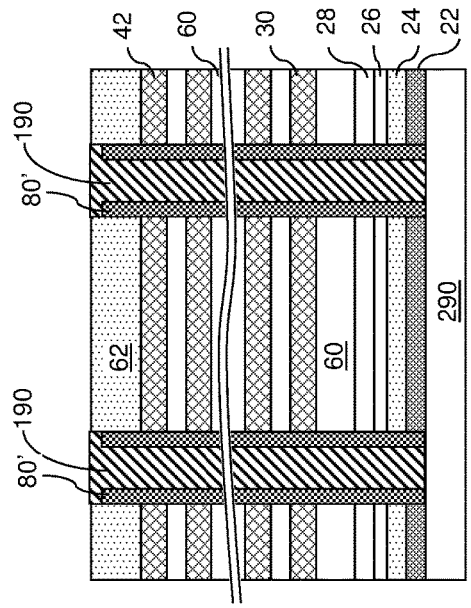
FIG. 23B is a vertical cross-sectional view along the plane B-B' of the exemplary structure of FIG. 23A according to an embodiment of the present disclosure.
Figure 23C:
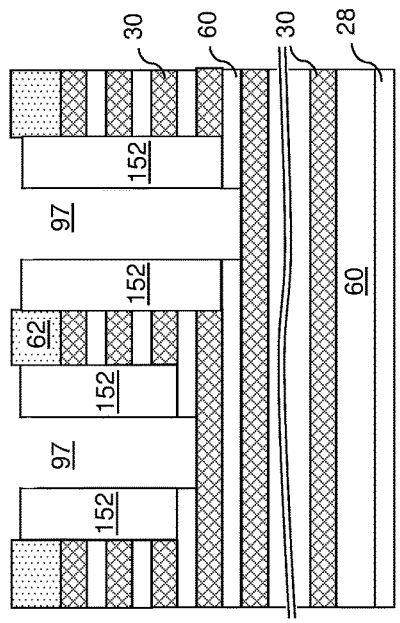
FIG. 23C is a vertical cross-sectional view along the plane C-C' of the exemplary structure of FIG. 23A according to an embodiment of the present disclosure.
Figure 23D:
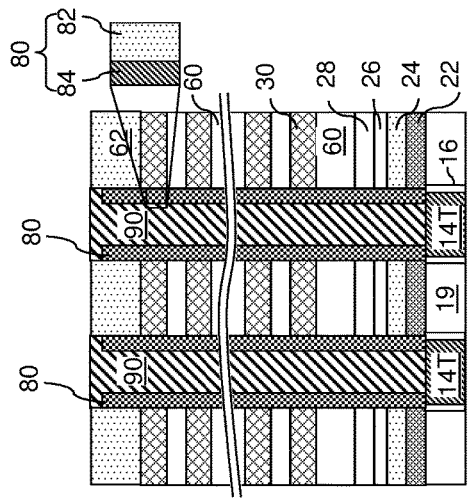
FIG. 23D is a vertical cross-sectional view along the plane D-D' of the exemplary structure of FIG. 23A according to an embodiment of the present disclosure.
Figure 23F:
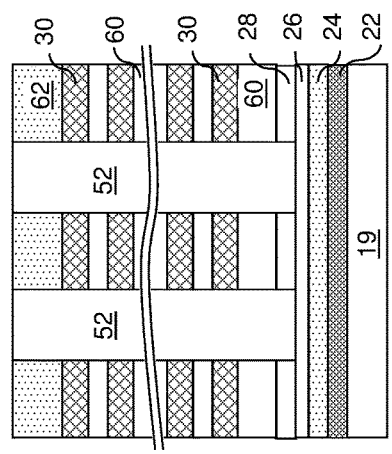
FIG. 23F is a vertical cross-sectional view along the plane F-F' of the exemplary structure of FIG. 23A according to an embodiment of the present disclosure.
Figure 24A:
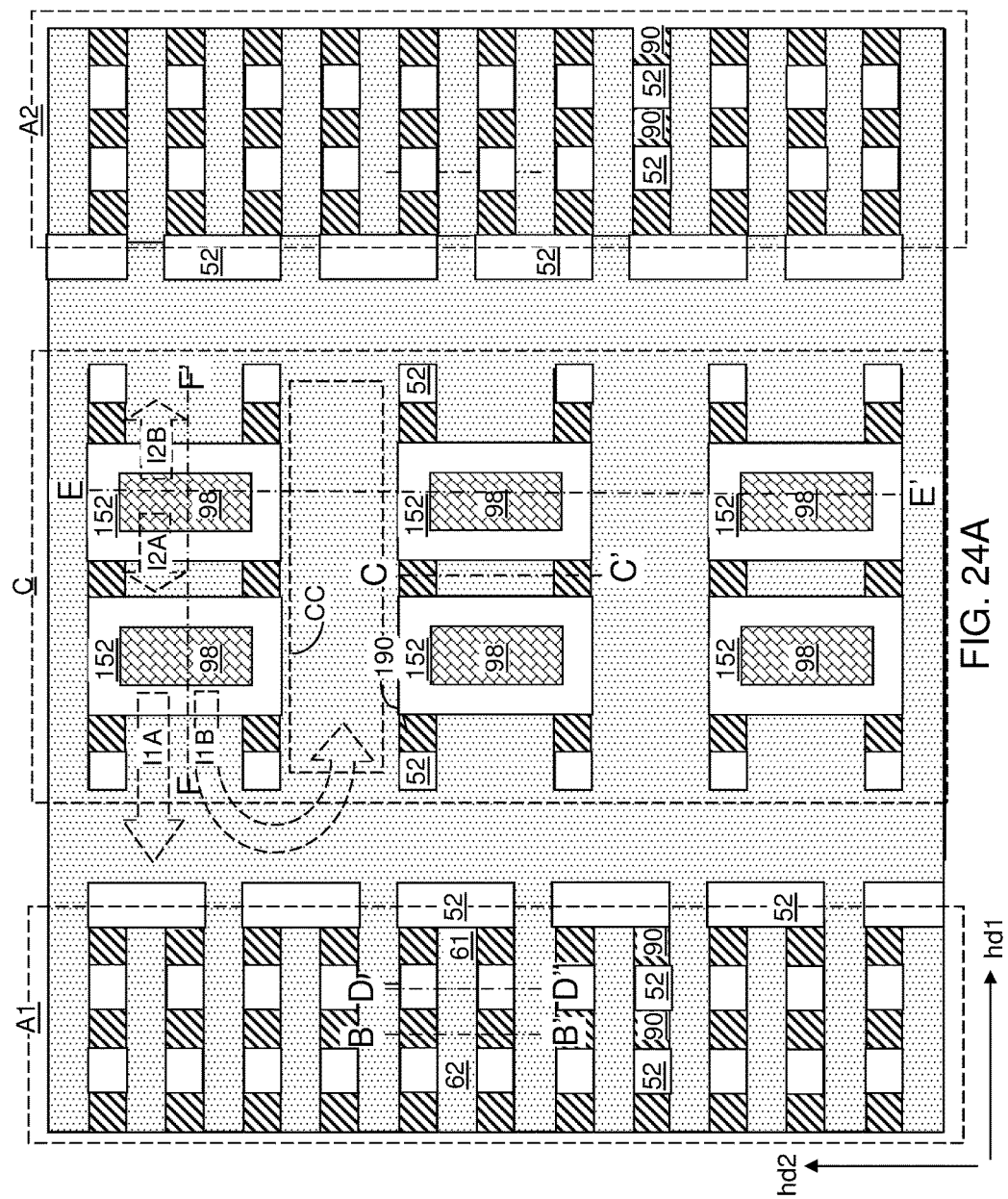
FIG. 24A is a top-down view of an area of the exemplary structure after formation of contact via structures according to an embodiment of the present disclosure.
Figure 24E:
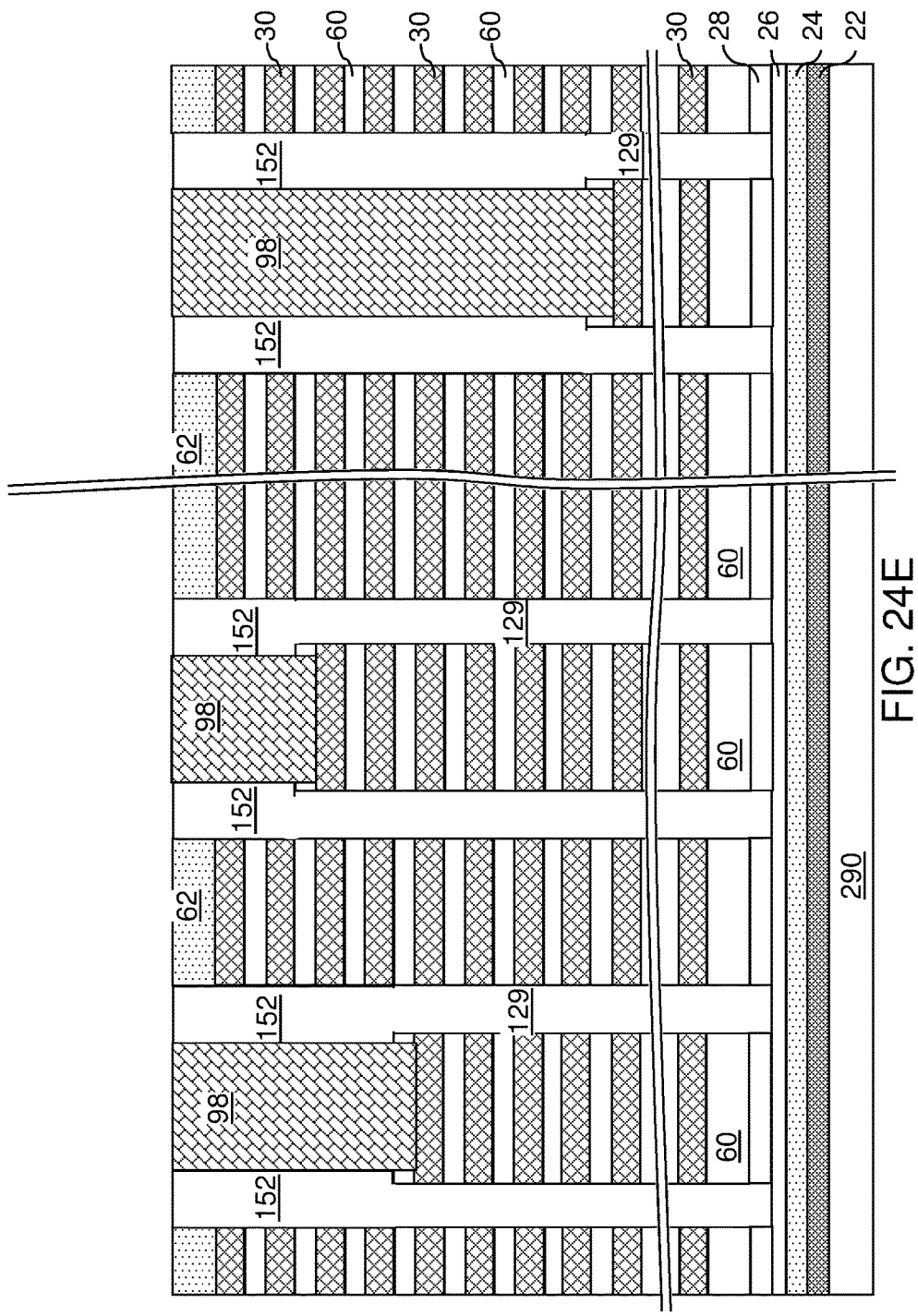
FIG. 24E is a vertical cross-sectional view along the plane E-E' of the exemplary structure of FIG. 24A according to an embodiment of the present disclosure.

Referring to FIGS. 16A-16C, a fourth photoresist layer 973 can be applied over the exemplary structure, and can be lithographically patterned to form openings in each region in which the connecting via cavities 97 are to be vertically extended by four pairs of a sacrificial material layer 42 and an insulating layer 60. An anisotropic etch can be performed to etch through four pairs of a sacrificial material layer 42 and an insulating layer 60 within each of the openings in the fourth photoresist layer 973. In one embodiment, the first hard mask layer 61, the sacrificial template structures 165, and the conductive fill structures 190 can be employed as etch masks in addition to the fourth photoresist layer 973. Connecting via cavities 97 are vertically extended through four pairs of a sacrificial material layer 42 and an insulating layer 60 between respective pairs of sacrificial template structures 165 within each opening in the fourth photoresist layer 973. The fourth photoresist layer 973 is subsequently removed, for example, by ashing.

Generally, various opening patterns for the photoresist layers can be combined with anisotropic etch processes that etch $2^0$ (=1) pair of an insulating layer 60 and a sacrificial material layer, $2^1$ pairs of an insulating layer 60 and a sacrificial material layer, $2^2$ pairs of an insulating layer 60 and a sacrificial material layer, $2^2$ pairs of an insulating layer 60 and a sacrificial material layer, $2^3$ pairs of an insulating layer 60 and a sacrificial material layer, and so on. By selecting overlaps among the areas of the openings in the various photoresist layers to match the total number of pairs of an insulating layer 60 and a sacrificial material layer to be etched, connecting via cavities 97 extending to $2^N$ different levels of sacrificial material layers 42 can be formed employing N or (N+1) number of photoresist layers and associated anisotropic etch processes. In one embodiment, the connecting via cavities 97 can extend through different numbers of sacrificial material layers 42 upon formation.

FIGS. 17A-17F illustrate the exemplary structure after completion of formation of various connecting via cavities 97 that extend to each of the sacrificial material layers 42. In other words, the various connecting via cavities 97 can be formed such that each sacrificial material layer 42 has a physically exposed top surface underneath a respective connecting via cavity 97 within each contact region C. While the present disclosure is described employing an embodiment in which a top surface of a sacrificial material layer 42 is physically exposed at the end of each anisotropic etch underneath the connecting via cavities 97, embodiments are expressly contemplated herein in which a top surface of an insulating layer 60 is physically exposed at the end of each anisotropic etch underneath the connecting via cavities 97.

Referring to FIGS. 18A-18F, the sacrificial pillar structures 65, the sacrificial template structures 165 can be removed selective to the alternating stack (60, 42), the insulating cap layer 62, the resistive memory films 80, the vertical bit lines 90, and the conductive fill structures 190 by an etch process. The etch process may include an isotropic etch process or an anisotropic etch process. Concurrently or sequentially, the first hard mask layer 61 and the optional semiconductor material liner 27 can be removed selective to the alternating stack (60, 42), the insulating cap layer 62, the resistive memory films 80, the vertical bit lines 90, and the conductive fill structures 190. In one embodiment, the sacrificial pillar structures 65, the sacrificial template structures 165, the first hard mask layer 61, and the optional semiconductor material liner 27 can be removed concurrently by an isotropic etch. For example, if each of the sacrificial pillar structures 65, the sacrificial template structures 165, the first hard mask layer 61, and the optional semiconductor material liner 27 includes polysilicon, a wet etch process that employs a KOH solution or a tetramethylammonium hydroxide (TMAH) solution can be employed to isotropically etch the sacrificial template structures 165, the first hard mask layer 61, and the optional semiconductor material liner 27 selective to the materials of the insulating layers 60 (which can include a TEOS oxide material) and the sacrificial material layers 42 (which can include silicon nitride), the resistive memory films 80, the vertical bit lines 90, and the conductive fill structures 190. If the semiconductor material liner 27 is provided and removed at this etch step, liner level lateral cavities 127 can be formed in the volumes from which the semiconductor material liner 27 is removed.

Portions of the separation trenches 69 between neighboring pairs of resistive memory pillars (80, 90) are exposed through all levels of the alternating stack (60, 42) to provide memory region access cavities 29. Sidewalls of the sacrificial material layers 42 are physically exposed around the memory region access cavities 29 within the memory regions (A1, A2). Portions of the line trenches 169 between neighboring pairs of support pillars (80', 190) are exposed through all levels of the alternating stack (60, 42) to provide contact region access cavities 129, which can include line cavities that extend along the first horizontal direction hd1. Sidewalls of the sacrificial material layers 42 are physically exposed around the contact region access cavities 129 within each contact region C.

Referring to FIGS. 19A-19F, in case the liner level lateral cavities 127 are formed at the processing steps of FIGS. 18A-18F, a dielectric material can be conformally deposited in the liner level lateral cavities 127 to fill the liner level lateral cavities 127. The dielectric material can include, for example, silicon oxide, organosilicate glass, silicon oxide, or any other suitable dielectric material. For example, silicon oxide can be deposited in the line level lateral cavities 127. An isotropic etch can be performed to remove portions of the deposited dielectric material from peripheral portions of each memory region access cavity 29 and from peripheral portions of each contact region access cavity 129. The remaining portions of the deposited dielectric material filling the liner level lateral cavities 127 constitute a dielectric liner 28.

Referring to FIGS. 20A-20F, an isotropic etch process can be performed to remove the material of the sacrificial material layers 42 selective to the materials of the insulating layers 60, the insulating cap layer 62, the vertical bit lines 90, and the conductive fill structures 190. For example, if the sacrificial material layers 42 include silicon nitride, the insulating layers 60 and the insulating cap layer 62 includes silicon oxide, a wet etch employing hot phosphoric acid can be employed to remove the sacrificial material layers 42 selective to the insulating layers 60 and the insulating cap layer 62. The etch process can be selective to the dielectric liner 28 and at least one of the various liners (22, 24, 26) underneath.

The etchant that etches the sacrificial material layers 42 can be provided through portions of the line trenches 169 as formed at the processing steps of FIGS. 3A-3D and through the connecting via cavities 97 as formed at the processing steps of FIGS. 13A-17F as a conduit. Specifically, the memory region access cavities 29 and the contact region access cavities 129 (which can include line trenches) function as the conduit for the etchant of the isotropic etch process. Thus, the memory region access cavities 29 and the contact region access cavities 129 function as access cavities through which the etchant for etching the sacrificial material layers 42 is provided. Lateral recesses 43 can be formed in volumes from which the sacrificial material layers 42 are removed by the isotropic etch process. Each lateral recess 43 can have a uniform height throughout. The resistive memory pillars (80, 90) and the support pillars (80', 190) provide structural support to the insulating layers 60 and the insulating cap layer 62 during the isotropic etch process and after the isotropic etch process to prevent collapse of the insulating layers 60 and the insulating cap layers 62.

Referring to FIGS. 21A-21F, at least one conductive material can be conformally deposited in the lateral recesses 43 and at peripheral portions of each memory region access cavity 29 and each contact region access cavity 129. In one embodiment, a reactant can be provided through portions of the line trenches 169 as formed at the processing steps of FIGS. 3A-3D and through the connecting via cavities. The at least one conductive material can include, for example, a conductive metallic liner such as TiN, TaN, or WN, and a conductive fill material. The conductive fill material can include an elemental metal such as W, Cu, Co, or Ru, a conductive doped semiconductor material, a metal silicide, or a combination thereof. In an illustrative example, the at least one conductive material can include a stack of a TiN liner and a tungsten layer. Each of the at least one conductive material can be deposited by a conformal deposition process such as chemical vapor deposition, atomic layer deposition, electroplating, electroless plating, or a combination thereof. The thickness of the at least one conductive material can be less than the width of the memory region access cavities 29 and less than the width of the contact region access cavities 129.

The portions of the at least one conductive material that are deposited in the lateral recesses constitute electrically conductive layers 30. The portions of the at least one conductive material that are deposited in the memory region access cavities 29, the contact region access cavities 129, the connecting via cavities 97, and over the insulating cap layer 62 constitute a single continuous layer without any hole therein, which is herein referred to as a continuous conductive material layer 30L.

Referring to FIGS. 22A-22F, an etch back process is performed to remove the continuous conductive material layer 30L selective to the materials of the insulating layers 60, the insulating cap layer 62, and the various liners (22, 24, 26, 28). The etch back process can include an isotropic etch, an anisotropic etch, or a combination thereof, provided that the etch back process can remove the continuous conductive material layer 30L selective to the materials of the insulating layers 60 and the insulating cap layers 62. For example, the etch back process can include a chemical dry etch (CDE) process that isotropically etches the material of the continuous conductive material layer 30L. Thus, the continuous conductive material layer 30L is removed from inside the volumes of the line trenches 169 as formed at the processing steps of FIGS. 3A-3D and from the connecting via cavities 97.

The processing steps of FIGS. 20A-20F, 21A-21F, and 22A-22F replace the sacrificial material layers 42 with the electrically conductive layers 30, which function as word lines for the resistive memory pillars (80, 90).

Referring to FIGS. 23A-23F, a dielectric material such as silicon oxide or organosilicate glass can be deposited in the memory region access cavities 29 and less than the width of the contact region access cavities 129, at the periphery of each connecting via cavities 97, and over the insulating cap layer 62 by a conformal deposition process. The thickness of the deposited dielectric material can be selected such that the entirety of the memory region access cavities 29 and less than the width of the contact region access cavities 129 is filled with the deposited dielectric material. An anisotropic etch is performed to remove horizontal portions of the deposited dielectric material from above the insulating cap layer 62 and from the bottom of the connecting via cavities 97. Further, a physically exposed portion of an underlying insulating layer 60 can be anisotropically etched underneath each connecting via cavity 97 by the anisotropic etch. The electrically conductive layers 30 can be employed as etch stop layers. The thickness of the insulating cap layer 62 can be reduced by the anisotropic etch.

Each remaining portion of the deposited insulating material that fills a combination of a pair of contact region access cavities 129 and a peripheral portion of an adjoining connecting via cavity 97 constitutes an insulating spacer 152. Thus, an insulating spacer 152 is formed at a periphery of each connecting via cavity 97 and adjoining portions of the line trenches 169 as formed at the processing steps of FIGS. 3A-3D. Each insulating spacer 152 includes an annular portion that vertically extends between a respective first horizontal plane P1 including the top surface of an underlying insulating layer and a respective second horizontal plane P2 including the topmost surface of the insulating spacer 152. Each annular portion can have different heights depending on the number of levels through which the enclosed connecting via cavity 97 extends. Further, each insulating spacer 152 can have vertically protruding portions that extend downward from below the annular portion. The bottom surface of each vertically protruding portion can be within a same horizontal plane as the bottommost surface of the alternating stack (60, 30) of the insulating layers 60 and the electrically conductive layers 30.

Each remaining portion of the deposited insulating material that fills the memory region access cavities 29 constitute a dielectric pillar structure 52. Neighboring pairs of resistive memory pillars (80, 90) can be laterally spaced from each other by a respective dielectric pillar structure 52 along the first horizontal direction hd1.

Referring to FIGS. 24A-24F, at least one conductive material can be deposited in each remaining volume of the connecting via cavities 97. The at least one conductive material can include a metallic liner (such as a TiN liner) and a conductive fill material (such as W or Cu). Excess portions of the at least one conductive material can be removed from above a horizontal plane including a top surface of the insulating cap layer 62 by a planarization process, which can employ a recess etch and/or chemical mechanical planarization process. Each remaining portion of the at least one conductive material constitutes a contact via structure 98. Each contact via structure 98 contacts a top surface of a respective electrically conductive layer 30, which functions as a word line for the resistive memory elements within the resistive memory pillars (80, 90).

Contact via structures 98 located between a neighboring pair of line trenches 169 as formed at the processing steps of FIGS. 3A-3D can be laterally spaced from one another along the lengthwise direction of the line trenches 169, such as the first horizontal direction hd1. Such contact via structures 98 can have different depths, and thus, contact different electrically conductive layers 30. According to an aspect of the present disclosure, the depths (i.e., heights) of the contact via structures 98 located between a neighboring pair of line trenches 169 can increase along the lengthwise direction of the line trenches 169, or can decrease along the lengthwise direction of the line trenches 169. The insulating spacer 152 surrounding the contact via structure 98 contacting an electrically conductive layer 30 prevents formation of an electrically conductive path passing through the volume of the contact via structure 98 at any level above the level of the electrically conductive layer 30. By cascading the depths of the contact via structure in an increasing order or in a decreasing order along the lengthwise direction of the line trenches 169 for all contact via structures 98 between a neighboring pair of line trenches 169, electrically conductive paths can be guaranteed to at least one side of the portion of the contact region C between the neighboring pair of line trenches 169 for each contact via structures 98 formed between the neighboring pair of line trenches 169. The support pillars (80', 190) interrupt electrically conductive paths to the other side of the contact region C.

According to another aspect of the present disclosure, at least one conduction channel area cc is provided between neighboring clusters of contact via structures 98 that are laterally spaced along the direction perpendicular to the lengthwise direction of the line trenches 169 (such as the second horizontal direction hd2). The at least one conduction channel area cc located between the contact via structures 98 in the contact region C remains unetched during the step of etching the connecting via cavities 97. The conduction channel area cc contains no support pillars and no breaks in the continuity of any electrically conductive layers 30. Thus, all electrically conductive layers 30 in the conduction channel cc area of the contact region C are continuous from the first array region A1 to the second array region A2 (e.g., first and second memory planes). The conduction channel area cc functions as a conduit for electrical signals for each electrically conductive layer 30 through which a contact via structure 98 extends within neighboring clusters of contact via structures 98. Thus, a bottommost electrically conductive layer 30 that is contacted by a contact via structure 98 within each cluster of contact via structures 98 formed between a neighboring pair of line trenches 169 can provide electrical signals along both ways as indicated by the block arrows 2A and 2B in FIG. 24A. For each cluster of contact via structures 98 formed between a neighboring pair of line trenches 169, any electrically conductive layer 30 that is contacted by a contact via structure 98 of the cluster but is not the bottommost electrically conductive layer 30 that is contacted by a contact via structure 98 of the cluster, provides electrical signals only along one direction toward one side of the cluster of contact via structures 98 as indicated by the block arrows 1A and 1B in FIG. 24A. In the illustrated case, the electrical signal indicated by the block arrow 1A can propagate to the first memory array A1 directly, and the electrical signal indicated by the block arrow 1B can propagate to the second memory array A2 through the conduction channel area cc.

Figure 25:
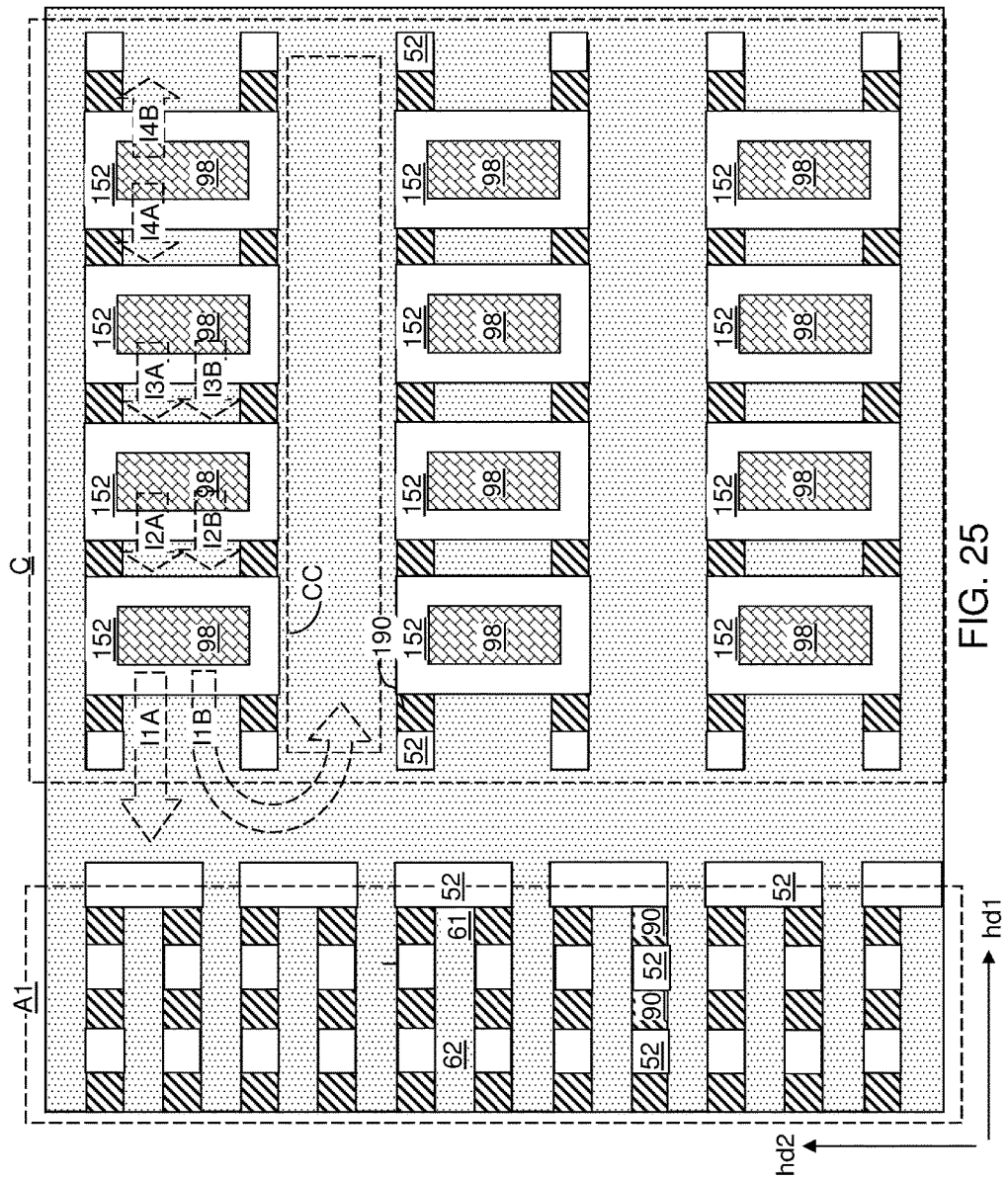
FIG. 25 is a top-down view of an area of an alternate embodiment of the exemplary structure after formation of contact via structures according to an embodiment of the present disclosure.
Figure 26C:
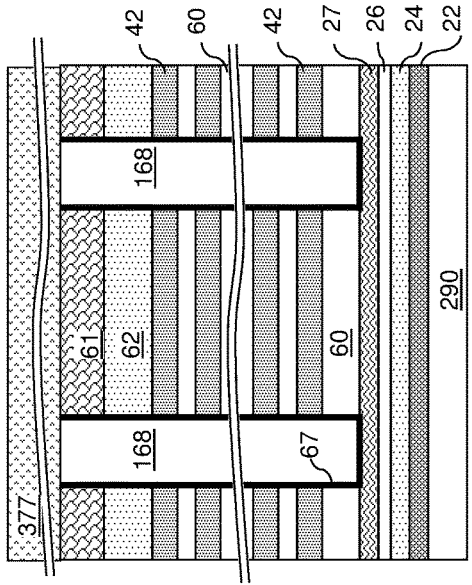
FIG. 26C is a vertical cross-sectional view along the plane C-C' of the exemplary structure of FIG. 26A according to an embodiment of the present disclosure.
Figure 26E:
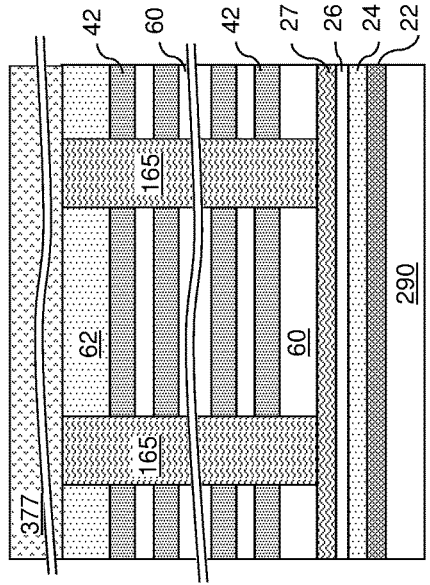
FIG. 26E is a vertical cross-sectional view along the plane E-E' of the exemplary structure of FIG. 26A according to an embodiment of the present disclosure.
Figure 26B:
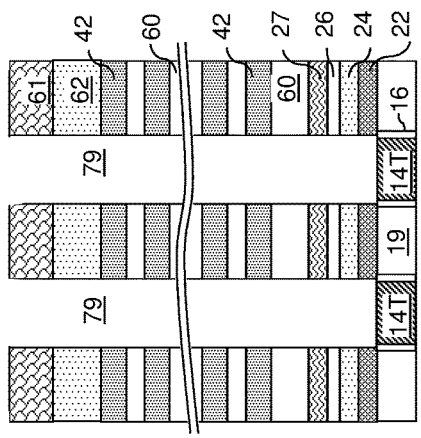
FIG. 26B is a vertical cross-sectional view along the plane B-B' of the exemplary structure of FIG. 26A according to an embodiment of the present disclosure.
Figure 26D:
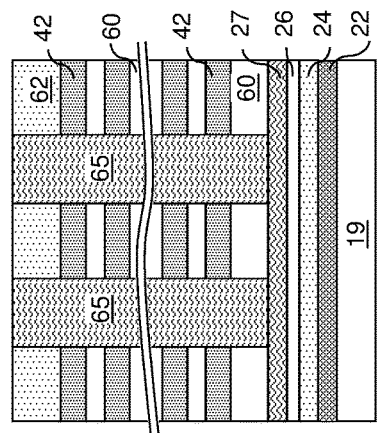
FIG. 26D is a vertical cross-sectional view along the plane D-D' of the exemplary structure of FIG. 26A according to an embodiment of the present disclosure.
Figure 27A:
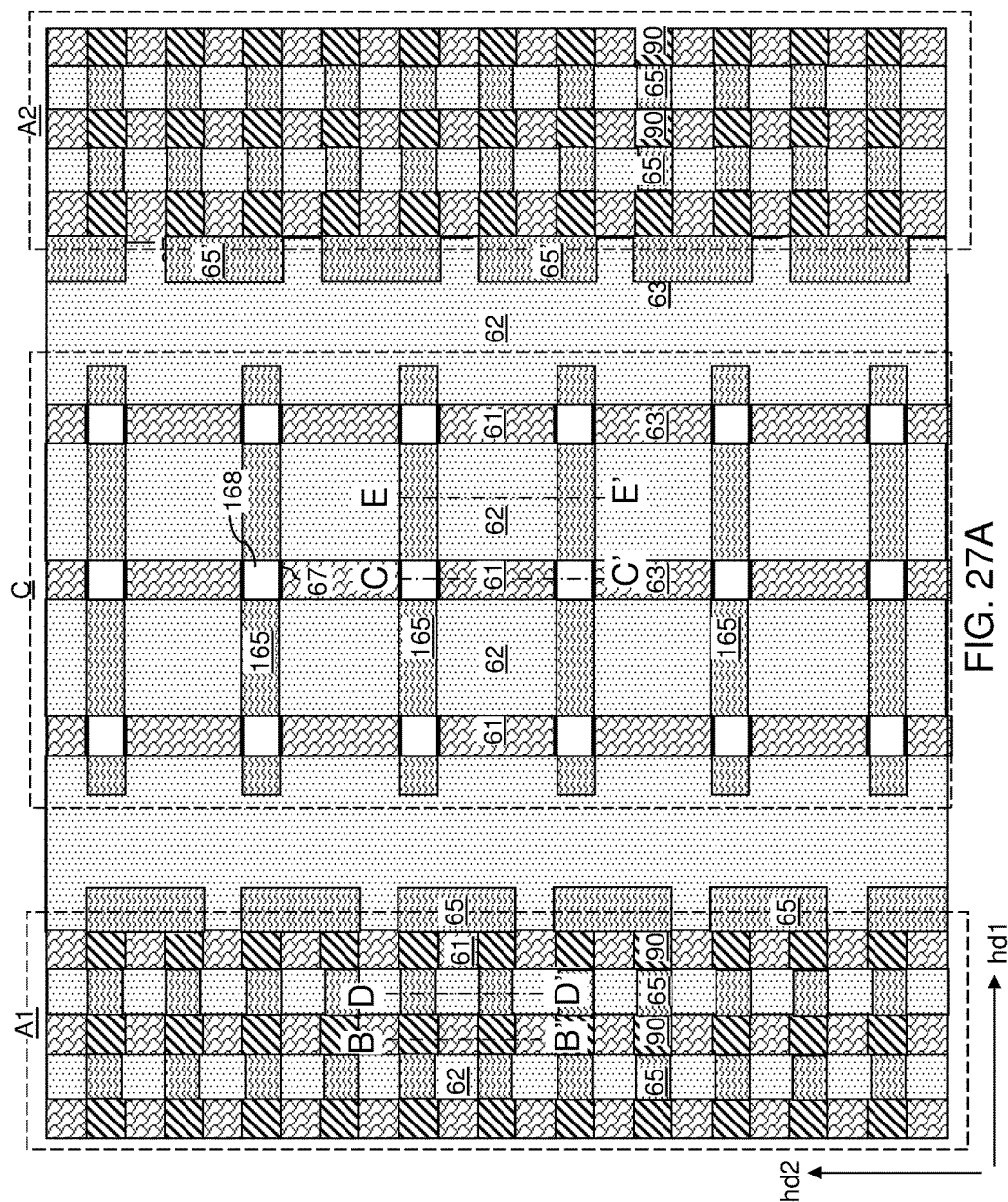
FIG. 27A is a top-down view of an area of an alternative embodiment of the exemplary structure after formation of resistive memory films and vertical bit lines in the array regions according to an embodiment of the present disclosure.
Figure 27B:
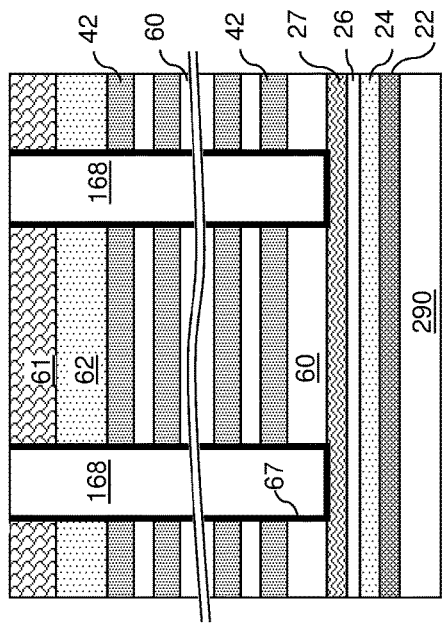
FIG. 27B is a vertical cross-sectional view along the plane B-B' of the exemplary structure of FIG. 27A according to an embodiment of the present disclosure.
Figure 27C:
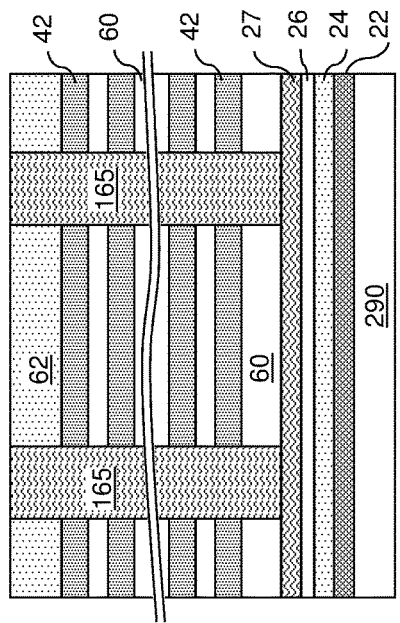
Figure 27D:
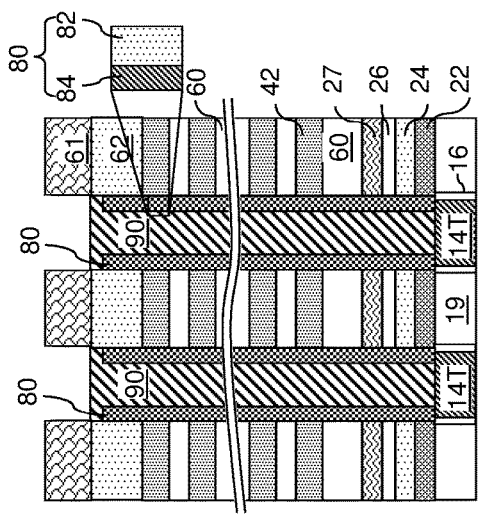
Figure 27E:
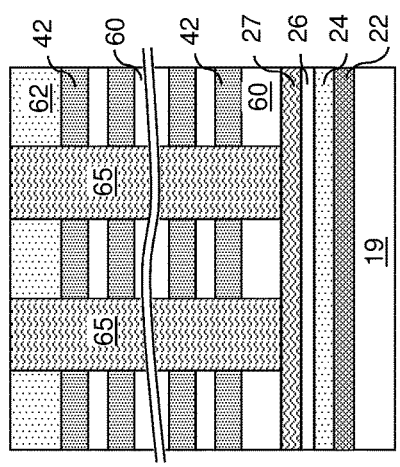
Figure 28A:
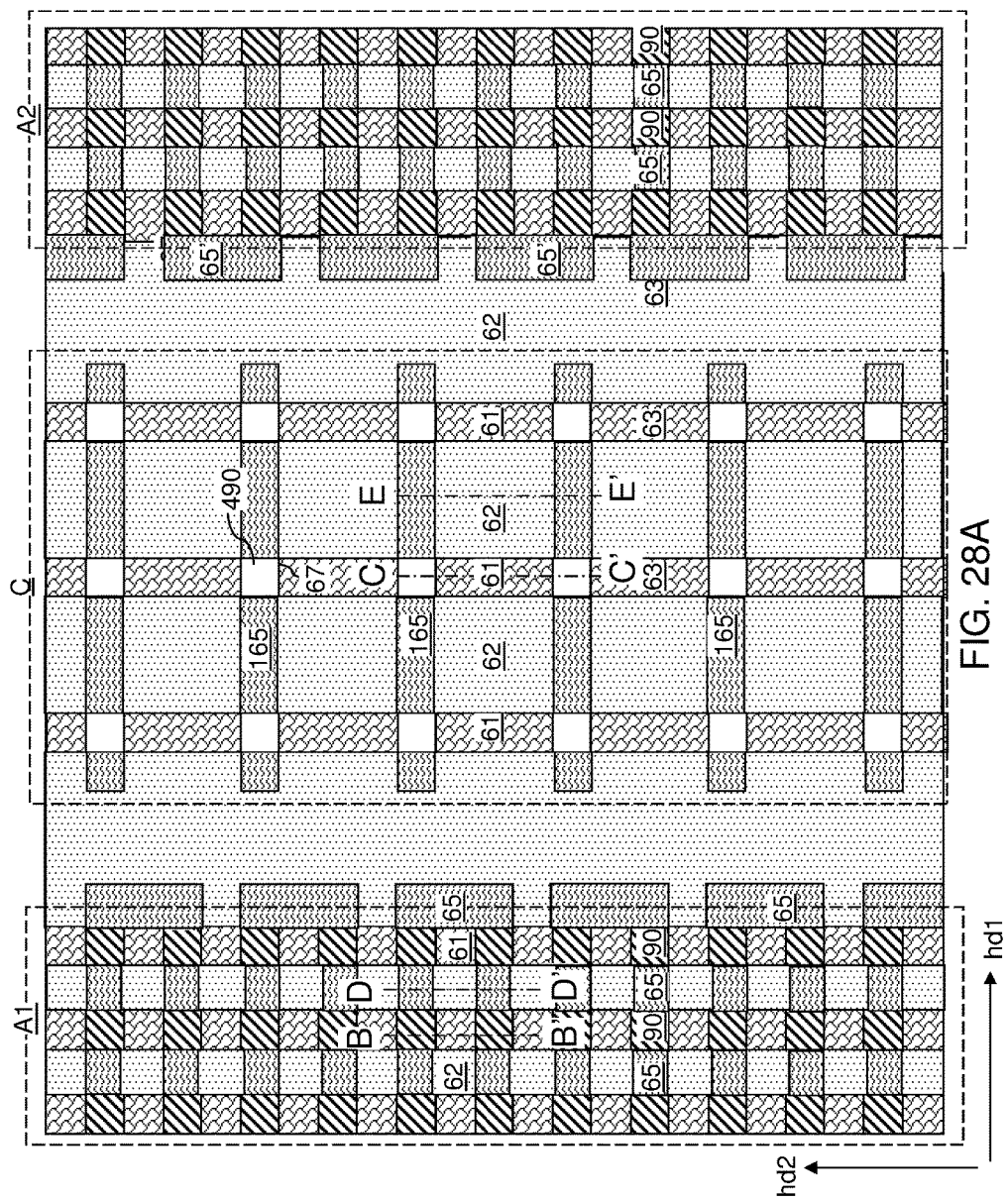
Figure 28B:
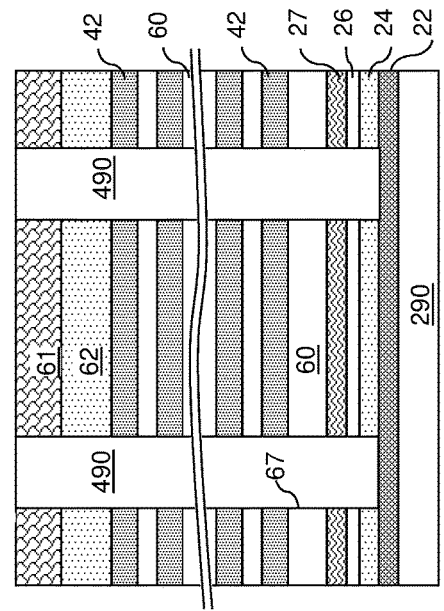
Figure 28C:
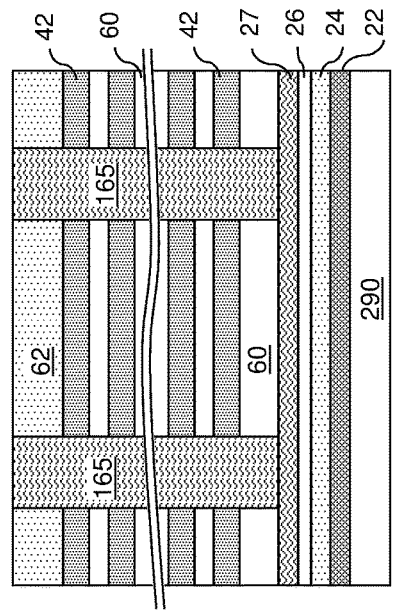
Figure 28D:
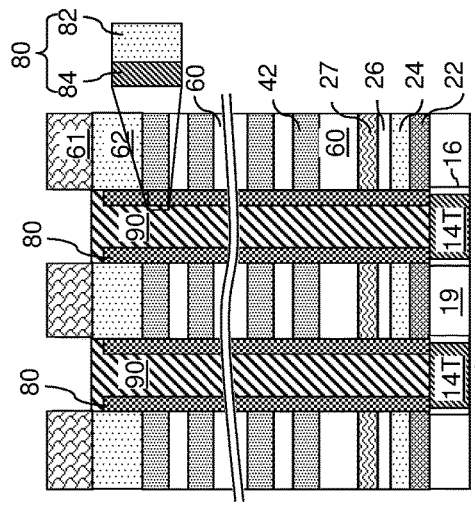
Figure 28E:
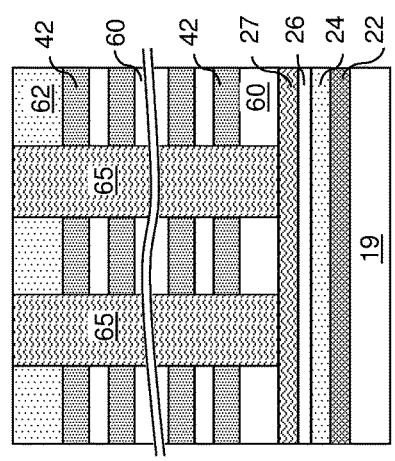

FIG. 25 is a top-down view of an area of an alternate embodiment of the exemplary structure. In this case, four contact via structures 98 are provided within each cluster of contact via structures 98. In this example, a bottommost electrically conductive layer 30 that is contacted by a contact via structure 98 within each cluster of contact via structures 98 formed between a neighboring pair of line trenches 169 can provide electrical signals along both ways as indicated by the block arrows 4A and 4B. The electrical signals indicated by the block arrows 1A, 2A, and 3A can propagate to the first memory array A1 directly, and the electrical signals indicated by the block arrows 1B, 2B, and 3B can propagate to the second memory array A2 through the conduction channel area cc.

In some embodiments, dielectric support pillars may be employed in lieu of the support pillars (80', 190). Referring to FIGS. 26A-26E, an alternative embodiment of the exemplary structure can be derived from the exemplary structure of FIGS. 8A-8E by applying and patterning a photoresist layer 377 over the exemplary structure such that the patterned photoresist layer 377 covers each contact region C. Subsequently, the processing steps of FIGS. 9A-9E can be performed to remove the array sacrificial spacer structure (67, 68), thereby forming the array pillar cavities 79. The contact sacrificial spacer structures (67, 168) are covered by the photoresist layer 377, and thus, are not removed at this processing step. The photoresist layer 377 can be subsequently removed, for example, by ashing.

Referring to FIGS. 27A-27E, the processing steps of FIGS. 10A-10E and the processing steps of FIGS. 11A-11E are sequentially performed to form a resistive memory film 80 and a vertical bit line 90 within each of the array pillar cavities 79.

Referring to FIGS. 28A-28E, the processing steps of FIGS. 9A-9E can be performed again to remove the contact sacrificial spacer structures (67, 168), thereby forming the contact pillar cavities in volumes from which the contact sacrificial spacer structures (67, 168) are removed. In one embodiment, the contact sacrificial spacer structures (67, 168) can be removed at the same time as the layers of the alternating stack (42, 60) in peripheral region outside the first and second array regions (A1, A2) and the contact region C. In this embodiment, a mask, such as a photoresist mask, is formed over the entire first and second array regions (A1, A2) and the entire contact region C except for the location of the contact sacrificial spacer structures (67, 168). The exposed portions of the alternating stack (42, 60) in the peripheral region and the exposed contact sacrificial spacer structures (67, 168) are removed by etching to form the contact pillar cavities 179 (shown in FIGS. 9A and 9C) in place of the contact sacrificial spacer structures (67, 168). The contact pillar cavities 179 can extend to the silicon nitride liner 22 which functions as an etch stop layer.

A dielectric material that is different from the material of the sacrificial material layers 42 is deposited in the contact pillar cavities 179, and is subsequently etched back to remove horizontal portions of the deposited dielectric material. In one embodiment, the dielectric material may also fill the peripheral region to permit formation of via contacts through the dielectric material in the peripheral region. The dielectric material may include, for example, silicon oxide (such as undoped silicate glass or doped silicate glass) or a dielectric metal oxide. Each remaining portion of the dielectric material that fills the contact pillar cavities constitutes a dielectric support pillar 490. The resulting structure differs from the structure of FIGS. 11A-11E by the presence of a dielectric support pillar 490 in lieu of each support pillar (80', 190). The dielectric support pillar 490 may extend to the silicon nitride liner 22.

Figure 29:
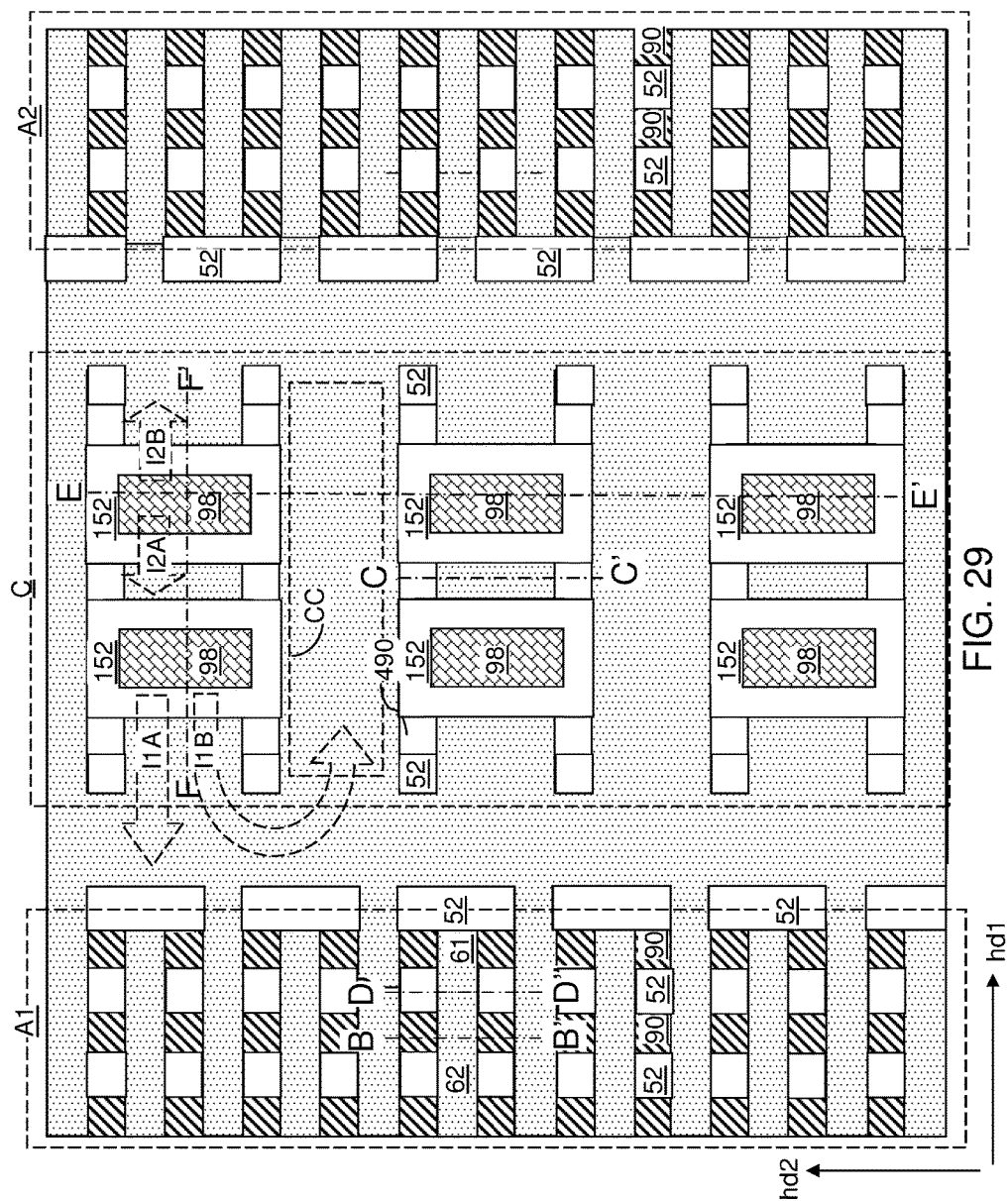

Subsequent processing steps after the processing steps of FIGS. 11A-11E can be performed to provide the alternative embodiment of the exemplary structure illustrated in FIG. 29, in which the support pillars (80', 190) of FIGS. 24A-24F are replaced with the dielectric support pillars 490. The dielectric support pillars 490 provide structural support during replacement of the sacrificial material layers 42 with the electrically conductive layers 30 during the steps of FIGS. 20A-23F. The conduction channel area cc in this embodiment contains no dielectric support pillars 490 and no steps or breaks in the continuing of any electrically conductive layers 30.

The exemplary structure of the present disclosure provides a three-dimensional memory device, which comprises an alternating stack (60, 30) of insulating layers 60 and electrically conductive layers 30 located over a substrate 110 and resistive memory elements 80E (e.g., resistive memory films 80) located in the alternating stack in first and second array regions (A1, A2). Contact via structures 98 are located in a contact region C between the first and the second array regions (A1, A2). The contact via structures 98 have different depths and contact different electrically conductive layers 30. Support pillars 490 or (80', 190) are located in the contact region C and extending through the alternating stack. At least one conduction channel area cc is located between the contact via structures 98 in the contact region C. The conduction channel area cc contains no support pillars (490 or (80', 190)), and all electrically conductive layers 30 in the conduction channel area cc are continuous from the first array region A1 to the second array region A2.

In one embodiment, the three-dimensional memory device comprises a ReRAM memory device, the electrically conductive layers 30 comprise word lines of the ReRAM memory device, the first array region A1 comprises a first memory plane, the second array region A2 comprises a second memory plane, and the contact region C comprises a word line hook up region.

In one embodiment, the three-dimensional memory device is vertical bit line (VBL) type ReRAM memory device which includes vertical bit lines 90 extending through the alternating stack (60, 30) in the first and the second array regions (A1, A2). The resistive memory elements 80E are located at least at intersections of the word lines 30 and the vertical bit lines 90.

In one embodiment, insulating spacers 152 surround the contact via structures 90, and line trenches 169 are located in the contact region C. The line trenches 169 vertically extend through each layer in the alternating stack (60, 30) and laterally extend along a first horizontal direction hd1. In one embodiment, the insulating spacers 152 contact bottom surfaces of the pair of line trenches 169. In one embodiment, surfaces of the insulating spacers 152 contact a top surface of a respective one of the insulating layers 60 within a respective first plane P1 as illustrated in FIG. 23E.

In one embodiment, the three-dimensional memory array of resistive memory elements 80E comprises a two-dimensional array of resistive memory elements 80E each having a shape of a rectangular cylinder, including a vertical stack of a respective subset of the resistive memory elements 80E, and laterally enclosing a respective vertical bit line 90 therein. In one embodiment, the three-dimensional memory device further comprises support pillars (80', 190) or 490 located within the pair of line trenches 169 and between each neighboring pair of insulating spacers 152. Each of the support pillars (80', 190) comprises either a dielectric support pillar 490 or a combination of a dummy resistive memory element 80' including a same layer, or a same layer stack, as the memory films 80 of the resistive memory elements 80E, and a dummy vertical bit line 190 having a same composition as the vertical bit lines 90. In one embodiment, at least one of the insulating spacers 152 is contacted by four support pillars, and each of the support pillars (80', 190) or 490 vertically extends through each layer in the alternating stack.

In one embodiment, each of the electrically conductive layers 30 include multiple fingers that extend laterally and contacting sidewalls of a row of resistive memory elements 80 (such that each row arranged, for example, along the first horizontal direction hd1 and rows are spaced apart along the second horizontal direction hd2). Each neighboring pair of resistive memory elements 80 that are laterally spaced along a direction of the row (such as the first horizontal direction hd1) is laterally spaced from each other by a respective dielectric pillar structure 52 that extends through each layer in the alternating stack (60, 30).

In one embodiment, each of the resistive memory elements 80E comprises barrier modulated cell, a filamentary resistive memory element or a phase change memory element. The barrier modulated cell can include a resistive memory material layer 84 composed of a resistive memory material, and a barrier layer (as embodied as a selector element layer 82) including a material having a smaller band gap than the resistive memory material.

In one embodiment, each contact via structure 98 located between the pair of line trenches 169 contacts different electrically conductive layers 30, and a height of an interface between the contact via structures 98 and the electrically conductive layers 30 monotonically increases or decreases with a lateral distance along the first horizontal direction hd1 within an entire area between the pair of line trenches 169. As used herein, a function monotonically increases if for any pair of values of the variable, the value of the function for the greater value of the pair is not less than the value of the function for the lesser value of the pair. As used herein, a function monotonically decreases if for any pair of values of the variable, the value of the function for the greater value of the pair is not greater than the value of the function for the lesser value of the pair. The height of the interface between the contact via structures 98 and the electrically conductive layers 30 remains the same between each contacting pair of a conductive via structure 98 and an electrically conductive layer 30, and changes between each neighboring pair of conductive via structures 98. The height of the interface as a function is defined only at locations where a contact via structure 98 contacts an electrically conductive layer 30. In other words, the domain of the function of the height of the interface includes only locations where a contact via structure 98 contacts an electrically conductive layer 30.

In one embodiment, the contact via structures 98 are spaced apart along a second horizontal direction hd2 that is perpendicular to the first horizontal direction hd1. Each of the electrically conductive layers 30 and the insulating layers 60 continuously extend along the first horizontal direction hd1 between each neighboring pair contact via structures 98 with a respective uniform width (for example, in a respective conduction channel area cc).

Thus, a three-dimensional memory device can be formed employing replacement word lines. An alternating stack of insulating layers and sacrificial material layers is formed over a substrate, and is patterned to form finger patterns in array areas and line trenches in a contact area. Pillar cavities are formed between the fingers and in the line trenches, and a resistive memory elements and vertical bit lines in the array region. Connecting via cavities having different depths can be formed between neighboring pairs of line trenches, and the sacrificial material layers can be replaced with electrically conductive layers while support pillars in the line trenches provide structural support. Insulating spacers and contact via structures are formed in connecting via cavities and the line trenches. Strips of electrically conductive layers in the conduction channel areas adjacent to the line trenches provide current paths to the fingers.

The method of the present disclosure provides an integration scheme that incorporates replacement of sacrificial material layers 42 with electrically conductive word lines 30 with self-aligned contact via structures 98 for the word lines of resistive memory devices. The support pillars provide support for the insulating layers 60 during the replacement step. The conduction channel areas cc provide a conductive path from the word line hook up region C to both memory planes A1, A2 located on opposite sides of the contact region C.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and electrically conductive layers located over a substrate;
resistive memory elements located in the alternating stack in first and second array regions;
contact via structures located in a contact region between the first and the second array regions, wherein the contact via structures have different depths and contact different electrically conductive layers;
support pillars located in the contact region and extending through the alternating stack; and
at least one conduction channel area located between the contact via structures in the contact region, wherein the conduction channel area contains no support pillars, and all electrically conductive layers in the conduction channel area are continuous from the first array region to the second array region.

2. The three-dimensional memory device of claim 1, wherein:
the three-dimensional memory device comprises a ReRAM memory device;
the electrically conductive layers comprise word lines of the ReRAM memory device;
the first array region comprises a first memory plane;
the second array region comprises a second memory plane; and
the contact region comprises a word line hook up region.

3. The three-dimensional memory device of claim 2, further comprising:
vertical bit lines extending through the alternating stack in the first and the second array regions, wherein the resistive memory elements are located at least at intersections of the word lines and the vertical bit lines;
insulating spacers surrounding the contact via structures; and
line trenches located in the contact region, vertically extending through each layer in the alternating stack and laterally extending along a first horizontal direction.

4. The three-dimensional memory device of claim 3, wherein each of the support pillars comprises a dummy resistive memory element including a same layer, or a same layer stack, as the resistive memory elements, and a dummy vertical bit line having a same composition as the vertical bit lines.

5. The three-dimensional memory device of claim 3, wherein each of the support pillars comprises a dielectric support pillar.

6. The three-dimensional memory device of claim 3, wherein:
the support pillars are located in the line trenches;
the contact via structures are located between pairs of line trenches; and
adjacent pairs of line trenches are separated by a respective conduction channel area.

7. The three-dimensional memory device of claim 6, wherein:
at least one of the insulating spacers is contacted by four support pillars;
each of the support pillars vertically extends through each layer in the alternating stack;
each of the electrically conductive layers includes multiple fingers that extend laterally and contact sidewalls of a row of resistive memory elements; and
each neighboring pair of resistive memory elements that are laterally spaced along a direction of the row is laterally spaced from each other by a respective dielectric pillar structure that extends through each layer in the alternating stack.

8. The three-dimensional memory device of claim 6, wherein a height of an interface between the contact via structures and the electrically conductive layers monotonically increases or decreases with a lateral distance along the first horizontal direction within an entire area between each pair of line trenches.

9. The three-dimensional memory device of claim 3, wherein:
the contact via structures are spaced apart along a second horizontal direction that is perpendicular to the first horizontal direction; and
each of the electrically conductive layers and the insulating layers continuously extend along the first horizontal direction between each neighboring pair of contact via structures with a respective uniform width.

10. The three-dimensional memory device of claim 1 wherein each resistive memory element comprises barrier modulated cell, a filamentary memory element or a phase change memory element.

* * * * *